United States Patent
Aoyama et al.

(10) Patent No.: US 7,125,799 B2
(45) Date of Patent: Oct. 24, 2006

(54) METHOD AND DEVICE FOR PROCESSING SUBSTRATE, AND APPARATUS FOR MANUFACTURING SEMICONDUCTOR DEVICE

(75) Inventors: Shintaro Aoyama, Nirasaki (JP); Masanobu Igeta, Nirasaki (JP); Hiroshi Shinriki, Nirasaki (JP); Tsuyoshi Takahashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 188 days.

(21) Appl. No.: 10/473,205

(22) PCT Filed: Dec. 27, 2002

(86) PCT No.: PCT/JP02/13851

§ 371 (c)(1),
(2), (4) Date: Apr. 9, 2004

(87) PCT Pub. No.: WO03/063220

PCT Pub. Date: Jul. 31, 2003

(65) Prior Publication Data

US 2004/0241991 A1 Dec. 2, 2004

(30) Foreign Application Priority Data

Jan. 23, 2002 (JP) .............................. 2002-014773

(51) Int. Cl.
*H01L 21/44* (2006.01)

(52) U.S. Cl. .............................. 438/677; 257/E21.224
(58) Field of Classification Search ................ None
See application file for complete search history.

(56) References Cited

U.S. PATENT DOCUMENTS

| 5,762,755 A | 6/1998 | McNeilly et al. |
| 6,008,128 A | 12/1999 | Habuka et al. |
| 6,248,618 B1 * | 6/2001 | Quek et al. ................. 438/199 |
| 6,630,995 B1 * | 10/2003 | Hunter ..................... 356/237.5 |
| 6,743,289 B1 * | 6/2004 | Falster et al. ................. 117/2 |
| 2001/0021848 A1 | 9/2001 | Fred et al. |

FOREIGN PATENT DOCUMENTS

| EP | 1158 581 A | 11/2001 |
| EP | 1 453 083 A | 9/2004 |

(Continued)

OTHER PUBLICATIONS

Kafader U et al., "In situ- DC-plasma cleaning of silicon surfaces" Applied Surface Science Netherlands, vol. 90, No. 3, Nov. 1995.

(Continued)

*Primary Examiner*—Asok Kumar Sarkar
(74) *Attorney, Agent, or Firm*—Crowell & Moring LLP

(57) ABSTRACT

A substrate processing method includes the step of removing carbon from a silicon substrate surface and planarizing the silicon substrate surface from which carbon has been removed.

18 Claims, 38 Drawing Sheets

FOREIGN PATENT DOCUMENTS

| | | | |
|---|---|---|---|
| JP | 61-270830 | | 12/1986 |
| JP | 04-196533 | * | 7/1992 |
| JP | 06 045305 A | | 2/1994 |
| JP | 07 321046 A | | 12/1995 |
| JP | 9-270415 | | 10/1997 |
| JP | 10079364 A | | 3/1998 |
| JP | 10-144632 | | 5/1998 |
| JP | 11221535 A | | 8/1999 |
| JP | 2000-82701 | | 3/2000 |
| JP | 2000091342 A | | 3/2000 |
| JP | 2000-279904 | | 10/2000 |
| JP | 2001-343499 | | 12/2001 |
| JP | 2002-217155 | * | 8/2002 |
| WO | WO 00/70666 A | | 11/2000 |

OTHER PUBLICATIONS

Oda K et al., "H2 cleaning of silicon wafers before low-temperature epitaxial growth by ultrahigh vacuum/chemical vapor deposition", Journal of The Electrochemical Society Electrochem. Soc USA, vol. 143, No. 7, Jul. 1996.

European Search Report, Mar. 28, 2006.

* cited by examiner

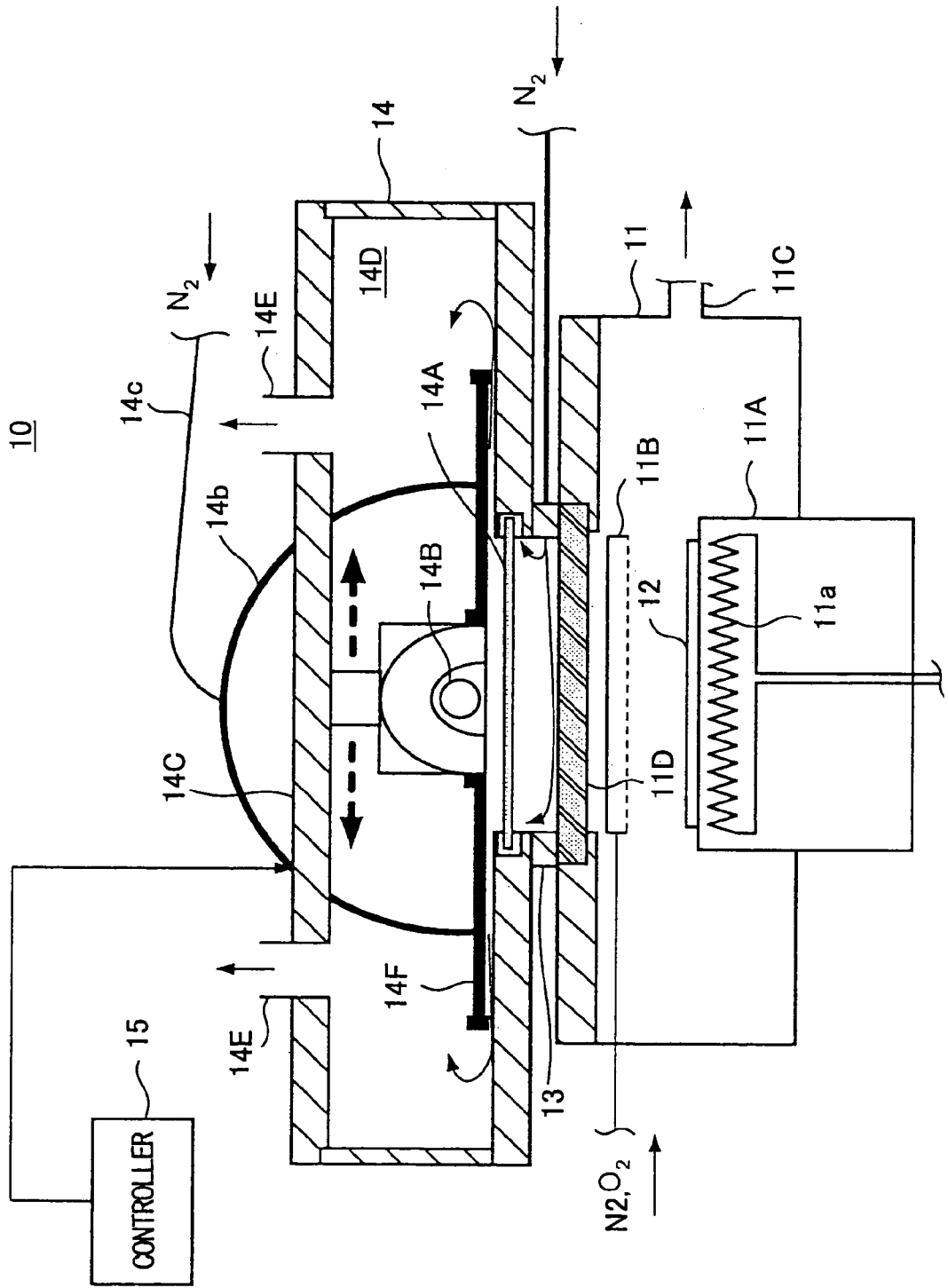

DHF CLEANING
UV N₂
Ar 1175C 90SECONDS

Rms=0.113nm
PV=1.33nm

DHF CLEANING
UV O₂
Ar 1175C 90SECONDS

Rms=1.27nm
PV=11.7nm

DHF CLEANING
Ar 1175C 90SECONDS

Rms=2.09nm
PV=16.1nm

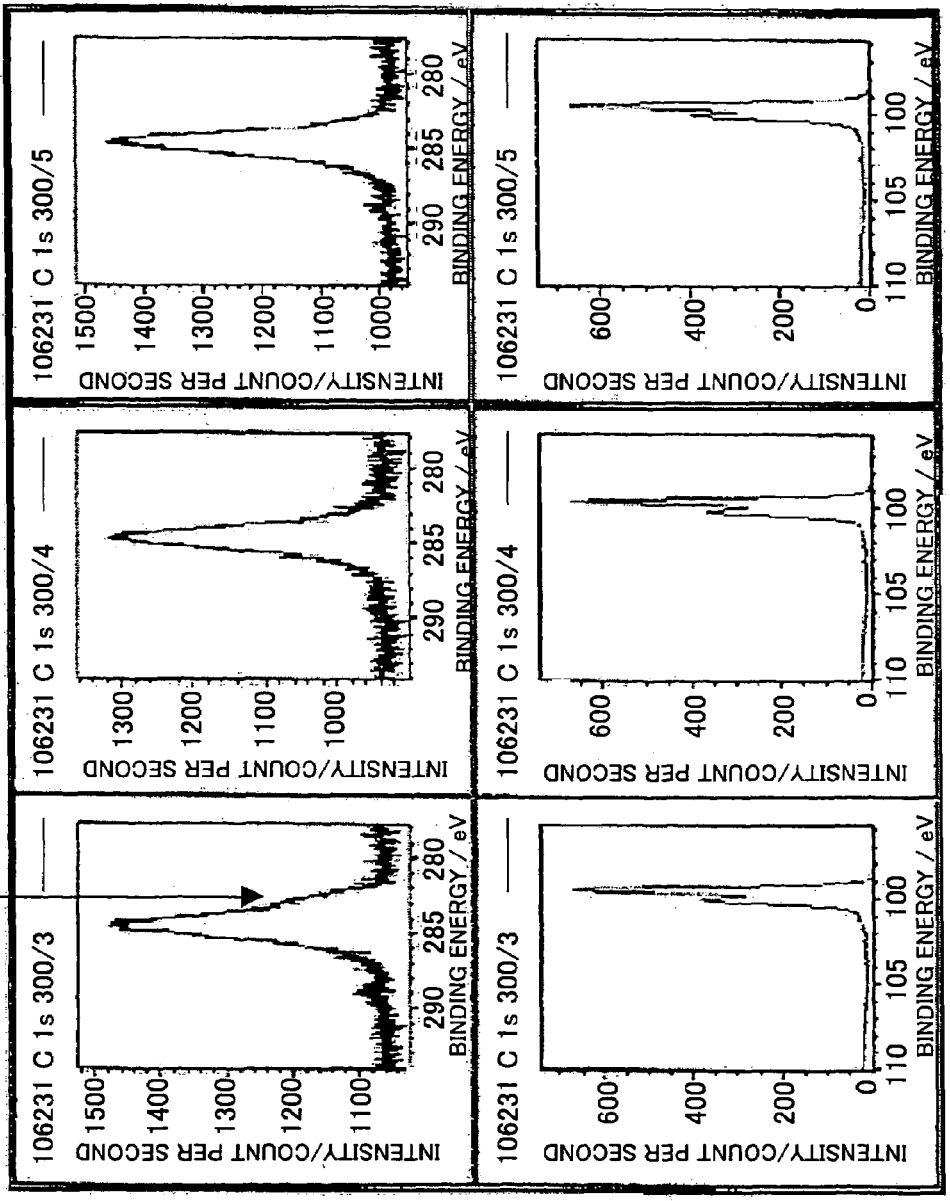

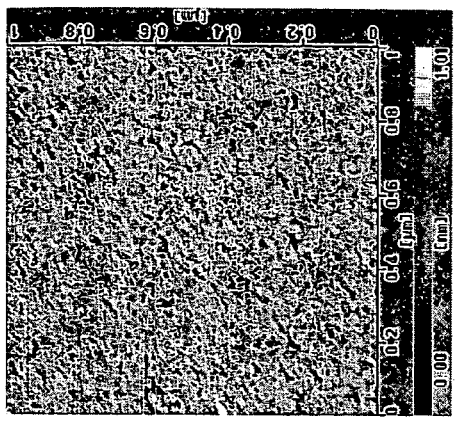

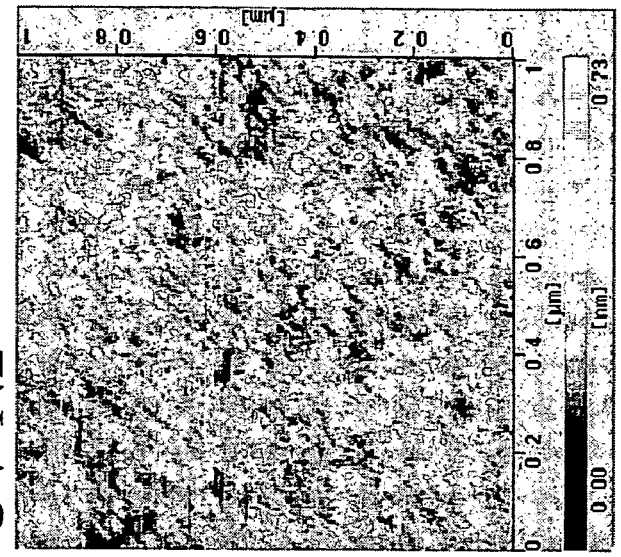
FIG.7C UV N2
Rms=0.131nm
PV=1.66nm
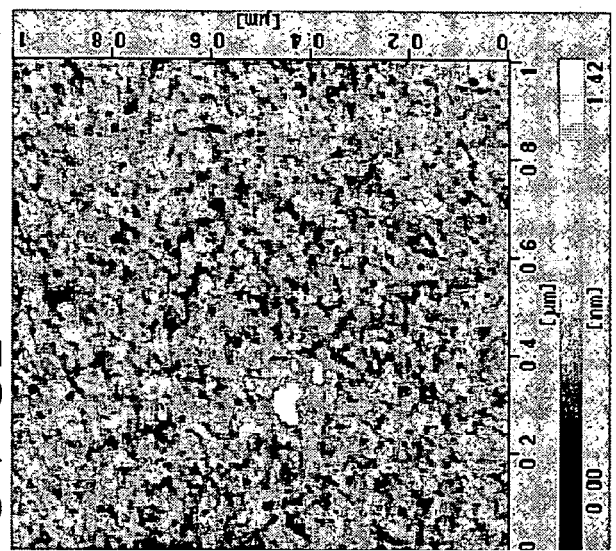
FIG.7B UV O2
Rms=0.181nm
PV=1.69nm
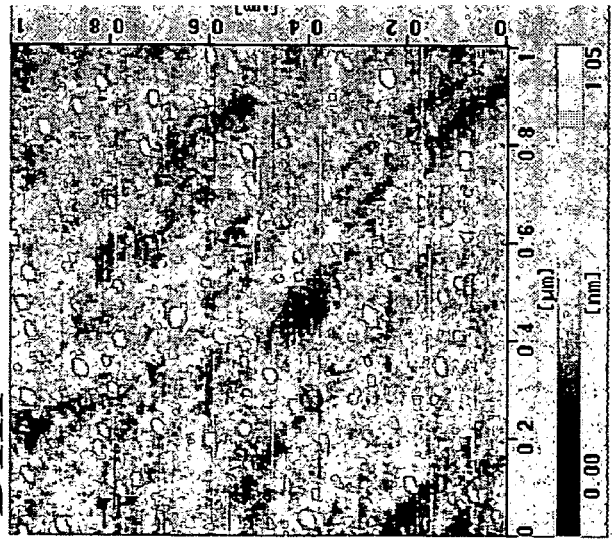
FIG.7A DHF
Rms=0.196nm
PV=3.02nm

SUB OXIDE

OXIDE

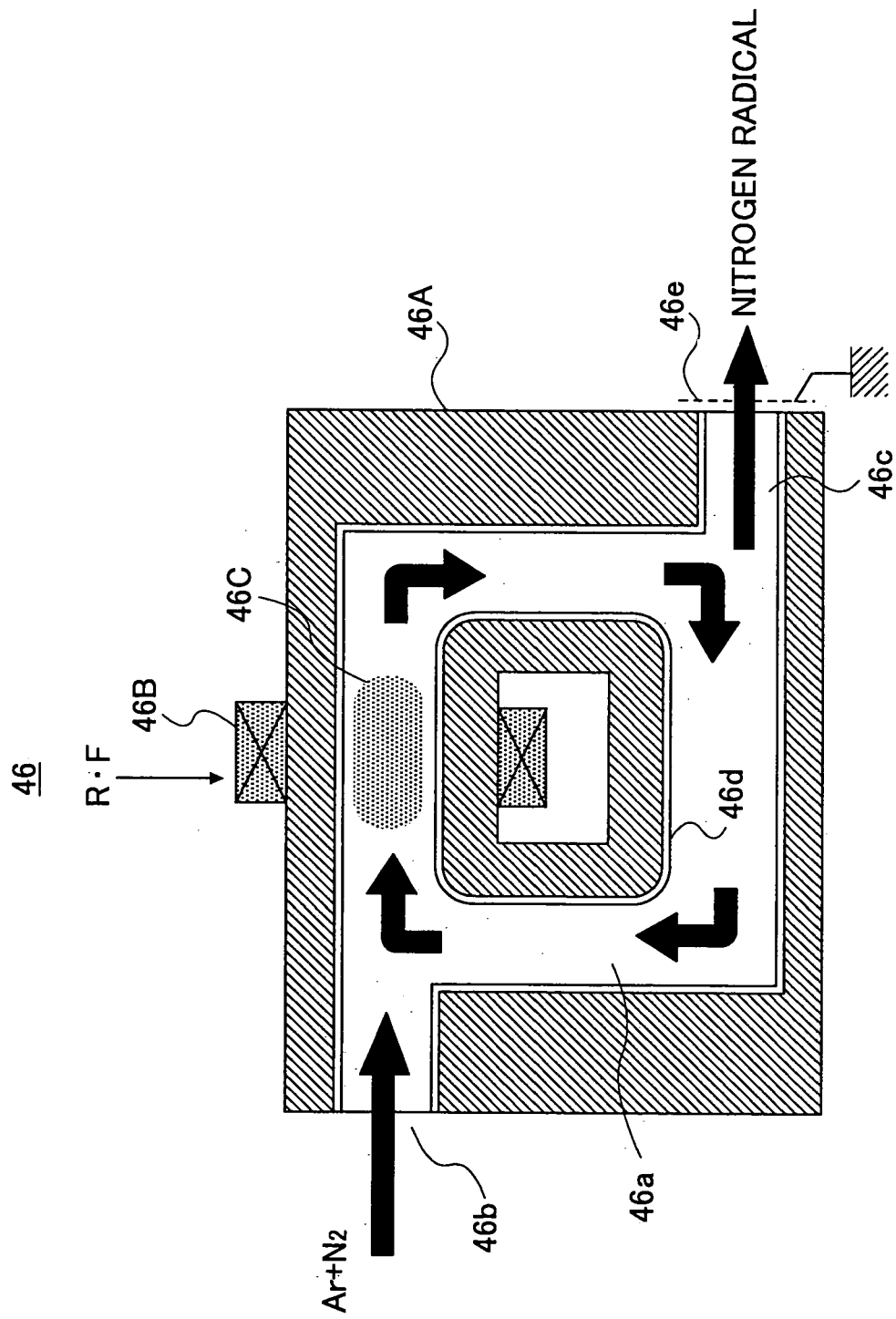

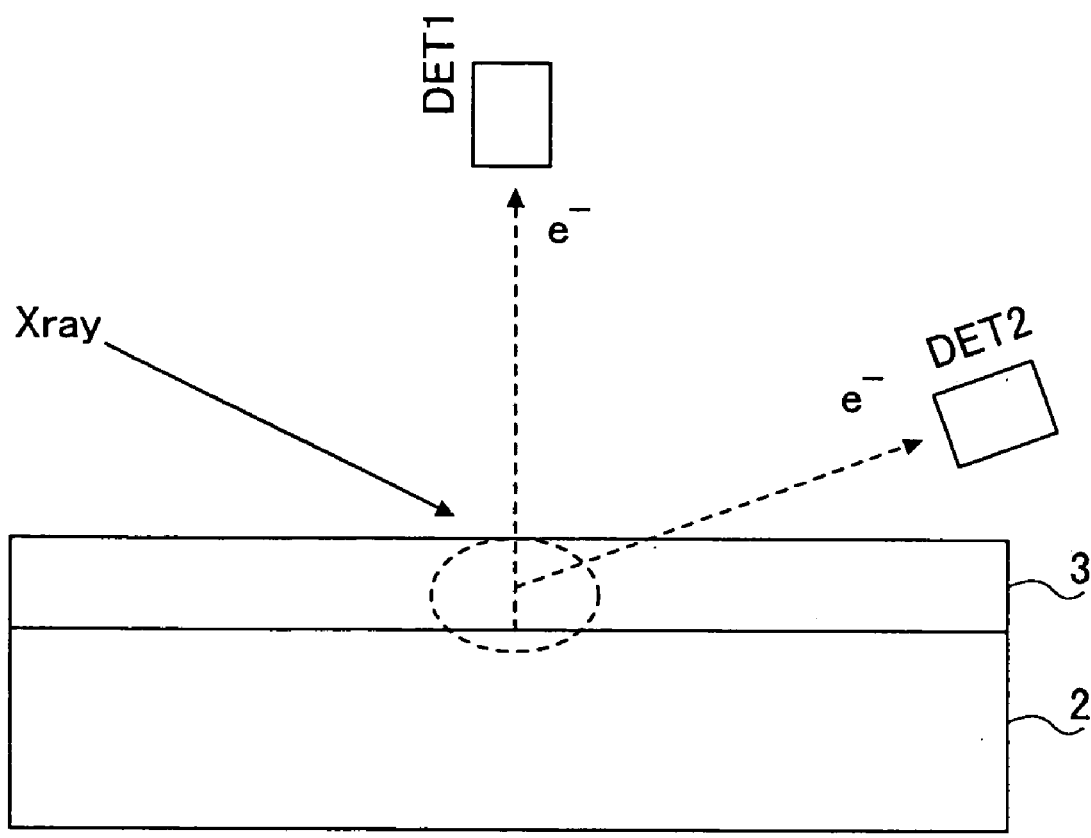

METHOD AND DEVICE FOR PROCESSING SUBSTRATE, AND APPARATUS FOR MANUFACTURING SEMICONDUCTOR DEVICE

TECHNICAL FIELD

The present invention generally relates to semiconductor devices and more particularly to a preprocessing method and apparatus suitable for forming an extremely thin insulation film on a semiconductor substrate.

BACKGROUND ART

In the technology of recent advanced high-speed semiconductor devices, use of the gate length of 0.1 µm or less is becoming possible with the progress in the art of ultrafine semiconductor fabrication processes. Generally, operational speed of a semiconductor device is improved with device miniaturization, while there is a need, in such extremely miniaturized semiconductor devices, to reduce the thickness of the gate insulation film thereof with the decrease of the gate length achieved as a result of the device miniaturization.

When the gate length has been reduced to 0.1 µm or less, on the other hand, the thickness of the gate insulation film has to be reduced to 1–2 nm or less when a conventional thermal oxide film is used for the gate insulation film. In such an extremely thin gate insulation film, however, there inevitably arises a problem of increased tunneling current, while such an increased tunneling current causes the problem of large gate leakage current.

In view of the situation noted above, there has been a proposal of using a high-dielectric material (so-called high-K dielectric material) having a much larger specific dielectric constant as compared with a thermal oxide film and thus capable of achieving a small $SiO_2$-equivalent thickness while maintaining a large physical thickness, for the gate insulation film. Such a high-K material includes $Ta_2O_5$, $Al_2O_3$, $ZrO_2$, $HfO_2$, $ZrSiO_4$, $HfSiO_4$, and the like. By using such a high-K dielectric material, it becomes possible to use the physical thickness of about 4 nm in ultra high-speed semiconductor devices having a gate length of 0.1 µm or less. Thereby, the gate leakage current caused by tunneling effect is successfully suppressed.

In a semiconductor device that uses such a high-K dielectric film for the gate insulation film, it is preferable to form the high-K dielectric film directly on a Si substrate for reducing the $SiO_2$ equivalent thickness of the insulation film. However, in the case the high-K dielectric film is formed directly on the Si substrate, the metal elements in the high-K dielectric film tend to cause diffusion into the Si substrate, and there arises the problem of carrier scattering in the channel region.

From the viewpoint of improving carrier mobility in the channel region, it is preferable to interpose an extremely thin base oxide film having a thickness of 1 nm or less, preferably 0.8 nm or less, most preferably 0.4 nm or less, between the high-K dielectric gate oxide film and the Si substrate. It should be noted that this base oxide film has to be extremely thin. Otherwise, the effect of using the high-K dielectric film for the gate insulation film would be canceled out. Further, such an extremely thin base oxide film has to cover the surface of the Si substrate uniformly, without forming defects such as interface states.

FIG. 1 shows the schematic construction of a high-speed semiconductor device 1 having a high-K dielectric gate insulation film.

Referring to FIG. 1, the semiconductor device 1 is constructed on a silicon substrate 2 and includes a high-K dielectric gate insulation film 4 such as $Ta_2O_5$, $Al_2O_3$, $ZrO_2$, $HfO_2$, $ZrSiO_4$, $HfSiO_4$, and the like, formed on the silicon substrate 2 via a thin base oxide film 3. Further, a gate electrode 5 is formed on the high-K dielectric gate insulation film 4.

In the semiconductor device 1 of FIG. 1, there is conducted nitrogen (N) doping in the base oxide film 3 within the range that interface flatness is maintained between the silicon substrate 2 and the base oxide film 3, and because of this, the base oxide film 3 has a larger specific dielectric constant as compared with a pure silicon oxide film. Thereby, it becomes possible to reduce the oxide-equivalent thickness of the base oxide film 3 further. By introducing nitrogen into such an extremely thin base oxide film 3 with a thickness of about 1 atomic layer, it becomes possible to improve the mechanical stability at the interface to the high-K dielectric gate insulation film 4 (Lucovisky, G., et al., Appl. Phys. Lett. 74, 2005, 1999).

As explained before, it is preferable that the base oxide film 3 has as small thickness as possible in such a high-speed semiconductor device 1.

In the case of forming such an extremely thin oxide film on a silicon substrate surface, it is not only necessary to remove the native oxide film but also other impurity element, particularly carbon originating from the organic materials in the atmosphere, from the surface of the silicon substrate. When the film formation process is conducted in the state carbon is remaining on the silicon substrate surface, the carbon atoms cause a reaction with the silicon atoms in the silicon substrate and there is formed SiC on the substrate surface. Such Sic forms defect in the oxide film. Further, the silicon substrate surface thus cleaned has to be planarized before the formation of the thin insulation film. Further, in view of the fact that such a cleaned silicon substrate easily undergoes formation of native oxide film or absorbing of organic materials in the air when the substrate is left in the air, it is necessary that such a substrate pre-processing has to be conducted immediately before the substrate processing by way of a single-wafer process.

Conventionally, several technologies are known for planarizing the silicon substrate surface.

For example, there is a known technology of manufacturing a substrate in which the planarization of the substrate surface is achieved by causing to flow a current in an ultra-high vacuum environment. However, such a planarization process requires ultra-high vacuum environment of $10^{-9}$–$10^{-10}$ Torr, and thus, it is difficult to use such a process for a substrate preprocessing process conducted in a mass production line of semiconductor devices. Further, it is difficult to construct a cluster-type semiconductor production apparatus that conducts a single-wafer process by combining the foregoing planarization process in combination with other semiconductor fabrication processes.

Further, there is a known substrate manufacturing technology that conducts so-called denuded-zone (Dz) annealing for a silicon substrate formed by a Czochralski (Cz) growth method or MCz (magnetic-field-applied Czochralski) growth method and containing large amount of interstitial oxygen at the temperature of about 1100° C. and form an intrinsic gettering layer in the silicon substrate (Matsushita Y., et al., Extended Abstracts of the 18$^{th}$ (1986 International) Conference on Solid State Devices and Materials, Tokyo, 1986, pp. 529–532). However, this substrate manufacturing process is, while effective for reducing the defect density of the substrate, not effective for achieving the planarity, particularly the planarity of atomic-layer grade, on the substrate surface. Further, this process requires a high-temperature treatment in an electric furnace and is not suitable for constructing a cluster-type semiconductor production apparatus that conducts a single-wafer process in combination with other semiconductor manufacturing processes.

Further, there is a known substrate manufacturing technology known as Hi-wafer in which a silicon substrate formed by a Czochralski (Cz) process is held for a long time in a hydrogen ambient at a high temperature of 1100–1200° C. for improvement of the quality of the silicon substrate (NIKKEI MICRODEVICES, May, 1993, pp. 63–64). According to this Hi-wafer technology, it becomes possible to reduce the defect density at the silicon substrate surface further as compared with the case of the Cz substrate subjected to the intrinsic gettering process. Further, there is a known technology of planarizing the silicon substrate surface to the degree that atomic layer steps become observable by conducting a thermal annealing process in the hydrogen ambient at the high temperature of about 1100° C. (Yanase, Y., et al., Electro-Chemical Society, Abstract No. 296, 1993, pp. 486). However, this method, also requiring a high-temperature thermal annealing process in an electric furnace, is not suitable for constructing a cluster-type semiconductor production apparatus that conducts a single-wafer processing in combination with other semiconductor manufacturing processes.

Further, there is proposed a so-called RTH process that achieves planarization by treating a silicon substrate in a low-pressure hydrogen ambient (Ono, A., et al., 2001 Symposium on VL SI Technology Digest of Technical Papers, 7A-2, pp. 79–80). However, this substrate preprocessing process, requiring a high-vacuum environment and hydrogen ambient, is not suitable for constructing a cluster-type semiconductor production apparatus in combination with other semiconductor processes.

Thus, while there have been available processes of planarizing a silicon substrate surface to the degree that atomic layer steps become observable, such conventional processes require ultrahigh vacuum environment for thermal annealing process or thermal annealing process in a hydrogen ambient, and it has been difficult to construct a cluster-type semiconductor manufacturing process that conducts a single-wafer process of large-diameter wafers in combination with other semiconductor processes.

As explained previously, such a nearly complete planarization of silicon surface is essential in the fabrication process of ultrahigh-speed semiconductor devices as the preprocessing process when forming a base oxide film with the thickness of 2–3 atomic layers, in advance to the step of forming the high-K dielectric gate insulation film.

DISCLOSURE OF THE INVENTION

Accordingly, it is a general object of the present invention to provide a novel and useful substrate processing method and processing apparatus wherein the foregoing problems are eliminated.

Another and more specific object of the present invention is to provide a substrate processing method capable of planarizing a silicon substrate surface to the degree that atomic layer steps become observable and is suitable for constructing a cluster-type semiconductor production apparatus that conducts a single-wafer process in combination with other semiconductor processes. Further, the present invention provides a substrate processing apparatus for conducting such a substrate processing method as well as a production apparatus of semiconductor devices.

Another object of the present invention is to provide a substrate processing method, comprising the steps of:

removing carbon from a silicon substrate surface; and planarizing said silicon substrate surface from which carbon is removed.

Another object of the present invention is to provide a substrate processing apparatus, comprising:

a processing vessel including therein a stage for holding a substrate to be processed, said processing vessel being evacuated by an evacuating system;

a first gas supply system for introducing a nitrogen gas into said processing vessel;

a first optical window formed in a part of said processing vessel; and an ultraviolet source provided outside said processing vessel so as to irradiate said substrate held on said state via said first optical window.

Another object of the present invention is to provide a cluster-type semiconductor production apparatus, comprising:

a cassette module;

a vacuum transportation path coupled to said cassette module, said vacuum transportation path including therein a substrate transportation mechanism;

a first substrate processing chamber coupled to said vacuum transportation path and comprising: a processing vessel including therein a stage for holding a substrate to be processed, said processing vessel being evacuated by an evacuating system; a first gas supply system for introducing a nitrogen gas into said processing vessel; a second gas supply system for introducing an oxygen gas into said processing vessel; an optical window formed in a part of said processing vessel; and an ultraviolet source provided outside said processing vessel so as to irradiate said substrate on said stage via said optical window; and a second substrate processing chamber coupled to said vacuum transportation path, said second substrate processing chamber conducting a thermal annealing process on said substrate in a rare gas ambient.

Another object of the present invention is to provide a cluster-type semiconductor production apparatus, comprising:

a cassette module;

a vacuum transportation path coupled to said cassette module and including therein a substrate transportation mechanism;

a first substrate processing chamber coupled to said vacuum transportation path and comprising: a processing vessel including therein a stage for holding a substrate to be processed and evacuated by an evacuation system; a first gas supplying system for introducing a nitrogen gas into said processing vessel; a second gas supplying system for introducing a rare gas into said processing vessel; a third gas supplying system for introducing an oxygen gas into said processing vessel; a first optical window formed in a part of said processing vessel; an ultraviolet source provided outside said processing vessel so as to irradiate said substrate on said stage via said first optical window; and a lamp optical source provided outside said processing vessel so as to irradiate said substrate on said stage via a second optical window; and a second substrate processing chamber coupled to said vacuum transportation path and conducing deposition of a high-K dielectric film on said substrate to be processed.

According to the present invention, carbon on the substrate surface is removed preferably by a processing in an ultraviolet-excited nitrogen gas (UV-$N_2$ processing) in advance to the planarization processing conducted by a thermal annealing process. As a result, formation of impurities such as SiC, which causes pinning of silicon atoms at the time of the planarization processing conducted by way of suppressing flowing or sublimation of the silicon atoms, is suppressed, and the silicon atoms can move freely over the substrate surface even in the case the thermal annealing process is conducted at a relatively low temperature of about 940° C. Thereby, irregular projections and depressions existing on the substrate surface as in the case of the substrate having a polished surface, are successfully planarized, and as a result, an extremely flat surface showing atomic layer steps is achieved. Thereby, it should be noted that the planarization process of the present invention can be conducted in an ordinary rare gas ambient such as an Ar ambient and does not require ultrahigh vacuum environment or hydrogen furnace environment, contrary to the case of conventional planarization process. Thus, the substrate processing method of the present invention is suitable for constructing a cluster-type semiconductor production apparatus that conducts single-wafer substrate processing in combination with other substrate processes.

In the present invention, it should be noted that the organic substance remaining on the silicon substrate surface such as hydrocarbon or the like undergoes decomposition or depolymerization as a result of ultraviolet irradiation conducted in the nitrogen ambient. Thus, by heating the substrate in the vacuum environment, the organic substance is easily detached and removed from the substrate. With the wavelength of the ultraviolet radiation used in the present invention, there is caused no activation in the nitrogen gas, and thus, there occurs no formation of nitrogen film on the silicon substrate surface. In order that the foregoing UV-$N_2$ processing can successfully disconnect the carbon bond other than the C=N bond, it is preferable to use an ultraviolet radiation having a wavelength of 150 nm or more but not exceeding 270 nm, particularly the ultraviolet radiation having the wavelength of about 172 nm.

BRIEF DESCRIPTION OF THE DRAWINGS

FIG. 2 is a diagram showing the construction of a substrate processing apparatus used in a first embodiment of the present invention;

FIGS. 5A–5C are diagrams showing the result of element analysis conducted on the specimen of FIGS. 3A–3C by XPS;

FIGS. 6A–6D are diagrams showing the state of the silicon substrate surface for the case a planarization process is conducted at various temperatures after conducting the UV-$N_2$ processing by using the substrate processing apparatus of FIG. 2;

FIGS. 7A–7C are diagrams showing the state of the silicon surface for the case various carbon removal process is conducted by using the substrate processing apparatus of FIG. 2;

FIG. 25 is a diagram showing the construction of an RF remote-plasma source used in the substrate processing apparatus of FIG. 23;

FIG. 30 is a diagram showing the principle of detecting the thickness distribution of the nitrogen atoms in the oxynitride film by using the XPS analysis;

BEST MODE FOR IMPLEMENTING THE INVENTION

Figure 1:
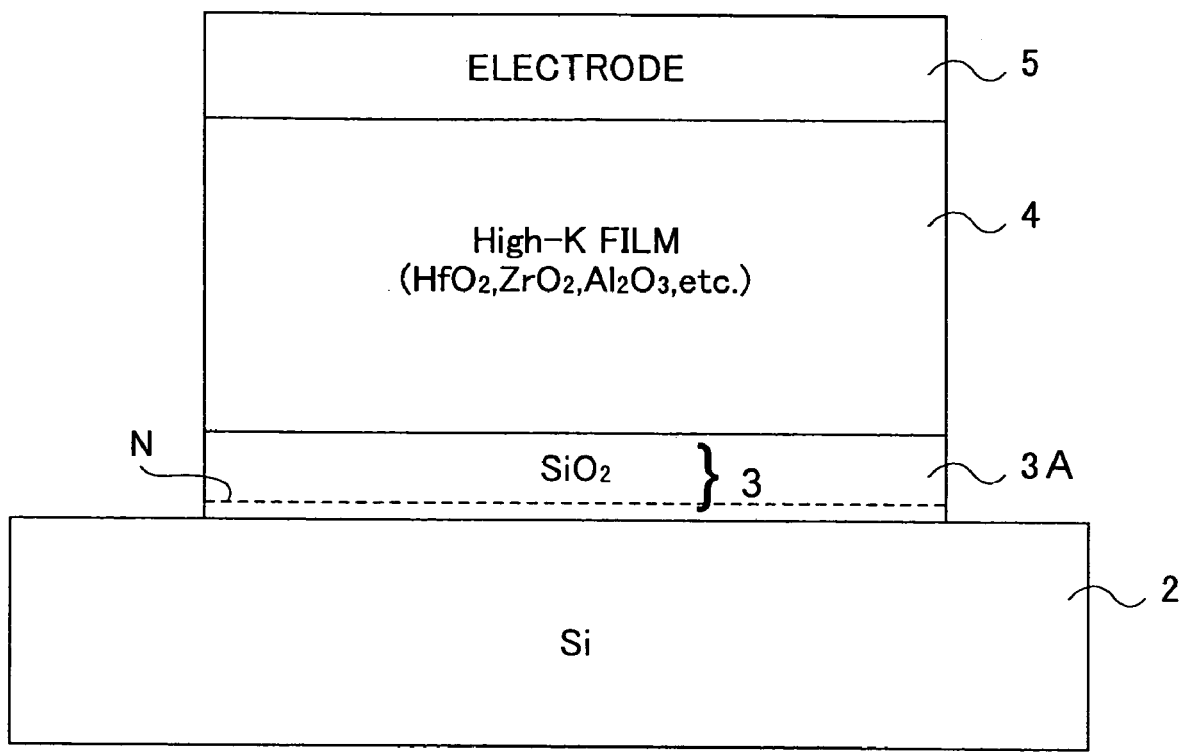
FIG. 1 is a diagram showing the construction of a conventional semiconductor device.

In the present invention, residual carbon is removed from the substrate surface by conducting an ultraviolet irradiation in $N_2$ ambient ($UV-N_2$ processing) on a silicon substrate surface. Thereafter, the silicon substrate surface is planarized by conducting a thermal annealing process in a rare gas. By applying an ultraviolet radical oxidation ($UV-O_2$) processing to the silicon substrate surface thus planarized, a very thin oxide film can be formed. Further, nitrogen is introduced into the thin oxide film thus formed.

[First Embodiment]

Removal of Residual Carbon from a Substrate Surface and Planarization

Hereinafter, a first embodiment of the present invention will be described.

FIG. 2 shows the construction of a substrate processing apparatus 10 used in a first embodiment of the present invention.

Referring to FIG. 2, the substrate processing apparatus 10 includes a processing vessel 11 having a stage 11A holding a substrate 12 to be processed thereon, and there is provided a showerhead 11B of a material such as quartz transparent to ultraviolet radiation in the processing vessel 11. The showerhead 11B is provided so as to face the substrate 12 on the stage 11A. Further, the processing vessel 11 is evacuated through an evacuation port 11C, and an oxidizing gas such as an oxygen gas or NO gas is supplied to the processing vessel 11 from an external gas source via the foregoing showerhead 11B.

It should be noted that the processing vessel 11 is formed with an optical window 11D of a material transparent to ultraviolet radiation such as quartz above the showerhead 11B such that the optical window 11D exposes the showerhead 11B and the substrate 12 underneath the showerhead 11B. Further, the stage 11A is provided with a heater 11a for heating the substrate 12.

Further, there is provided an ultraviolet exposure apparatus 14 above the processing vessel 21 via an intervening connection part 13 provided in correspondence to the optical window 11D.

The ultraviolet exposure apparatus 14 includes a quartz optical window 14A corresponding to the optical window 11D and an ultraviolet source 14B radiating ultraviolet radiation upon the substrate 12 via the optical window 11D, wherein the ultraviolet source 14B is held by a robot 14C movably in a direction parallel to the optical window 14A as is represented in FIG. 2 by an arrow. In the illustrated example, the ultraviolet source 14B is formed of a linear optical source extending in the direction generally perpendicular to the moving direction of the ultraviolet source 14B. For such a linear optical source, it is possible to use an excimer lamp having a wavelength of 172 nm.

In the construction of FIG. 2, it should be noted that an inert gas such as $N_2$ is supplied to the connection part 13 from an external gas source (not shown) via a line 13A for avoiding the problem of absorption of the ultraviolet radiation by the oxygen in the air before the ultraviolet radiation formed by the ultraviolet radiation source 14B is introduced into the processing vessel 11 through the optical window 11D. The foregoing inert gas flows into the space 14D inside the ultraviolet exposure apparatus 14 through a gap formed in the mounting part of the optical window 14A of the ultraviolet exposure apparatus 14.

Further, in order to suppress the incoming flow of oxygen in the air into the region right underneath the ultraviolet source 14B with the driving of the ultraviolet source 14B, there is provided a shielding plate 14F at both lateral sides of the ultraviolet source 14B, and an inert gas such as $N_2$ is supplied into a narrow region, which is formed between the optical window 14A opposing the ultraviolet source 14B and the shielding plate 14F with a height of about 1 mm or so, via lines 14b and 14c. This region is also supplied with the inert gas from the line 13A, and as a result, oxygen absorbing the ultraviolet radiation is effectively purged from this region.

The inert gas passed through the region underneath the shielding plate 14F is caused to flow into the foregoing space 14D and is then discharged to the outside of the ultraviolet exposure apparatus 14 through an evacuation port 14E formed in the ultraviolet exposure apparatus 14.

In the substrate processing apparatus of FIG. 2, it is possible to control the movement and scanning of the ultraviolet source 14B by the robot 14C of the ultraviolet exposure apparatus 14, and as a result, it becomes possible to control the film thickness distribution at the time of formation of the oxide film on the surface of the substrate 12 by the ultraviolet-activated oxidation processing, by controlling the a ultraviolet radiation dose. Further, it should be noted that the controller 15 controls the driving of the ultraviolet source 14B.

Figure 3C:
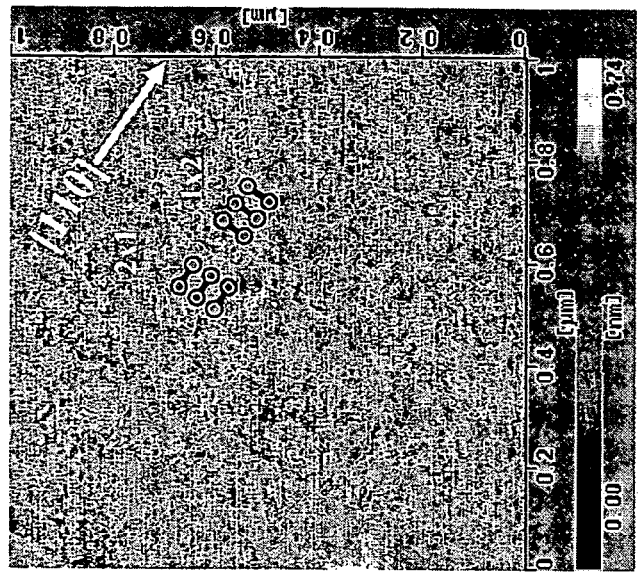
FIGS. 3A–3C are diagrams showing the state of surface of a silicon substrate for the case of conducting various preprocessing by a cluster-type substrate processing apparatus that includes the substrate processing apparatus of 2, in the state an argon annealing process is conducted thereafter.
Figure 3B:
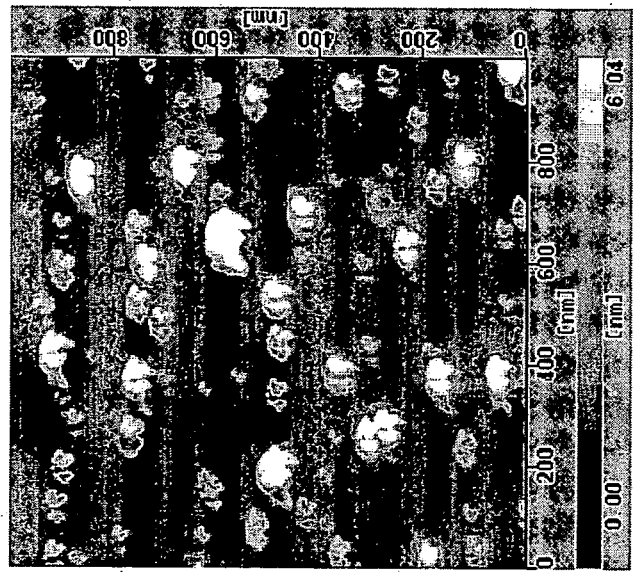
Figure 3A:
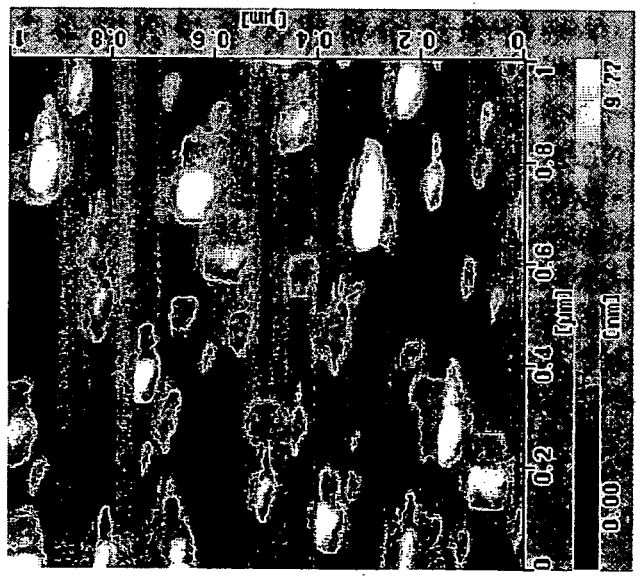

FIGS. 3A–3C are AFM images showing the substrate surface for the case a silicon substrate is introduced into the UV substrate processing apparatus 10 of FIG. 2 after removal of native oxide film by conducting thereto an HF (DHF) processing as the substrate 11, and a UV-$N_2$ processing is conducted by supplying a nitrogen gas to the showerhead 13 and driving the ultraviolet source 14B or a UV-$O_2$ processing is conducted by supplying an oxygen gas to the showerhead 13 and driving the ultraviolet source 14B, for the state in which a thermal annealing process is conducted further in an Ar ambient at the temperature of 1175° C. under the pressure of 1060 Pa for 90 seconds. Here, it should be noted that FIG. 3A shows a comparative example in which a planarization processing is conducted on a silicon substrate after the DHF cleaning process, without processing the substrate in the substrate processing apparatus 10. On the other hand, FIG. 3B shows the result of the experiment in which a silicon substrate is processed in the substrate processing apparatus 10 under the pressure of about 2.66 Pa ($2\times10^{-2}$ Torr) at the substrate temperature of 450° C. while introducing an oxygen gas via the showerhead 13 with a flow rate of 150 SCCM and driving the ultraviolet source 14B for 5 minutes. Further, FIG. 3C shows the case in which a similar processing is conducted while introducing a nitrogen gas from the showerhead 13 in place of the oxygen gas. In the experiments of FIGS. 3A–3C, a p(100) Cz wafer was used for the silicon substrate 11.

Figure 4:
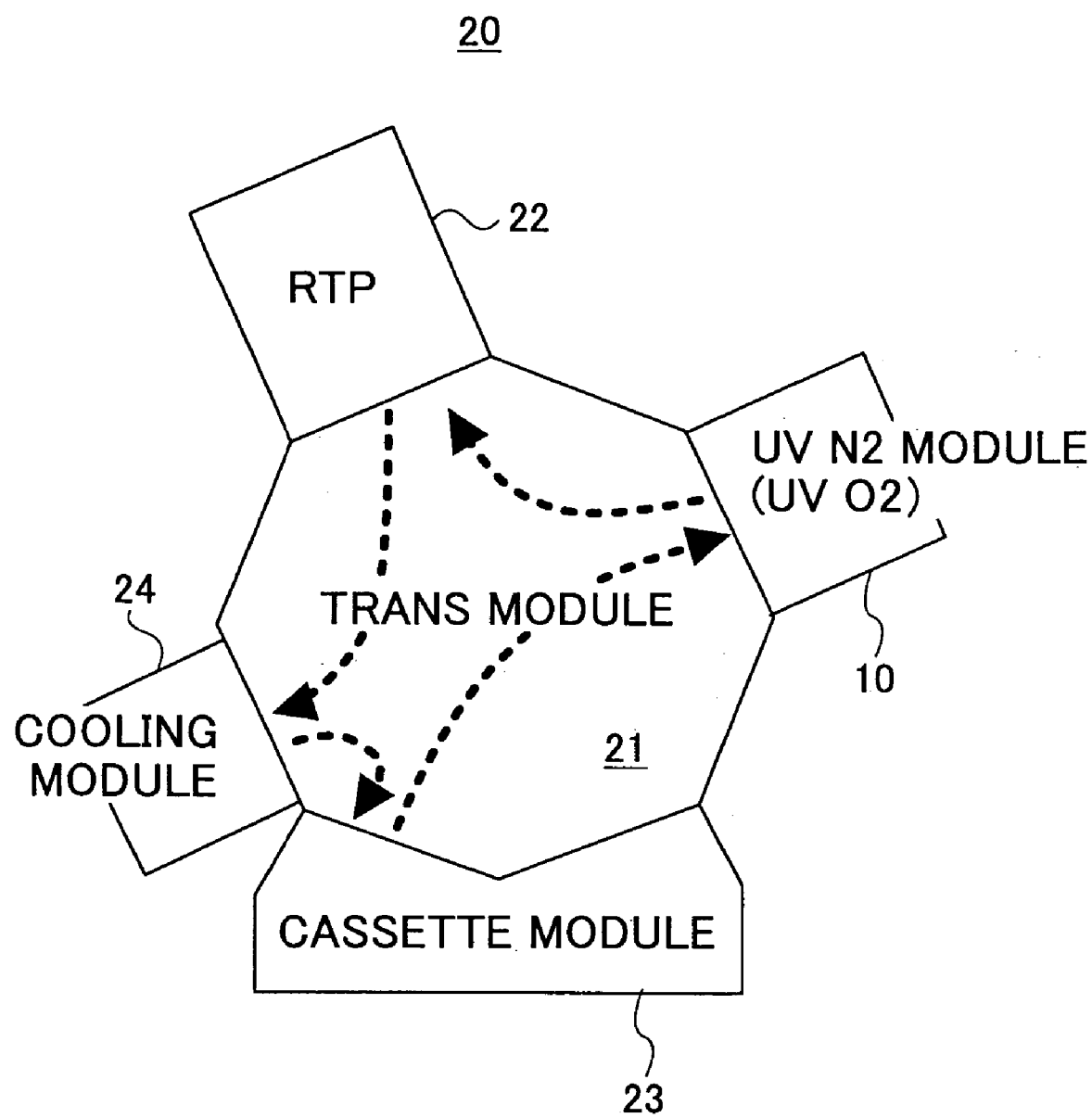
FIG. 4 is a diagram showing the construction of a cluster-type substrate processing apparatus that includes the substrate processing apparatus of FIG. 2.

In the experiments of FIGS. 3A–3C, the thermal annealing process was conducted in a substrate processing apparatus 20 of cluster type shown in FIG. 4 in which the substrate processing apparatus 10 of FIG. 2 is coupled to a rapid thermal processing (RTP) chamber 22 having an infrared lamp heating unit via a vacuum transportation path 21. Referring to FIG. 4, it can be seen that the substrate processing apparatus 20 further includes a substrate load/unload module 23 and a cooling module 24 coupled to the vacuum transportation path 21. It should be noted that both of the substrate processing apparatus 10 of FIG. 2 and the rapid thermal processing chamber 22 of FIG. 4 use the process temperature and pressure commonly used in ordinary semiconductor manufacturing process and there is no need of conducting a special process such as hydrogen processing. Thus, these processing chambers can easily constitute a cluster-type substrate processing apparatus together with other substrate processing apparatuses.

Referring to FIGS. 3A–3C again, it can be seen that there are formed a number of island-like projecting defects on the substrate surface in the case of FIGS. 3A and 3B, while in the case of FIG. 3C, it will be noted that there is formed no such formation of defects at all. In the AFM image of FIG. 3C, it should be noted that the silicon substrate is inclined slightly in the [110] direction, and as a result of this microinclination, it can be seen that there is formed a structure in which two domains, one defining a 2×1 atomic terrace and the other defining a 1×2 atomic terrace, are arranged alternately and the foregoing two domains form a single atomic step. In such a 2×1 atomic terrace and 1×2 atomic terrace, it is known that the silicon atoms rearranged on the silicon (100) surface constitute array of dimers. Because the direction of the dimers of the silicon atoms on one terrace crosses with the direction of the silicon atom dimers of an adjacent terrace perpendicularly, the edge defining the steps becomes straight or zigzag depending on whether the step edge has large energy or small energy.

The measurement of surface roughness conducted on the specimen of FIGS. 3A and 3B has revealed that the average surface roughness Rms takes a value of 2.09 nm and 1.27 nm, respectively. With regard to the maximum peak-valley amplitude PV, it was shown that the PV value becomes 16.1 nm and 11.7 nm, respectively. In the case of the specimen of FIG. 3C, on the other hand, a very small value of only 0.113 nm was observed for the average surface roughness Rms. Further, it was confirmed that the maximum peak-valley amplitude PV is reduced also to 1.33 nm.

FIGS. 5A–5C show respectively the photoelectron spectra of $C_{1s}$ orbital and $Si_{2p}$ orbital obtained by conducting an XPS analysis on the specimens of FIGS. 3A–3C.

Referring to FIG. 5A, it can be seen that there exists a predominant photoelectron peak corresponding to the $C_{1s}$ orbital caused by hydrocarbon contained in the air and adsorbed on the substrate surface during the process of transporting the substrate to the analyzer. Further, there is observed a chemical shift of the $C_{1s}$ peak partially overlapped with the foregoing peak as represented by an arrow in the drawing, wherein it should be noted that this chemical shift is caused by the existence of an SiC bond. Further, it can be seen that a similar chemical shift is observed also in the spectrum of FIG. 5B. In the case of FIG. 5C, on the other hand, it can be seen that the spectrum is sharp, indicating that there is caused no formation of SiC bond in this specimen.

From the observations noted above, it is concluded that the projecting island-like defects observed in FIGS. 5A and 5B are formed of SiC. It is believed that such SiC is formed as a result of reaction of carbon atoms, originating from an organic substance such as hydrocarbon contained in the air and adsorbed on the silicon substrate surface, with the silicon atoms in the silicon substrate during the thermal annealing process.

The result of FIGS. 3A–3C indicates that the surface roughness of the substrate surface increases sharply in the case there exists SiC defects on the silicon substrate surface. It is believed that such SiC defects cause pinning of the silicon atoms on the silicon substrate surface and the silicon atoms are prevented from moving along the substrate surface. Further, the foregoing result indicates also that, when such SiC defects are removed, there would occur a free movement of the silicon atoms even in the temperature and pressure conditions used in ordinary semiconductor processes and that there would occur formation of atomic layer steps.

FIGS. 6A–6D show AFM images of the substrate surface for the case carbon on the substrate surface is removed at first in the substrate processing apparatus 30 of FIG. 4 by conducting the UV-$N_2$ processing and thereafter a thermal annealing process is conducted in the RTP apparatus 32 in an Ar ambient under the pressure of 1060 Pa while changing the temperature variously. Here, it should be noted that FIG. 6A shows the case in which the thermal annealing process is conducted at 1050° C. for 90 seconds, while FIG. 6B shows the case in which the thermal annealing process is conducted at 1000° C. for 90 seconds. Further, FIG. 6C shows the case in which the thermal annealing process is conducted at 950° C. for 90 seconds, while FIG. 6D shows the case in which the thermal annealing process is conducted at 900° C. for 90 seconds.

Referring to FIGS. 6A–6D, it can be seen that there is achieved a remarkable improvement with regard to the surface roughness Rms and the maximum peak-valley amplitude PV in any of these cases as compared with the case of FIGS. 3A and 3B explained previously. In the example of FIG. 6A, it can be seen that the surface roughness Rms is 0.236 nm, the peak-valley amplitude is 2.13 nm, while in the example of FIG. 6B, the surface roughness Rms is 0.202 nm while the maximum peak-valley amplitude is 3.43 nm. In the example of FIG. 6C, the surface roughness Rms is 0.105 nm and the peak-valley amplitude is 1.04 nm. Further, in the example of FIG. 6D, the surface roughness Rms is 0.141 nm while the maximum peak-valley amplitude takes the value of 1.45 nm. Particularly, it can be seen in the example of FIG. 6C that both the surface roughness Rms and the maximum peak-valley amplitude are minimum and a clear atomic layer step is observed. Here, it should be noted that the experiments of FIGS. 6A–6D use the substrates of different lot with regard to the silicon substrates used in the experiments of FIGS. 3A–3C, and because of this, the direction of the microinclination is offset from the foregoing [110] direction. Because of this, the atomic layer is formed in a cross-hatch pattern rather than the terrace pattern shown in FIG. 3C.

From the result of FIGS. 6A–6D, it is concluded that the thermal annealing process conducted for substrate planarization after the carbon removal process conducted by the UV-N$_2$ processing is preferably conducted at the temperature near 950° C.

FIGS. 7A–7C are AFM images of the substrate surface for the case a silicon substrate is subjected to a thermal annealing process for planarization after conducting various pre-processing on the silicon substrate, wherein FIG. 7A shows the case in which only a native oxide removal process is applied to the substrate surface by conducting a DHF process before conducting the planarizing thermal annealing process at 950° C. FIG. 7B, on the other hand, shows the case in which a carbon removal process is conducted to the substrate surface in the substrate processing apparatus 10 of FIG. 2 by the UV-O$_2$ processing while supplying an oxygen gas to the showerhead 13 after the DHF processing and thereafter a thermal annealing process is conducted at 950° C. for planarization. Further, FIG. 7C shows the case in which the carbon removal processing is conducted on the substrate surface by the UV-N$_2$ processing explained before after the DHF processing and a thermal annealing process for planarization is conducted thereafter at 950° C.

Referring to FIGS. 7A–7C, it can be seen that the average surface roughness Rms takes the value of 0.196 nm and the maximum peak-valley amplitude PV takes the value of 3.02 nm in the case of FIG. 7A in which only the DHF processing is conducted, while in the case of FIG. 7B in which the UV-O$_2$ processing is conducted, the average surface roughness Rms decreases to 0.181 nm and the maximum peak-valley amplitude PV decreases to 1.69 nm. Further, in the case of FIG. 7C in which the UV-N$_2$ processing is conducted, the average surface roughness Rms is reduced further to 0.131 nm and the maximum peak-valley amplitude is reduced to 1.66 nm.

In this way, it becomes possible to realize an extremely flat substrate surface even in the case the thermal annealing processing is conducted in an inert ambient such as Ar at the temperature of 950° C., by removing carbon in advance by conducting the UV-N$_2$ processing.

Figure 8:
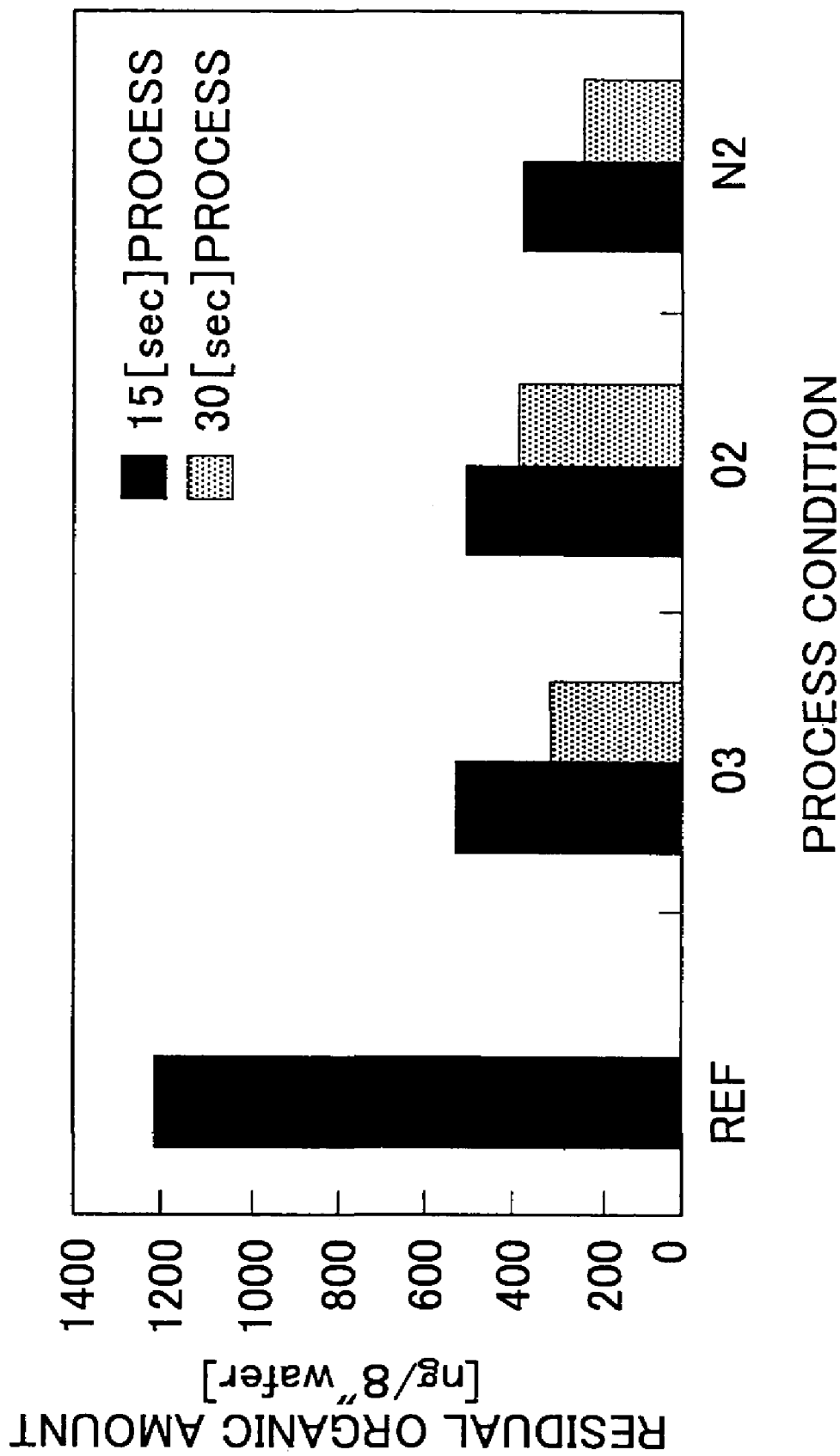
FIG. 8 is a diagram showing the amount of residual carbon on the silicon substrate surface for the case various substrate preprocessing is conducted.

FIG. 8 shows the effect of carbon removal from a silicon substrate surface by various processes.

Referring to FIG. 8, a silicon substrate of 8-inch diameter generally carries an organic substance of about 1200 ng on the surface thereof in the case no carbon removal processing is conducted. It can be seen that this organic substance is removed to some extent by conducting processing of ozone, oxygen or nitrogen. There, it will be noted that the processing by nitrogen is most effective, and the amount of the residual organics is reduced to 350 ng with the processing for 15 seconds. With the processing for 30 seconds, it becomes possible to reduce the amount of the residual organics to 200 ng.

Table 1 below shows various bonding energy of carbon.

| Chemical bond | wavelength (nm) |
|---|---|
| C=N | about 150 |
| C=O | 160 |
| C=C | 200 |
| C—F | 270 |
| C—H | 300 |
| C—C | 330 |
| C—O | 350 |
| C—Cl | 400 |
| C—N | 440 |
| C—Br | 470 |

Referring to Table 1, it will be understood that almost all the chemical bond of carbon can be cut by using an ultraviolet source having a wavelength of 172 nm for the ultraviolet source 14B in the substrate processing apparatus 10 of FIG. 2. Further, it can be seen that energy sufficient to cut the carbon bond other than the double bond is obtained by using a mercury lamp having the wavelength of 254 nm. Generally, it becomes possible to depolymerize the hydrocarbon polymer adsorbents adhered to a silicon substrate by irradiating ultraviolet radiation having a wavelength of 270 nm or less. By doing so, detachment of the adsorbent from the substrate surface is facilitated.

[Second Embodiment]

Oxide Film Formation on a Planarized Substrate

Next, the process of forming an extremely thin oxide film on such a planarized silicon substrate surface will be explained as a second embodiment of the present invention.

Figure 9:
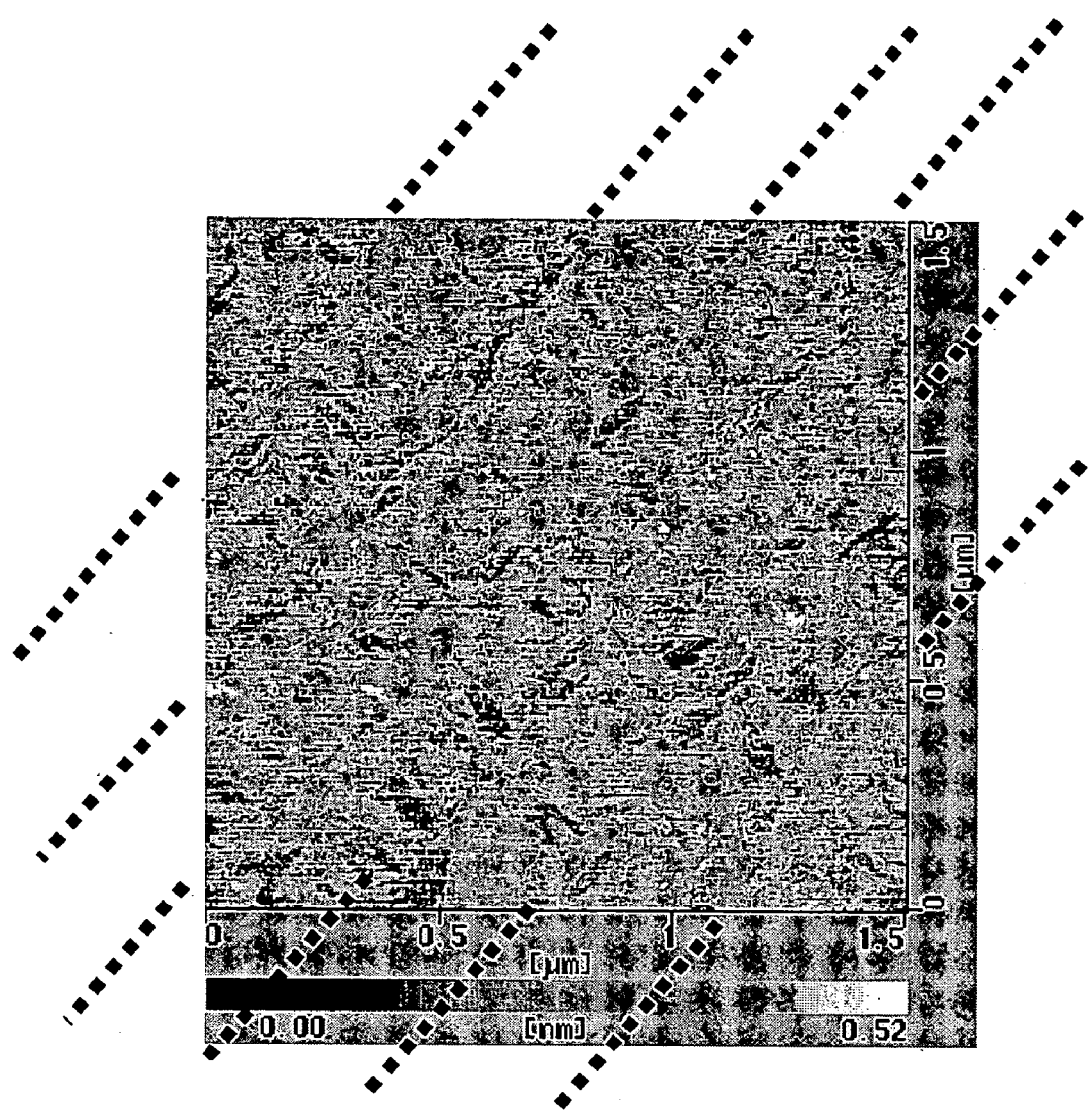
FIG. 9 is a diagram corresponding to FIG. 6C and shows the atomic layer steps appearing on the silicon substrate surface in an enlarged scale for the case of conducting the carbon removal process and further the planarization process.

FIG. 9 shows the AFM image of FIG. 7C in an enlarged scale.

Referring to FIG. 9, it can be seen that there are repeatedly formed atomic layer steps extending generally parallel with each other on the silicon substrate surface as represented by dotted lines in the drawing with a generally constant interval. In the example of FIG. 9, each atomic layer step has a height of 1 atomic layer (0.135 nm), and the substrate is inclined slightly from the (100) surface with an angle of about 0.05°.

Figure 10A:
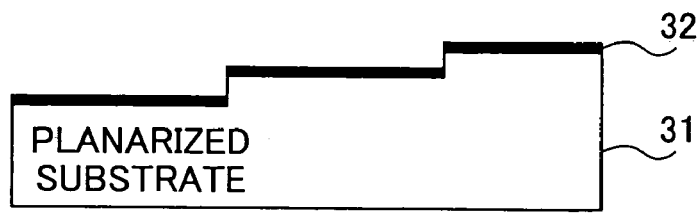
FIGS. 10A and 10B are diagrams showing the process of forming an oxide film on the silicon substrate surface of FIG. 9 according to a second embodiment of the present invention.
Figure 10B:
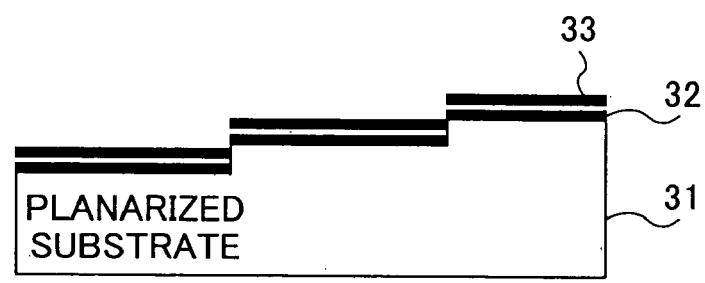

FIGS. 10A and 10B show the formation of a thin oxide film 32 on such an inclined substrate surface 31 by an UV-O$_2$ radial processing that uses the substrate processing apparatus 10 of FIG. 2, wherein it should be noted that the inclined substrate 31 of FIGS. 10A and 10B models the silicon substrate of FIG. 9.

Referring to FIG. 10A, there are formed atomic layer steps repeatedly on the silicon substrate surface, and the oxide film is formed so as to cover the terrace in each of the steps. In such a case where the silicon substrate surface is planarized to the atomic scale and atomic layer steps are appearing on the substrate surface, there appear steps also on the surface of the oxide film 32 in correspondence to the atomic layer steps. Thus, by forming a next oxide film 33 on the oxide film 32, the atomic layer steps are transferred further to the oxide layer 33 in the form of steps.

Figure 11A:
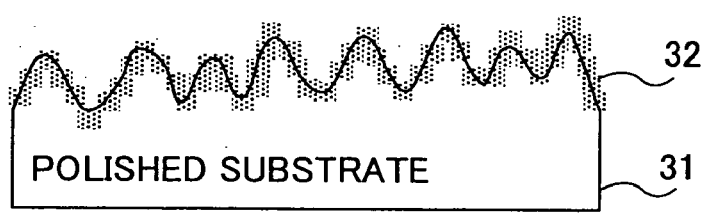
FIGS. 11A and 11B are diagrams showing the process of forming an oxide film on a silicon substrate having a polished surface.
Figure 11B:
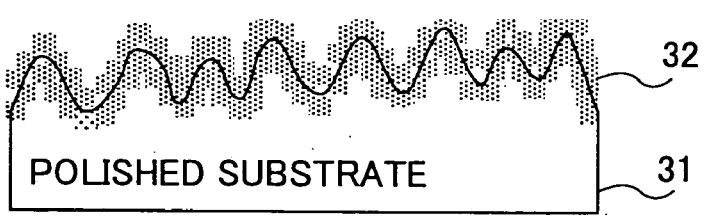

In the case the substrate surface is planarized by polishing as represented in FIG. 11A, it should be noted that the substrate surface becomes microscopically irregular and only an irregular surface is obtained when the oxide film 32 is formed. In such a case, the irregularity is enhanced further when the next oxide film 33 is grown on the oxide film 32 as represented in FIG. 11B. Thereby, there is caused remarkable variation in the thickness of the oxide film thus formed.

Figure 12:
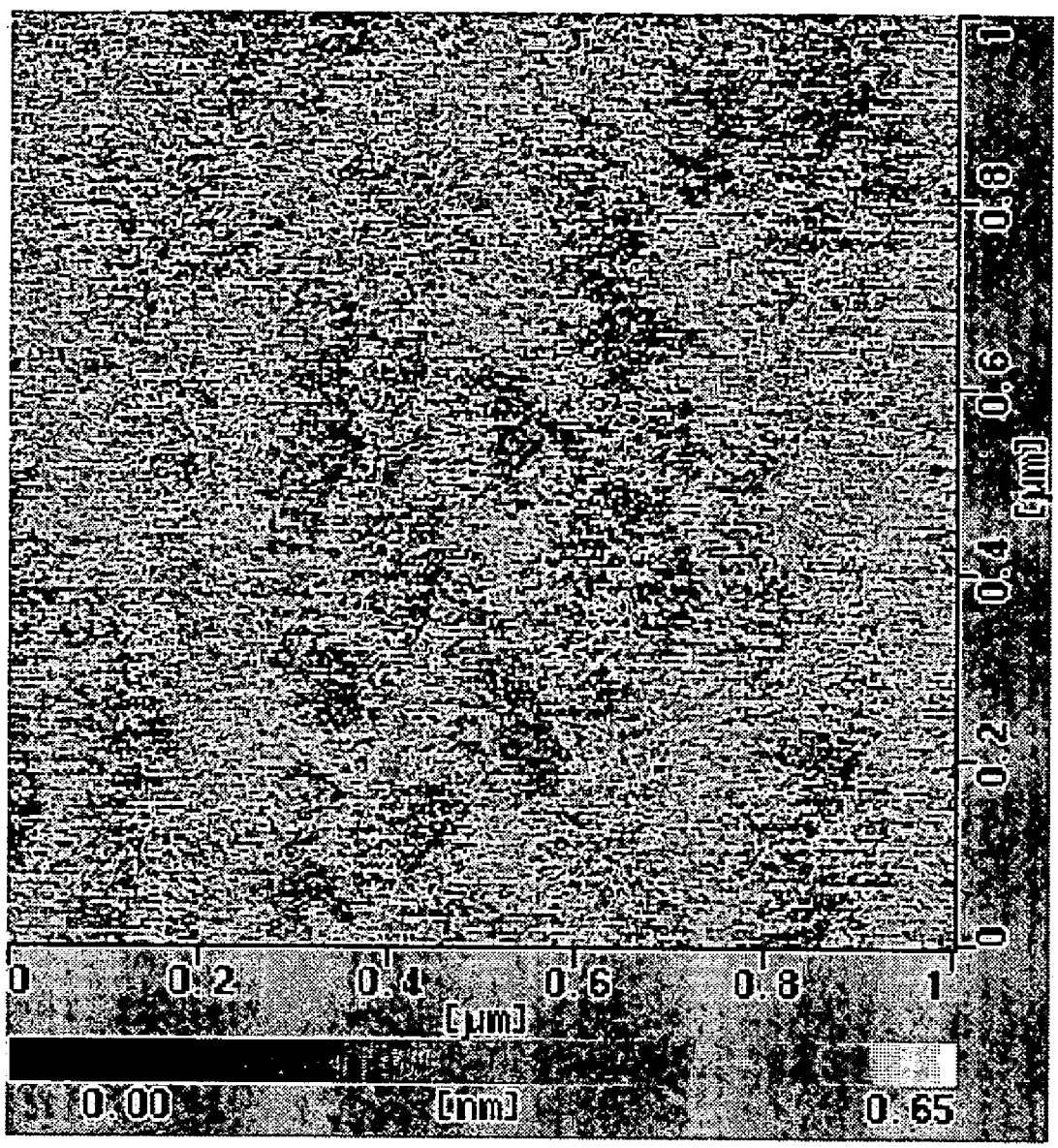
FIG. 12 is an AFM image showing the state of the oxide film surface grown on the silicon substrate surface after conducting the carbon removal process and planarization process.

FIG. 12 shows an AFM image of an oxide film surface for the case an oxide film is grown on the structure of FIG. 9 according to the model of FIGS. 10A and 10B with the thickness of 0.4 nm, which corresponds to two-atomic layer thickness. Here, the oxide film of 0.4 nm thickness was formed by using the UV radical substrate processing apparatus 10.

Referring to FIG. 12, it can be seen that the oxide film surface shows clear steps corresponding to the atomic layer steps of the underlying substrate.

Figure 13:
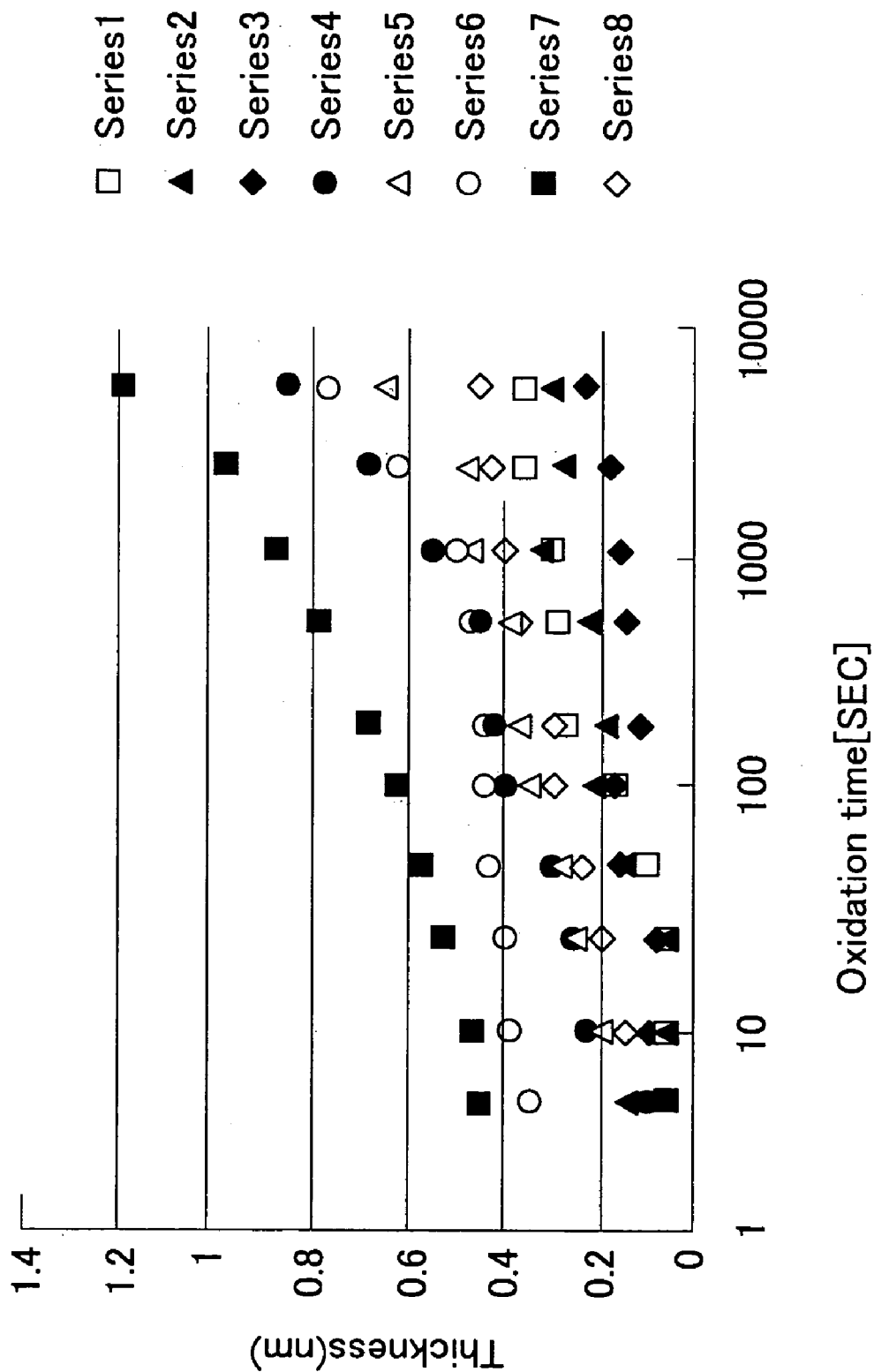
FIG. 13 is a diagram showing the relationship between the film thickness and oxidation time for the case of conduction an oxide film formation according to the second embodiment of the present invention.

FIG. 13 shows the relationship between the film thickness and oxidation time for the case a silicon oxide film is formed on a surface of a silicon substrate processed with the UV-$N_2$ carbon removal processing explained before by using the substrate processing apparatus 10 of FIG. 2. In the experiment, the substrate temperature was set at 450° C. and an oxygen gas was supplied to the showerhead 11B while changing the ultraviolet radiation power and the oxygen gas flow rate or oxygen partial pressure variously. An excimer lamp having a wavelength of 172 nm is used for the ultraviolet source 14B during the oxidizing processing.

Referring to FIG. 13, the data of Series 1 represents the relationship between the oxidation time and oxide film thickness for the case the ultraviolet radiation power is set to 5% of a reference power (50 mW/cm$^2$) at the window surface of the ultraviolet radiation source 14B and the process pressure is set to 665 mPa (5 mTorr) and further the oxygen gas flow rate is set to 30 SCCM. On the other hand, the data of Series 2 represents the relationship between the oxidation time and oxide film thickness for the case the ultraviolet radiation power is set to zero, the process pressure is set to 133 Pa (1 Torr) and the oxygen gas flow rate is set to 3 SLM. The data of Series 3 represents the relationship between the oxidation time and oxide film thickness for the case the ultraviolet radiation power is set to zero, the process pressure is set to 2.66 Pa (20 mTorr) and the oxygen gas flow rate is set to 150 SCCM, while the data of Series 4 represents the relationship between the oxidation time and oxide film thickness for the case the ultraviolet radiation power is set to 100% of the reference power, the process pressure is set to 2.66 Pa (20 mTorr) and further the oxygen gas flow rate is set to 150 SCCM. The data of Series 5 represents the relationship between the oxidation time and oxide film thickness for the case the ultraviolet radiation power is set to 20% of the reference power, the process pressure is set to 2.66 Pa (20 mTorr) and the oxygen gas flow rate is set to 150 SCCM, while the data of Series 6 represents the relationship between the oxidation time and oxide film thickness for the case the ultraviolet radiation power is set to 20% of the reference power, the process pressure is set to about 67 Pa (0.5 Torr) and further the oxygen gas flow rate is set to 0.5 SLM. Further, the data of Series 7 represents the relationship between the oxidation time and oxide film thickness for the case the ultraviolet radiation power is set to 20% of the reference power, the process pressure is set to 665 Pa (5 Torr) and the oxygen gas flow rate is set to 2 SLM, while the data of Series 8 represents the relationship between the oxidation time and oxide film thickness for the case the ultraviolet radiation power is set to 5% of the reference power, the process pressure is set to 2.66 Pa (20 mTorr) and the oxygen gas flow rate is set to 150 SCCM.

In the experiment of FIG. 13, the thickness of the oxide film is obtained by an XPS analysis, in view of the fact that there is no standard process of obtaining the thickness of such an extremely thin oxide film having a film thickness less than 1 nm.

Figure 14:
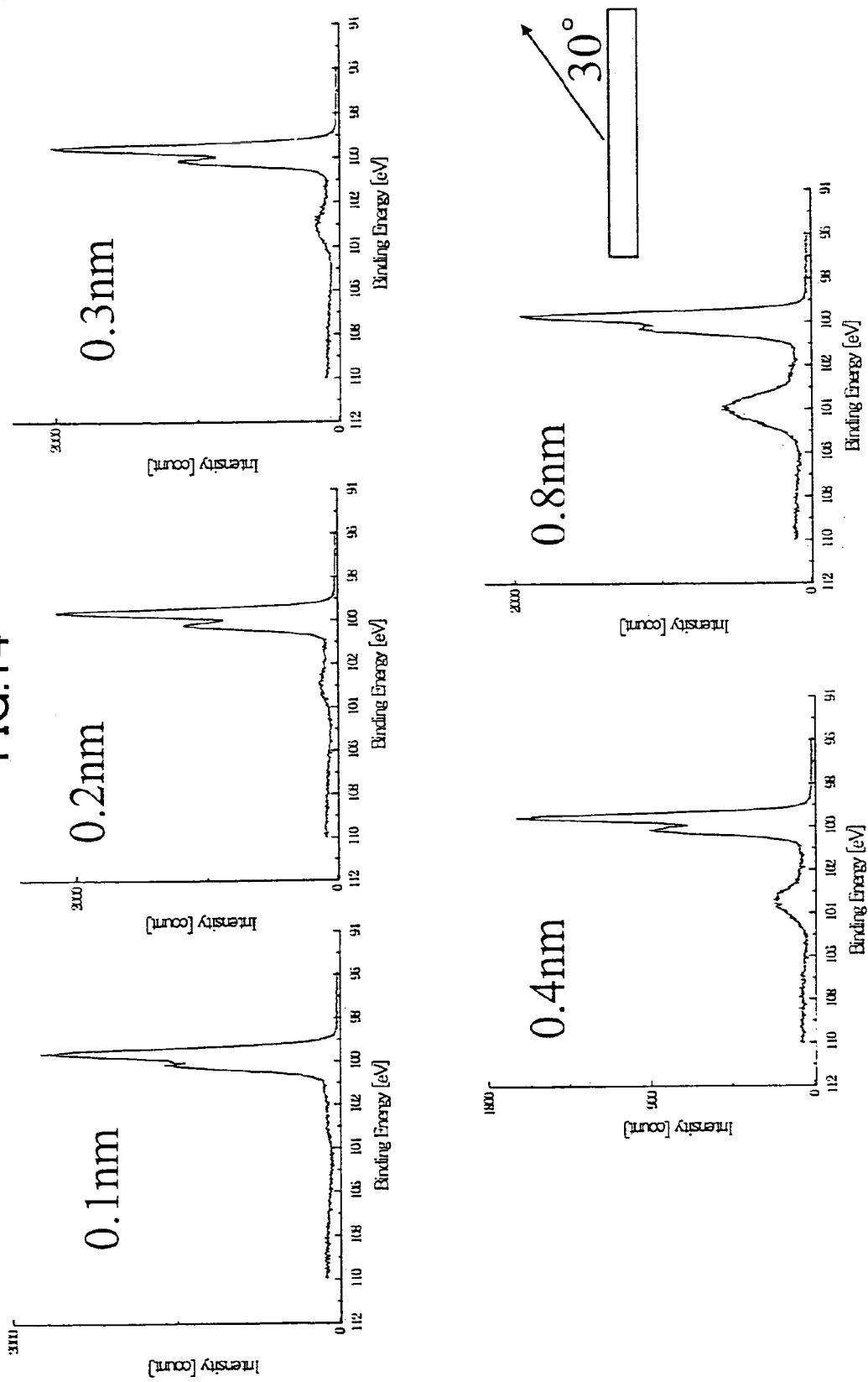
FIG. 14 is a diagram explaining the procedure of measuring the film thickness by an XPS analysis as used in the present invention.
Figure 15:
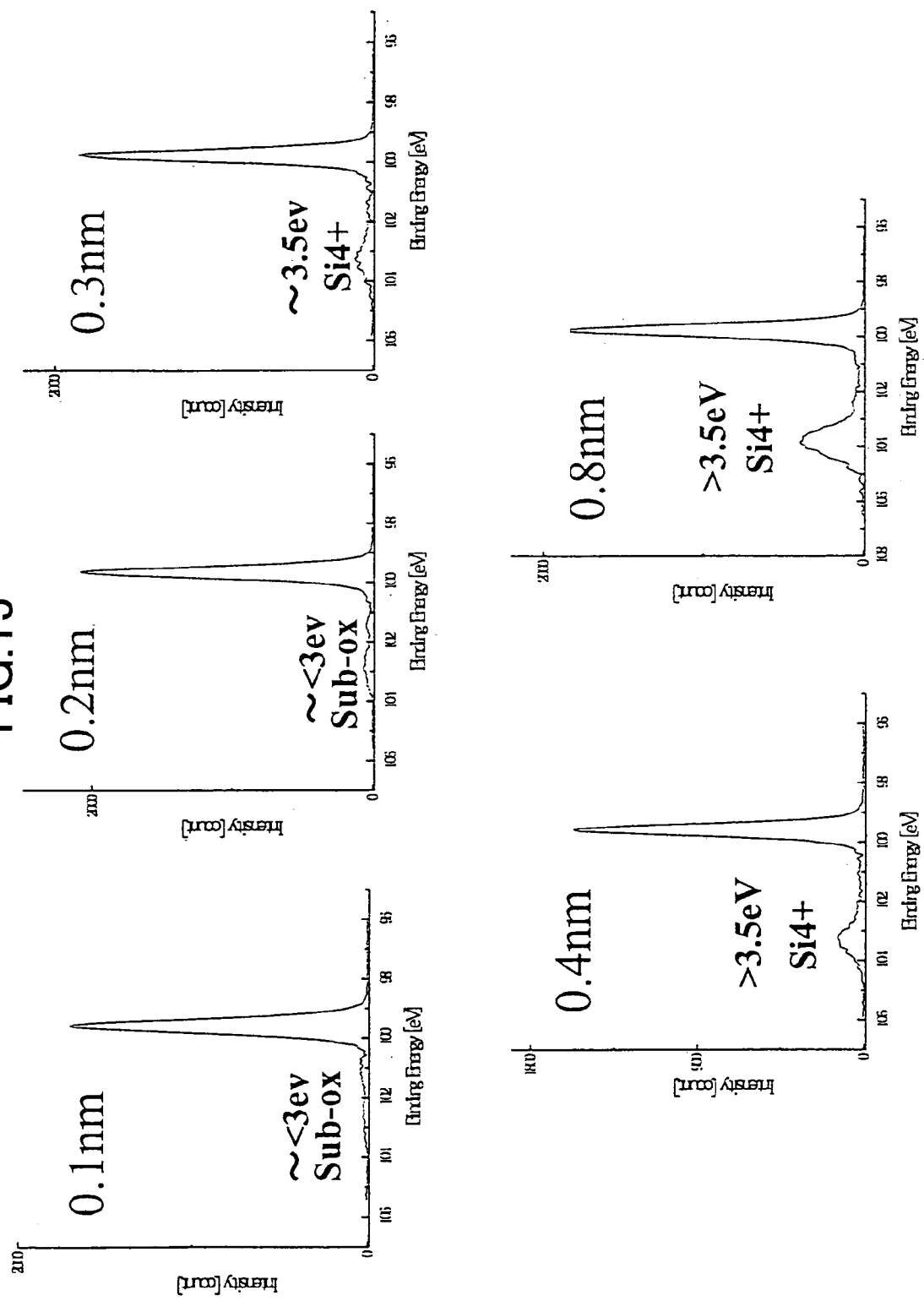
FIG. 15 is another diagram explaining the procedure of measuring the film thickness by an XPS analysis as used in the present invention.

In view of the situation noted above, the inventor of the present invention obtained a film thickness d of an oxide film by first obtaining a $Si_{2p}^{3/2}$ XPS spectrum shown in FIG. 15 by applying, to an observed XPS spectrum of $Si_{2p}$ orbital shown in FIG. 14, a background correction and separation correction for separating the 3/2 spin state and the 1/2 spin state, and then obtaining the film thickness d from the $Si_{2p}^{3/2}$ XPS spectrum thus obtained by using Equation (1) and associated coefficients below according to the teaching of Lu-et al (Z. H. Lu, et al., Appl. Phys. Lett. 71(1997), pp. 2764), $$d=\lambda \sin \alpha \cdot \ln[I^{X+}/(\beta I^{0+})+1] \qquad (1)$$

$\lambda=2.96$ $\beta=0.75$

In Eq. (1), it should be noted that a represents the detection angle of the XPS spectrum and is set to 30° in the illustrated example. Further, $I^{X+}$ in Eq. (1) represents an integral spectrum intensity ($I^{1+}+I^{2+}+I^{3+}+I^{4+}$) of the oxide film and corresponds to the peak observed in the energy region of 102–104 eV of FIG. 15. On the other hand, $I^{0+}$ corresponds to the integral spectral peak intensity corresponding to the energy region around 100 eV, wherein this spectral peak is caused by the silicon substrate.

Figure 16:
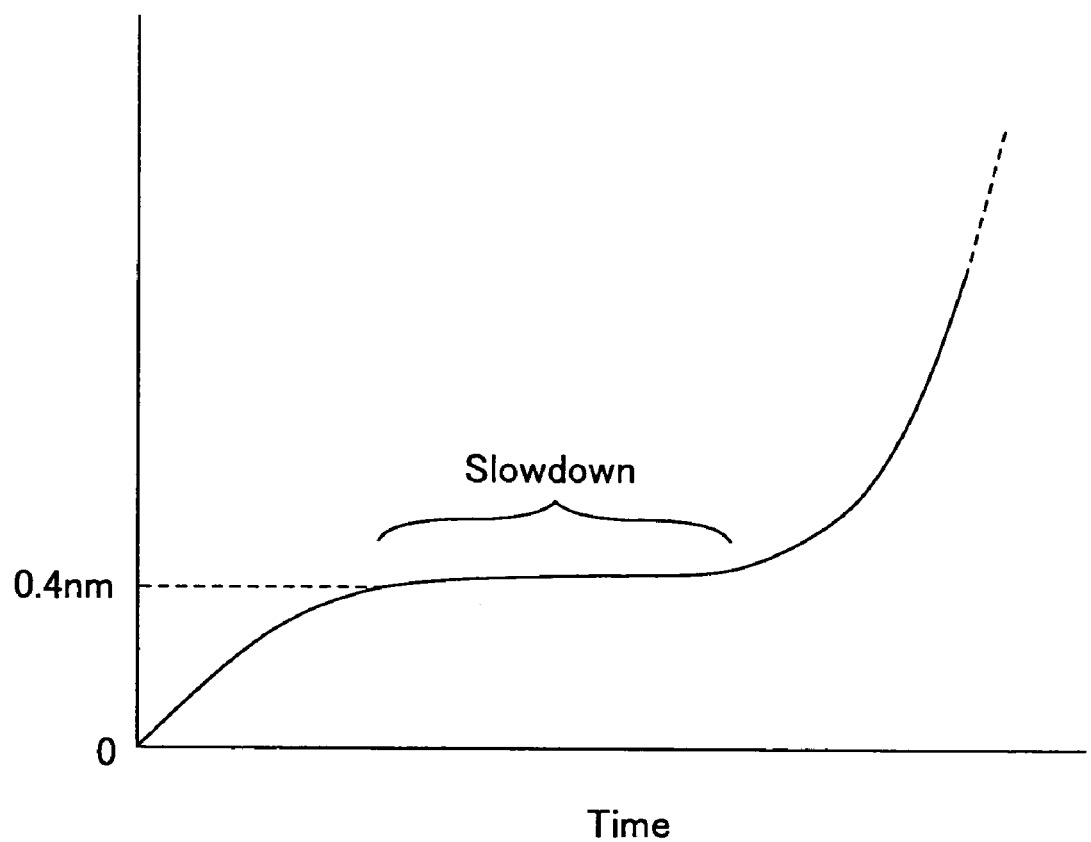
FIG. 16 is a diagram schematically showing the phenomenon of slowdown of oxide film growth observed when forming an oxide film by the substrate processing apparatus of FIG. 3.

Referring to FIG. 13 again, it will be noted that the oxide film thickness increases gradually from the initial thickness of 0 nm with the oxidation time for the case the ultraviolet radiation power, and hence the oxygen radical density formed by the ultraviolet radiation, is set small (Series 1, 2, 3, and 8). In the case of Series 4, 5, 6 and 7, in which the ultraviolet radiation power is set to 20% or more of the reference power, on the other hand, it can be seen that there appears a slowdown of oxide film growth after the start of the growth and when the oxide film has reached a thickness of about 0.4 nm as represented in FIG. 16. The growth of the oxide film is restarted only after a certain time has elapsed in the slowdown state.

The relationship of FIG. 13 or 16 means that there is a possibility of forming an extremely thin oxide film of the thickness of about 0.4 nm stably in the oxidation process of a silicon substrate surface. Further, the fact that the slowdown state continues for some time as represented in FIG. 16 indicates that the oxide film thus formed has a uniform thickness. Thus, according to the present invention, it is possible to form an oxide film having a thickness of about 0.4 nm on a silicon substrate with uniform thickness.

Figure 17A:
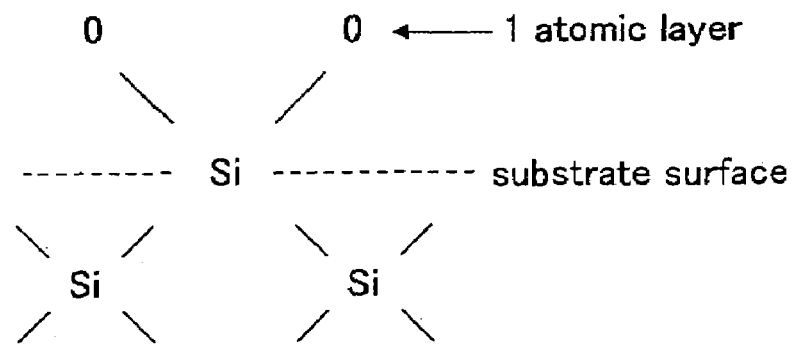
FIGS. 17A and 17B are diagrams showing the oxidation of a silicon substrate surface.
Figure 17B:
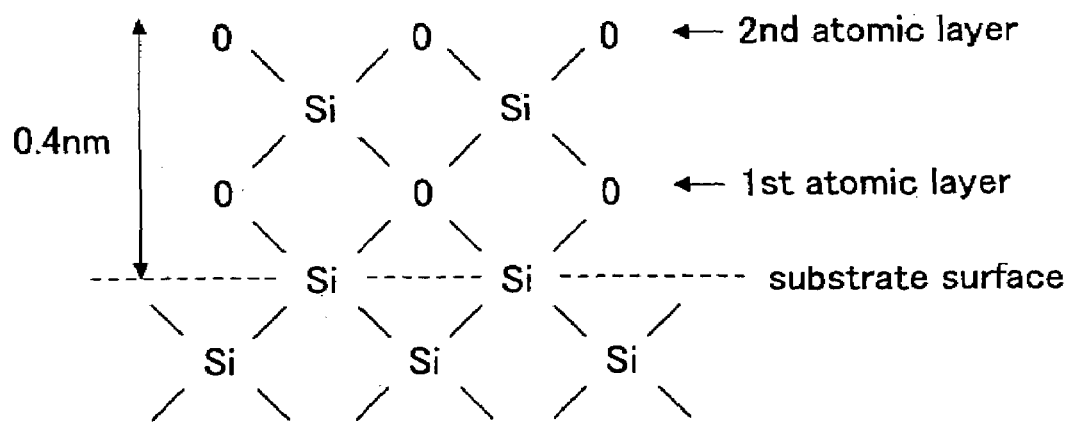

FIGS. 17A and 17B schematically depicts the manner of oxide film formation on such a silicon substrate. In these drawings, it should be noted that the structure formed on a (100) silicon substrate is very much simplified.

Referring to FIG. 17A, it can be seen that two oxygen atoms are bonded to a single silicon atom at the surface of the silicon substrate, and thus, there is formed a single oxygen atomic layer. In this representative state, each silicon atom on the substrate surface are coordinated by two silicon atoms inside the substrate and two oxygen atoms at the substrate surface, and there is formed a sub-oxide.

In the state of FIG. 17B, on the other hand, each silicon atom at the uppermost part of the silicon substrate is coordinated with four oxygen atoms and takes the stable state of $Si^{4+}$. It is believed that this is the reason the oxidation proceeds fast in the state of FIG. 17A and slows down when the state of FIG. 17B has appeared. The thickness of the oxide film for the state of FIG. 17B is about 0.4 nm, while this value is in good agreement with the oxide film thickness observed for the slowdown state in FIG. 13.

In the XPS spectrum of FIG. 15, it should be noted that the weak peak observed in the energy range of 101–104 eV for the case the oxide film thickness is 0.1 or 0.2 nm corresponds to the sub-oxide of FIG. 17A. On the other hand, the peak appearing in this energy range for the case the oxide thickness has exceeded 0.3 nm is thought as being caused by Si4+ and indicating the formation of an oxide film exceeding the thickness of 1 atomic layer.

By continuing the oxidation process further from the state of FIG. 17B, the thickness of the oxide film starts to increase again.

Figure 18:
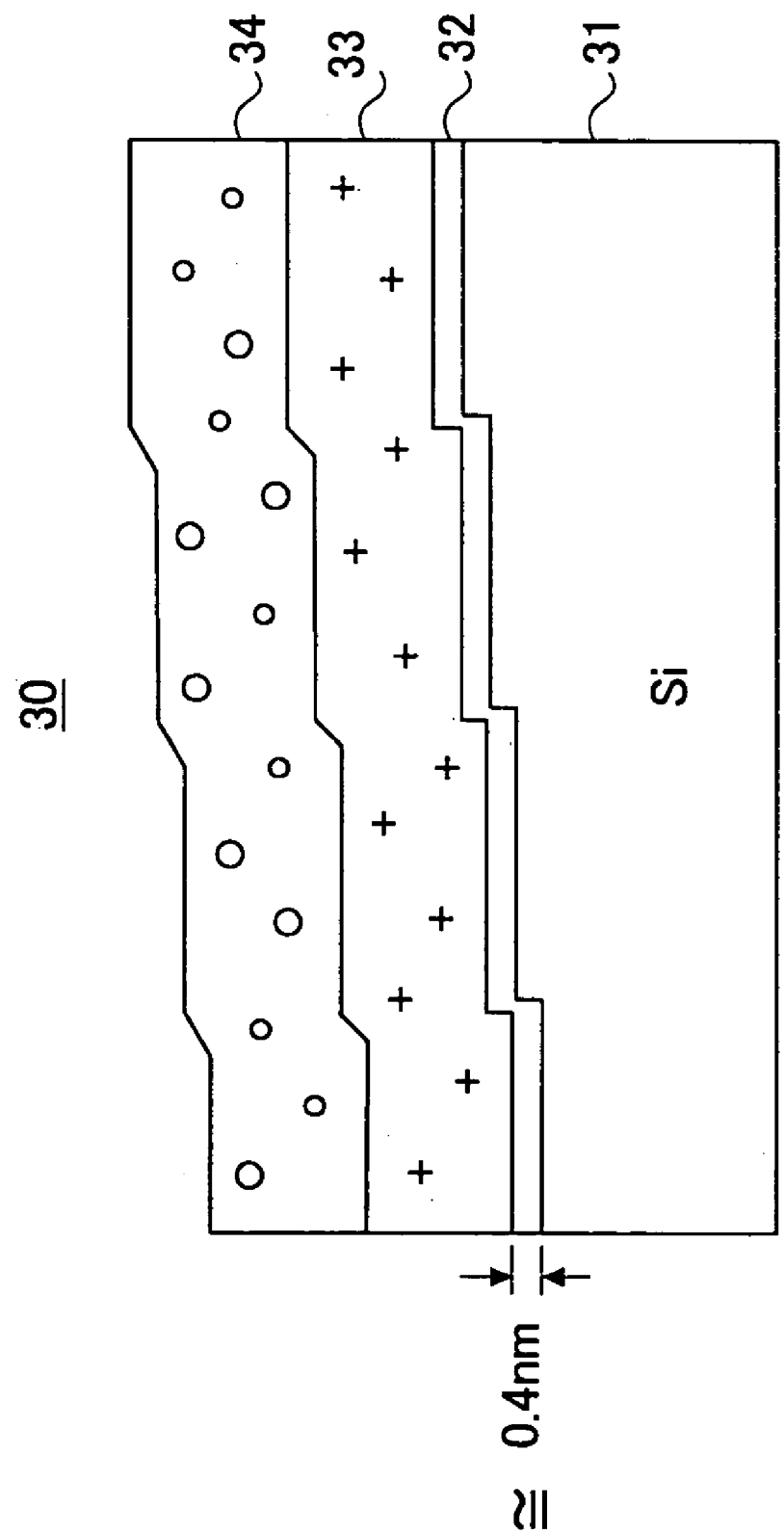
FIG. 18 is a diagram showing a semiconductor structure including an oxide film and a high-K dielectric film and formed on a silicon substrate surface showing the atomic layer steps.

FIG. 18 shows the construction of a semiconductor device 30 formed by the substrate processing step according to the first embodiment of the present invention, wherein those parts of FIG. 18 corresponding to the parts described previously are designated by the same reference numerals and the description thereof will be omitted.

Referring to FIG. 18, the semiconductor device 30 is formed on a silicon substrate 31 planarized to the degree that there appear atomic layer steps on the substrate surface and includes a base oxide film 32 formed on the silicon substrate 31 with a thickness of about 0.4 nm corresponding to the thickness of 2–3 atomic layers, a high-K dielectric film 33 of $ZrSiO_x$, and the like, formed on the base oxide film 32, and a gate electrode 34 of polysilicon, and the like, formed on the high-K dielectric film 33.

Figure 19:
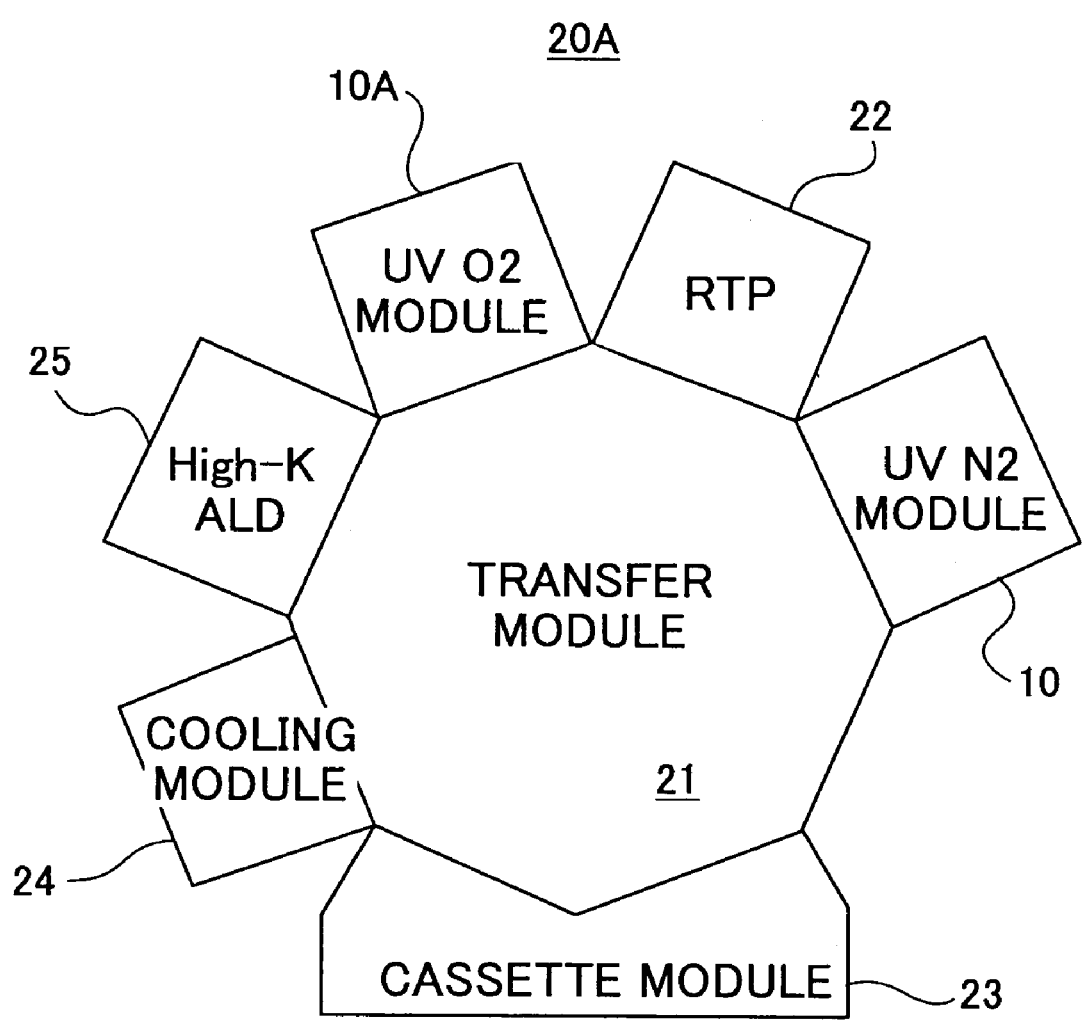
FIG. 19 is a diagram showing the construction of a cluster-type substrate processing used for constructing the semiconductor structure of FIG. 18.

FIG. 19 shows the construction of a substrate processing apparatus 20A of cluster-type used for the fabrication of the semiconductor device 30 of FIG. 18, wherein those parts corresponding to the parts described previously are designated by the same reference numerals and the description thereof will be omitted.

Referring to FIG. 19, the cluster-type substrate processing apparatus 20A includes a vacuum transportation chamber 21 to which a substrate load/unload module 23 is coupled similarly to the cluster-type substrate processing apparatus 20 explained with reference to FIG. 4 and a substrate processing apparatus 10 and a substrate processing apparatus 10A similar in construction to the substrate processing apparatus 10 are coupled to the vacuum transportation chamber 21. Thereby, the substrate processing apparatus 10 is used for conducting the UV-$N_2$ processing explained before while the substrate processing apparatus 10A is used to conduct the UV-$O_2$ processing. Further, a rapid thermal processing chamber 22, a CVD chamber 25 for depositing a high-K dielectric film and a cooling chamber 24 are coupled to the vacuum transportation chamber 21.

The substrate introduced into the substrate loading/unloading module 23 is forwarded to the UV-$N_2$ processing chamber 10 via the vacuum transportation path 21 for the carbon removal processing explained before. The substrate thus processed with the carbon removal process in the UV-N2 processing chamber 10 is then forwarded to the rapid thermal processing chamber 22 for the atomic level planarization processing.

The substrate thus subjected to the anomic-layer level planarization is then forwarded to the UV-$O_2$ processing chamber 10A and a base oxide film similar to the oxide film 32 of FIG. 18 and having a thickness of about 4 nm is formed thereon. Further, the substrate thus formed with the base oxide film is forwarded to the CVD chamber 25 and a high-K dielectric film such as $ZrO_2$, $HfO_2$, $ZrSiO_x$, $HfSiO_x$, $Ta_2O_5$, $Al_2O_3$, and the like, is deposited one atomic layer by one atomic layer by way of atomic layer deposition (ALD) process, for example. The substrate thus processed in the CVD chamber 25 is cooled in the cooling chamber 24 and is returned to the load/unload module 23.

Figure 20:
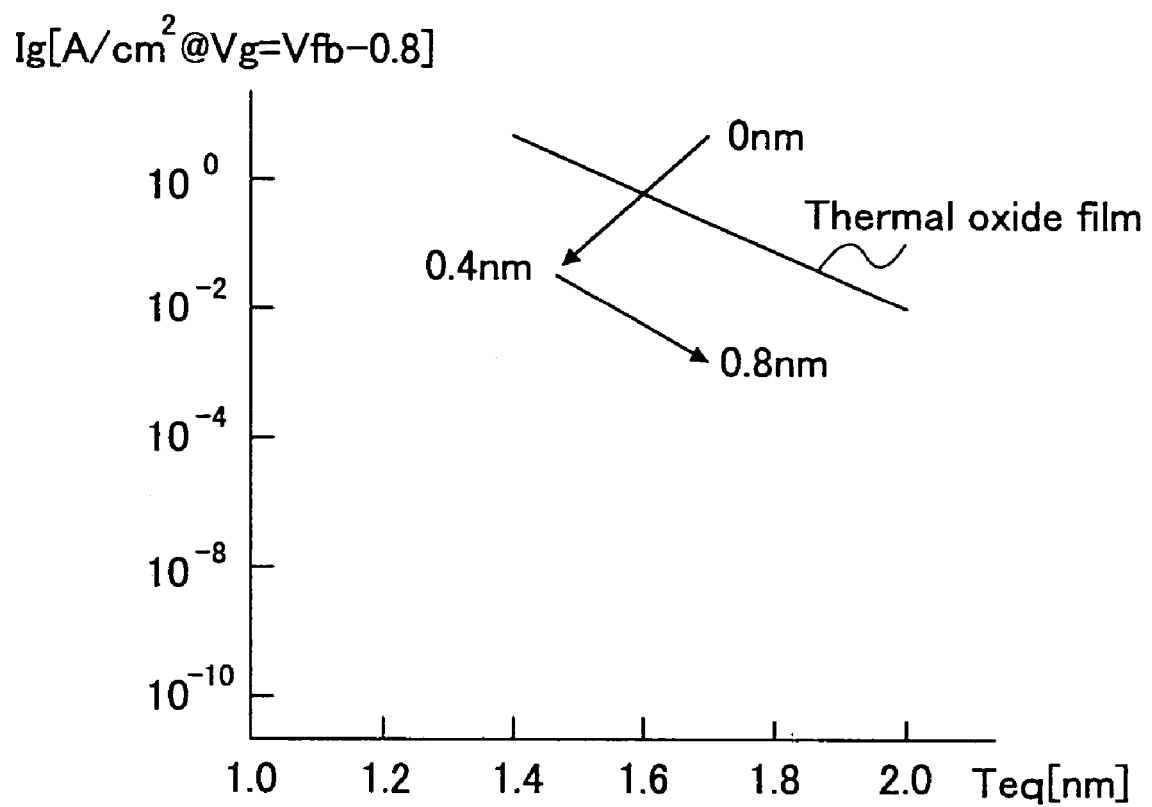
FIG. 20 is a diagram showing the relationship between a leakage current and thermal-oxide-equivalent film thickness in the structure of FIG. 18.

FIG. 20 shows the relationship between a thermal-oxide equivalent thickness $T_{eq}$ and leakage current $I_g$ for a laminated structure in which a $ZrSiO_x$ film is formed on the oxide film 32 of FIG. 18 as the high-K dielectric film and an electrode film is formed further on the high-K dielectric film 34. Here, it should be noted that the leakage current characteristics of FIG. 20 are measured in the state a voltage of $V_{fb}$–0.8V is applied across the electrode film and the silicon substrate, wherein $V_{fb}$ is a flat-band voltage used for the reference. For the sake of comparison, FIG. 20 also shows the leakage current characteristics of a thermal oxide film. Further, the illustrated equivalent thickness is for the structure including both the oxide film and the $ZrSiO_x$ film.

Referring to FIG. 20, it can be seen that the leakage current density exceeds the leakage current density of the thermal oxide film in the case the oxide film is omitted and hence the film thickness of the oxide film is 0 nm. Further, it can be seen that the thermal-oxide film equivalent thickness $T_{eq}$ also takes a large value of about 1.7 nm.

Contrary to this, it can be seen that the thermal-oxide equivalent thickness $T_{eq}$ starts to decrease when the thickness of the oxide film is increased from 0 nm to 0.4 nm. In such a state, the oxide film is interposed between the silicon substrate and the ZrSiOx film, and thus, there should be caused an increase of physical thickness. The observed decrease of the equivalent thickness $T_{eq}$ is therefore contrary to this increase of physical thickness. This observation suggests the situation that, in the case the ZrSiOx film is formed directly on the silicon substrate, there occurs extensive diffusion of Zr into the silicon substrate or Si into the ZrSiOx film, leading to formation of a thick interface layer between the silicon substrate and the ZrSiOx film. By interposing the oxide film 22 of 0.4 nm thickness as represented in FIG. 18, it is believed that the formation of such an interface layer is effectively suppressed and the decrease of the equivalent film thickness is achieved as a result. With this, the leakage current is reduced with increasing thickness of the oxide film.

When the thickness of the oxide film 32 has exceeded 0.4 nm, on the other hand, the value of the thermal-oxide equivalent thickness starts to increase again. In this region in which the thickness of the oxide film 32 has exceeded 0.4 nm, it can be seen that the value of the leakage current is decreased with increase of the thickness, suggesting that the increase of the equivalent thickness is caused as a result of increase of the physical thickness of the oxide film.

Thus, it can be seen that the oxide film thickness of about 0.4 nm, in which there is caused slowdown of oxide film growth as observed in FIG. 13, corresponds to the minimum of the equivalent thickness of the system formed of the oxide film and high-K dielectric film, and that the diffusion of metal element such as Zr into the silicon substrate is effectively blocked by the stable oxide film 32 shown in FIG. 18. Further, it can be seen that the effect of blocking the metal element diffusion is not enhanced significantly even when the thickness of the oxide film is increased further.

It should be noted that the value of the leakage current for the case of using the oxide film of the foregoing 0.4 nm thickness is smaller than the leakage current of a thermal oxide film having a corresponding thickness by the order of two. Thus, by using an insulation film having such a structure for the gate insulation film of a MOS transistor, it becomes possible to minimize the gate leakage current.

Figure 21A:
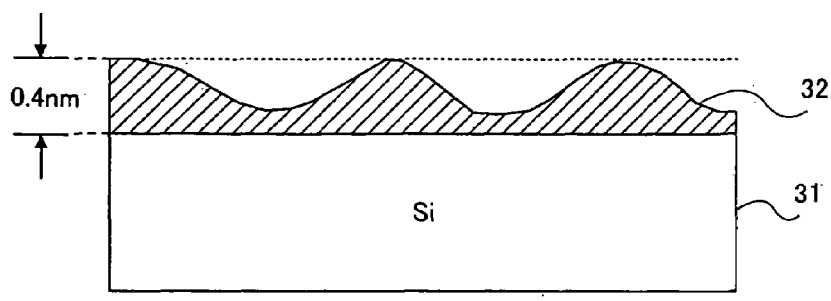
FIGS. 21A–21C are diagrams showing the process of forming an oxide film having a thickness of two atomic layers on a silicon substrate while utilizing the slowdown phenomenon of FIG. 13 or FIG. 16.
Figure 21B:
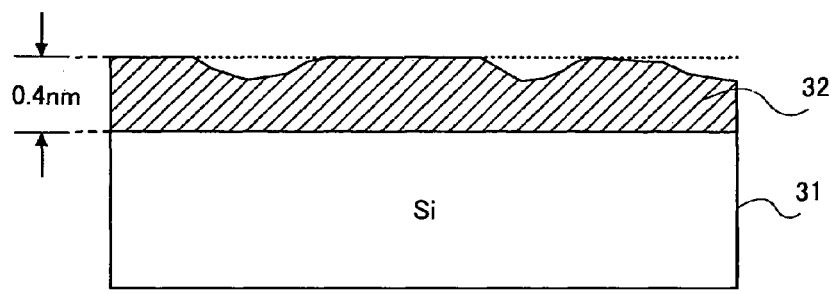
Figure 21C:
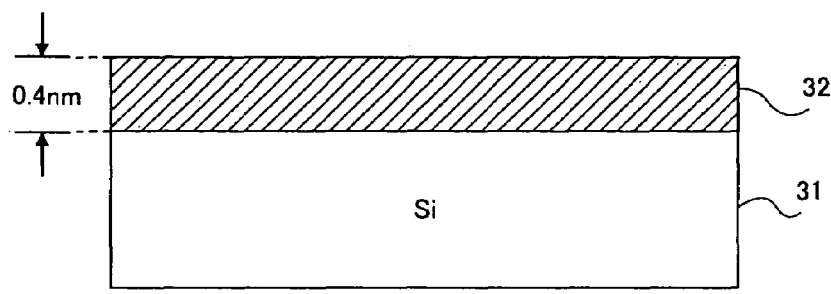

As a result of slowdown of the oxide film growth at the thickness of 0.4 nm explained with reference to FIG. 13 or FIG. 16, there occurs a slowdown of film thickness at the time of oxide film growth at the thickness of about 0.4 nm as represented in FIG. 21B even in the case there exists a change of film thickness or undulation in the initial oxide film 32 formed on the silicon substrate 21 as represented in FIG. 21A. Thus, by continuing the oxide film growth during the slowdown period, it becomes possible to obtain an extremely flat oxide film 32 of uniform film thickness as represented in FIG. 21C. It should be noted that FIGS. 21A–21C show the oxide film growth occurring in each of the terrace surfaces of the silicon substrate 31 of FIG. 18.

As explained before, there is no standard measuring method of film thickness for such an extremely thin oxide film at the moment. Thus, a different value may be obtained for the film thickness of the oxide film 32 of FIG. 21C when a different measuring method is used. However, because of the reason explained before, it is determined that the slowdown of oxide film growth occurs at the thickness of two atomic layers. Thus, it is thought that the preferable thickness of the oxide film 32 is about two atomic layers. It should be noted that this preferable thickness includes also the case in which the oxide film 32 includes a region of 3 atomic layers in a part thereof such that the thickness of two atomic layers is maintained for the entirety of the oxide film 32. Thus, it is concluded that the preferable thickness of the oxide film 32 is in the range of 2–3 atomic layers.

Thus, the silicon oxide film having the thickness of 0.4 nm or 2–3 atomic layers can be formed stably and with excellent reproducibility. By combining such a silicon oxide film with a high-K dielectric film, it becomes possible to realize a highly miniaturized high-speed MOS transistor having a gate insulation film wherein the effective thickness thereof is reduced.

While the embodiment above was explained with reference to the oxide film 32 formed by the UV-$O_2$ radical oxidation process, the oxide film 32 is not limited to such an oxide film but any other oxide film can be used as long as the oxide film is formed by an oxidation process in which the oxidation is conducted with high precision with low radical density.

Figure 22:
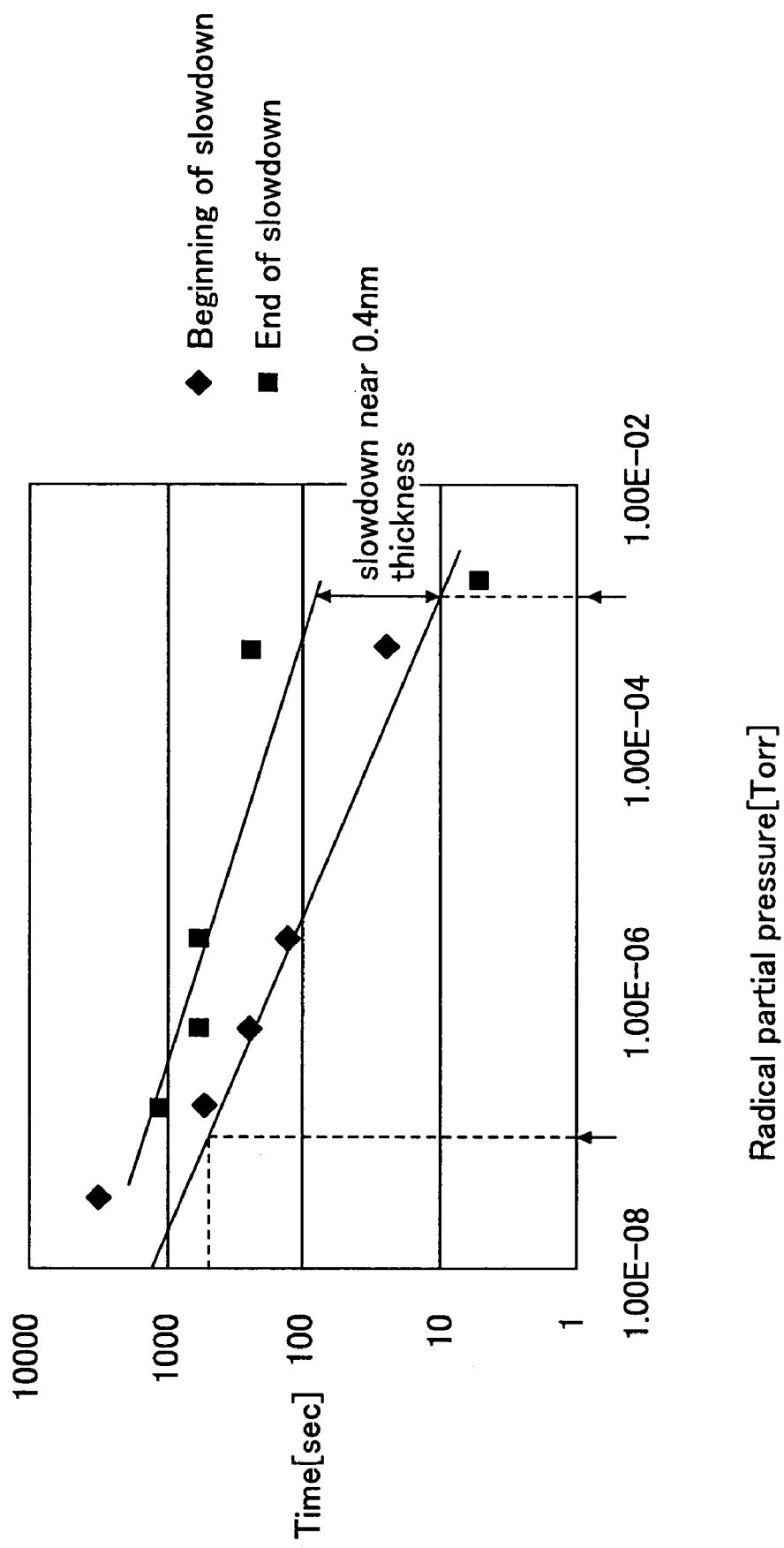
FIG. 22 is a diagram summarizing the process condition for realizing the slowdown phenomenon of FIG. 13 or FIG. 16.

FIG. 22 is a diagram explaining the condition of radical oxidation processing conducted in the UV-$O_2$ processing chamber 10A of FIG. 19.

Referring to FIG. 22, the horizontal axis shows a logarithmic representation of the partial pressure of the oxygen radicals excited by the ultraviolet source in terms of Torr. Further, the vertical axis represents the process time until the slowdown phenomenon shown in FIG. 13 appears after the start of the processing and also the process time until such a slowdown phenomenon vanishes, in terms of logarithmic scale. It should be noted that the oxygen partial pressure on the horizontal axis corresponds to the oxygen radical density and is determined by the driving power or ultraviolet radiation power of the ultraviolet source 324B and the ultraviolet wavelength.

Hereinafter, the relationship between the ultraviolet radiation power and the radical density will be explained for the case of using the wavelength of 172 nm.

In the experiment of FIG. 13, the ultraviolet source produces a photon flux of $4.34 \times 10^{16}/cm^2 \cdot sec$ in the case a ultraviolet source producing the ultraviolet radiation power of 50 mW/$cm^2$ at the location right underneath the window in the state of 100% driving state is used for the ultraviolet source and an oxygen gas is supplied to the substrate surface with a flow rate of 150 SCCM under the process pressure of 0.02 Torr (2.26 Pa). Assuming the case of using a tubular lamp having a width of 2 cm for the optical source 323 and irradiating a silicon wafer of 20 cm diameter with such a lamp, the average photon flux on the silicon wafer surface becomes $4.34 \times 10^{15}$ $cm^{-2}$, which is about 1/10 the photon flux value noted before.

On the other hand, it is known that an oxygen molecule has an absorption cross-sectional area of $6 \times 10^{-19}$ $cm^2$ with regard to the ultraviolet radiation of the 172 nm wavelength. Thus, the transmittance of the ultraviolet radiation in the process ambient, which is given by the equation $I/I_0 = exp(-\sigma nx)$ is obtained as 0.9916. Here, it is assumed that the process pressure is 0.02 Torr (2.66 Pa) and the gas molecule density n in the process ambient is assumed to be $7.05 \times 10^{14}$ $cm^{-3}$. Further, it is assumed that the ultraviolet radiation propagates the distance of 20 cm in the processing vessel.

Thus, the amount of the radicals corresponding to the absorption of the ultraviolet radiation propagating in the processing vessel 321 for the distance of 20 cm is evaluated to be $3.65 \times 10^{13}$ $cm^{-2} \cdot sec$ by multiplying the factor of 0.0084 to the foregoing value of the photon flux of $4.34 \times 10^{15}$ $cm^{-2}$, and oxygen radicals are formed in the processing vessel with this rate.

On the other hand, the flux of the oxygen gas in the processing vessel becomes $7.98 \times 10^{-3}$ $cc/cm^2 \cdot sec$ in terms of volume in the standard state, assuming that the showerhead has the area of 314 $cm^2$. In terms of the number of molecules, this value is converted to the value of $2.138 \times 10^{17}$ $cm^{-2} \cdot sec$. Thus, from the ratio of the flux values of $3.65 \times 10^{13}/2.138 \times 10^{17} = 1.71 \times 10^{-4}$, the partial pressure of the oxygen radicals formed under the process pressure of 0.02 Torr (2.66 Pa) is obtained as $3.42 \times 10^{-6}$ Torr ($=1.71 \times 10^{-4} \times 0.02$).

Thus, it is evaluated that the concentration of the oxygen radicals formed in the processing vessel 321 becomes about $3.42 \times 10-6$ Torr ($4.54 \times 10-4$ Pa) in the case of the optical power of 100% and the process pressure (=internal pressure of the processing vessel) of 0.02 Torr (2.66 Pa). By conducting similar procedures, the radical density is calculated also for other various conditions.

Referring to FIG. 22, it can be seen that the slowdown effect appears immediately after the start of the process similarly to the case of FIG. 13 in the event the radical density in the processing vessel is large. In the case the radical density is small, on the other hand, the slowdown phenomenon appears after a long time has elapsed after start of the process. This corresponds to the situation that the growth rate of the oxide film is large in the case of large radical density and the stationary thickness of 0.4 nm is reached in short time, while in the case the radical density is small, it takes a long time until the foregoing stationary thickness of 0.4 nm is achieved because of the small oxide film growth rate.

Similarly, the slowdown duration defined as the duration after the appearance of the slowdown phenomenon up to the vanishing of the slowdown phenomenon changes also with the radical density such that the slowdown duration is decreased when the radical density is large and is increased when the radical density is small.

From the viewpoint of the actual process of semiconductor device production, there occurs a problem of decrease of fabrication throughput when the process time until the occurrence of the foregoing slowdown effect is too long. Thus, there should be a lower limit for the radical density. On the other hand, when the duration of the slowdown phenomenon is too short, it becomes difficult to form the)oxide film of desired thickness of 2–3 atomic layers. Thus, there is an upper limit for the radical density.

From FIG. 22, which shows the example of conducting the oxidation of the substrate at 450° C. by the radical oxidation process while using the ultraviolet radiation of the 172 nm wavelength, it can be seen that the lower limit of the radical partial pressure is determined to be $1 \times 10^{-4}$ mTorr ($133 \times 10^{-7}$ Pa) assuming that the tolerable process time is 5 minutes (300 seconds) or less. Further, the upper limit of the radical partial pressure is determined to be 1 mTorr ($1.33 \times 10^{-3}$ Pa) assuming that the necessary slowdown interval is 100 seconds or more. The ultraviolet radiation power corresponding to this is determined to be 5–50 mW·cm$^{-2}$ in the region right underneath the optical source 14B.

In FIG. 22, it may seem that the interval between the two lines respectively defining the appearance and vanishing of the slowdown phenomenon is decreased with the radical partial pressure. This, however, is merely an apparent effect caused by the fact that the vertical axis and the horizontal axis of FIG. 22 are represented with logarithmic scale. The duration of the stationary interval is in fact decreased with the radical partial pressure. In the foregoing UV-O$_2$ processing, it is preferable to set the oxygen partial pressure to fall in the range of 6.65×10-3 Pa–133 Pa (0.05–1000 mTorr), more preferably the range of 1.33–13.3 Pa (10–100 mTorr).

It is also possible to conduct the radical oxidation process conducted by using the substrate processing apparatus 320 of FIG. 51 also by using ultraviolet radiation of other wavelengths. In this case, it is necessary to change the drive energy of the ultraviolet source 324B or the ambient gas composition in order to realize the foregoing radical density of $1 \times 10^{-4}$ mTorr ($1.33 \times 10^{-2}$ mPa) or more but not exceeding 1 mTorr (133 mPa).

For example, in the case of using an ultraviolet radiation source of 146 nm wavelength for the ultraviolet source, it is necessary to set the oxygen partial pressure to the range of 0.05–50 mTorr (6.7 mPa–6.7 Pa) in view of the large optical absorption larger by 25 times as compared with the case of the wavelength of 172 nm.

[Third Embodiment]

Nitridation of Oxide Film

Meanwhile, it is advantageous to introduce nitrogen into the base oxide film 3 as noted before in the case the oxide film thus formed with the thickness of 2–3 atomic layers is to be used for the base oxide film 3 of the ultrahigh-speed MOS transistor as represented in FIG. 1. Here, the nitrogen atoms should not enter the silicon substrate. Further, the planarity of the interface between the silicon substrate 2 and the base oxide film 3 should not be degraded.

Hereinafter, the nitridation processing of the oxide film according to a third embodiment of the present invention will be described.

Figure 23:
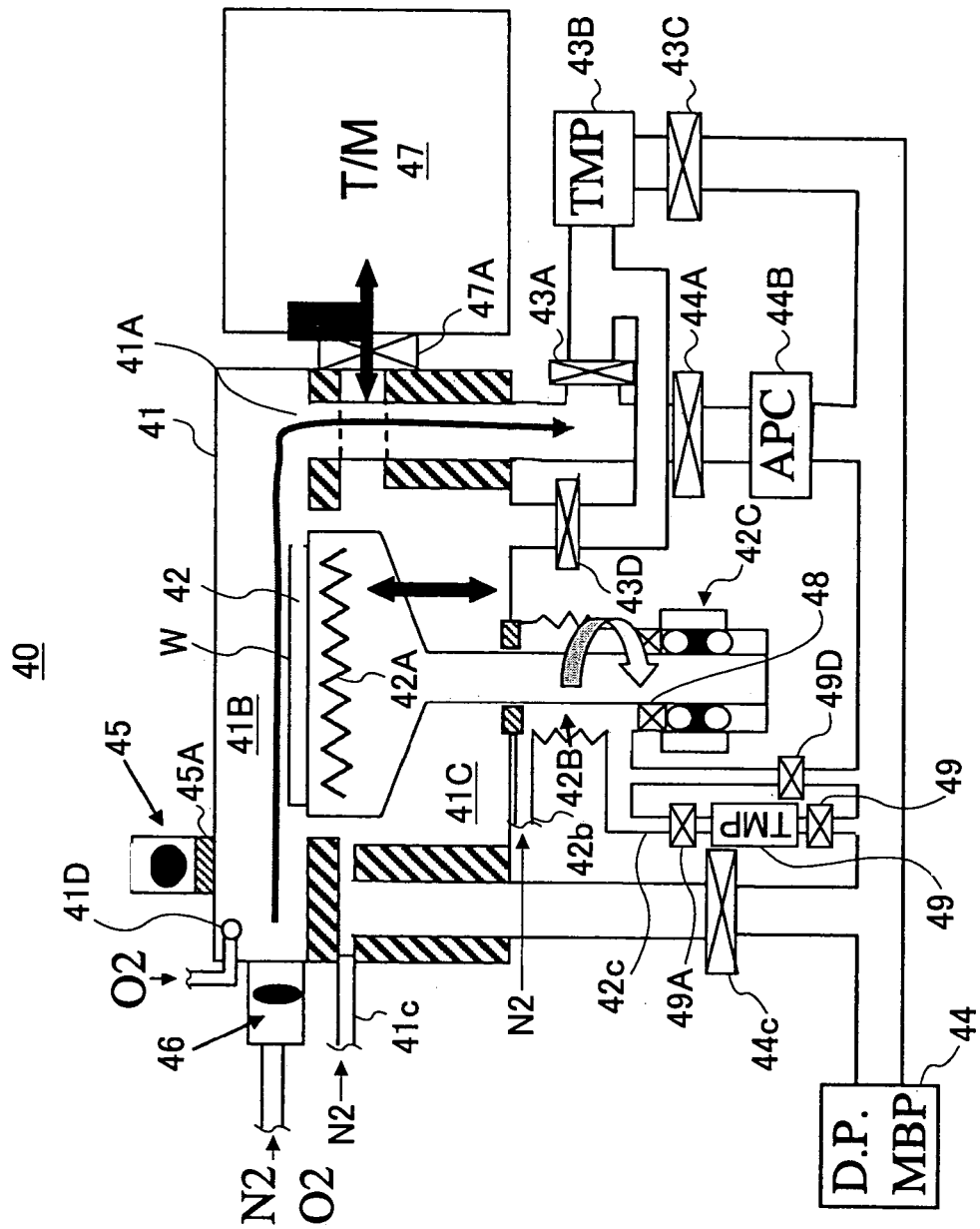
FIG. 23 is a diagram showing the construction of a substrate processing apparatus according to a third embodiment of the present invention.

FIG. 23 shows the general construction of a substrate processing apparatus 40 according to the third embodiment of the present invention for forming the extremely thin base oxide film 3 on the silicon substrate 2 together with the oxynitride film 3A.

Referring to FIG. 23, the substrate processing apparatus 40 includes a processing vessel 41 accommodating therein a stage 42 equipped with a heater 42A such that the stage 42 is movable vertically between a process position and a substrate load/unload position. The stage 42 is rotated by a drive mechanism 42C, and the processing vessel 41 defines a process space 41B therein together with the stage 42. Further, there is provided a magnetic seal 48 at the connecting part of the stage 42 and the drive mechanism 42C such that the magnetic seal 48 separates a magnetic seal chamber 42B held in a vacuum environment from the drive mechanism 42C formed in the atomic environment. Because the magnetic seal 48 is a liquid, the stage 42 is held so as to be able to rotate freely.

In the illustrated state, the stage 42 is held at the process position and there is formed a load/unload chamber 41C underneath the stage 42 for loading and unloading the substrate. The processing vessel 41 is connected to a substrate transfer unit 47 via a gate valve 47A, and thus, the substrate W is transported to the stage 42 from the substrate transfer unit 47 via the gate valve 47A in the state that stage 42 has been lowered to the load/unload chamber 41C. Further, the processed substrate W is transferred to the substrate transfer unit 47 from the stage 42.

In the substrate processing apparatus 40 of FIG. 23, there is formed an evacuation port near the gate valve 47A of the processing vessel 41, and a turbo molecular pump 43B is connected to the evacuation port 41A via the valve 43A. The turbo molecular pump 43B is further connected to a pump 44 formed of a dry pump and a mechanical booster pump via a valve 43C, and the pressure inside the process space 41B can be reduced to the level of $1.33 \times 10^{-1} – 1.33 \times 10^{-4}$ Pa ($10^{-3} – 10^{-6}$ Torr) by driving the turbo molecular pump 43B and the dry pump 44.

It should be noted that the evacuation port 41A is connected also to the pump 44 directly via a valve 44A and an APC 44B, and thus, the pressure of the process space is reduced to the level of 1.33 Pa–1.33 kPa (0.01–100 Torr) by the pump 44 when the valve 44A is opened.

The processing vessel 41 is provided with a process gas supplying nozzle 41D at the side opposite to the evacuation port 41A across the substrate W, and an oxygen gas is supplied to the process gas supplying nozzle 41D. The oxygen gas thus supplied to the process gas supplying nozzle 41D is caused to flow in the process space 41B along the surface of the substrate W and is evacuated from the evacuation port 41A. In order to activate the process gas thus supplied from the process gas supplying nozzle 41D and to form oxygen radicals, the substrate processing apparatus 40 of FIG. 23 is provided with an ultraviolet optical source 45 having a quartz window 45A on the processing vessel 21 in correspondence to the region located between the process gas supplying nozzle 41D and the substrate W. Thus, by driving the ultraviolet source 45, the oxygen gas introduced in to the process space 41B from the process gas supplying nozzle 41D is activated, there are formed oxygen radicals and the oxygen radicals thus formed are caused to flow along the surface of the substrate W. As a result, it becomes possible to form a radical oxide film on the surface of the substrate W with a thickness of 1 nm or less, particularly with the thickness of about 0.4 nm, which corresponds to the thickness of 2–3 atomic layers.

Further, the processing vessel 41 is provided with a remote plasma source 46 at the side thereof opposite to the evacuation port 41A with respect to the substrate W. Thus, nitrogen radicals are formed by supplying a nitrogen gas to the remote plasma source 46 together with an inert gas such as Ar and by activating the nitrogen gas thus supplied with plasma. The nitrogen radicals thus formed are caused to flow along the surface of the substrate W and causes nitridation of the substrate surface. By introducing oxygen into the remote plasma source 46 in place of nitrogen, it is also possible to oxidize the substrate surface.

In the substrate processing apparatus 40 of FIG. 23, there is provided a purge gas line 41c for purging the load/unload chamber 41C with a nitrogen gas. Further, there is provided a purge line 42b for purging the magnetic seal chamber 42B with a nitrogen gas and an evaluation line 42c of the purge gas. In more detail, the evacuation line 42c is connected to a turbo molecular pump 49B via a valve 49A, and the turbo molecular pump 49B is connected to the pump 44 via a valve 49C. Further, the evacuation line 42c is connected directly to the pump 44 via a valve 49D. With this, it becomes possible to maintain the magnetic seal chamber 42B at various pressures.

The load/unload chamber 41C is evacuated by the pump 44 via the valve 44C or by the turbo molecular pump 43B via the valve 43D. Further, in order to avoid contamination in the process space 41B, the load/unload chamber 41C is held at a lower pressure than the process space 41B, and the magnetic seal chamber 41B is held at a further lower pressure than the load/unload chamber 41C by a conducting differential evacuation process.

Hereinafter, the ultraviolet radical oxidation process and the remote plasma radical nitridation process conducted subsequently to the radical oxidation process on the surface of the substrate W by using the substrate processing apparatus 40 of FIG. 23 will be explained.

Ultraviolet Radical Oxidation Processing

Figure 24A:
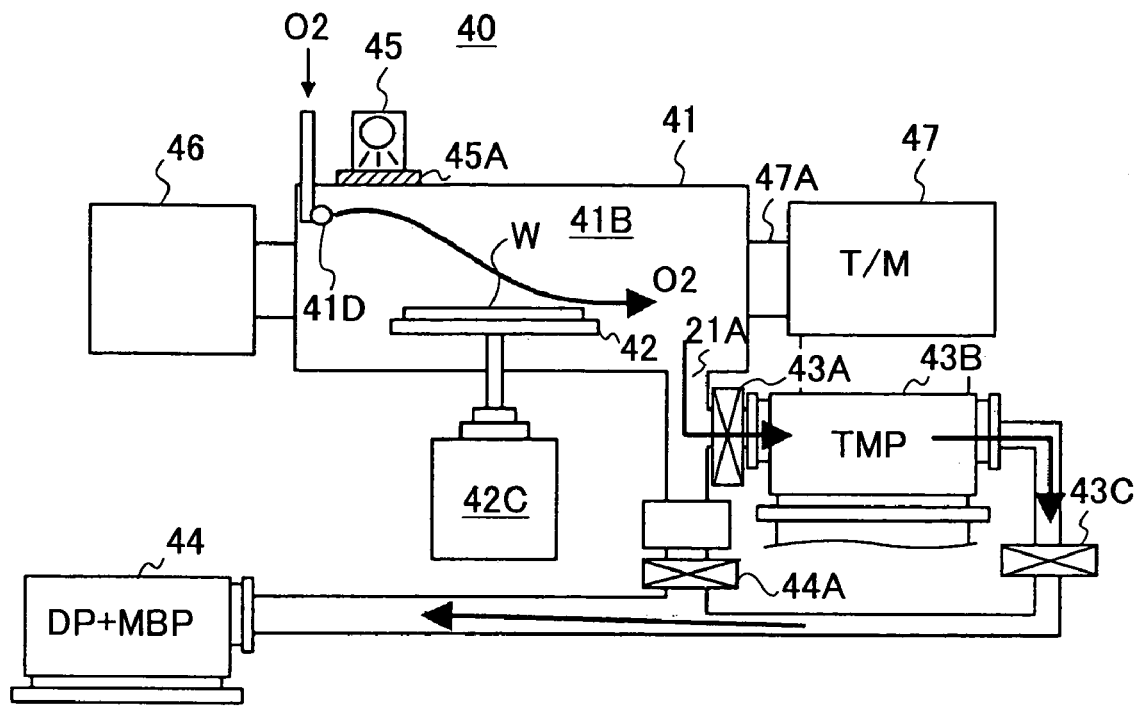
FIGS. 24A and 24B are diagrams showing a UV-$O_2$ processing conducted by using the substrate processing apparatus of FIG. 23.
Figure 24B:
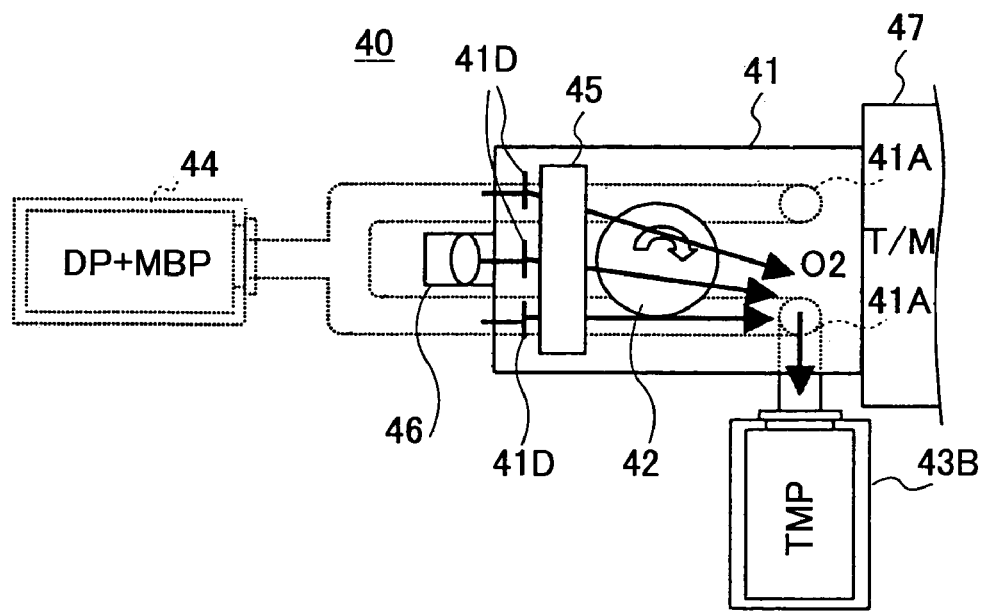

FIGS. 24A and 24B are diagrams showing the radical oxidation process of the substrate W by using the substrate processing apparatus 40 of FIG. 23 respectively in a side view and a plan view.

Referring to FIG. 24A, a silicon substrate applied with the carbon removal processing and planarization processing explained with reference to the previous embodiment is introduced into the processing vessel 41 as a substrate W to be processed, and an oxygen gas is supplied to the process space 41B from the process gas supplying nozzle 41D.

Oxygen thus supplied is evacuated, after flowing along the surface of the substrate W., via the evacuation port 41A, turbo molecular pump 43B and the pump 44. By using the turbo molecular pump 43B, the process pressure in the process space 41B is set to the level of $1 \times 10^{-3}$–$10^{-6}$ Torr, which is needed for the oxidation of the substrate by oxygen radicals. Simultaneously to this, the ultraviolet source 45, preferably the one that produces ultraviolet radiation of 172 nm wavelength, is activated, and oxygen radicals are formed in the oxygen gas flow thus formed. The oxygen radicals thus formed cause oxidation of the substrate surface as they are caused to flow along the rotating substrate W. Thus, as a result of the oxidation of the substrate W by the ultraviolet-activated oxygen radicals (referred to hereinafter as UV-$O_2$ processing), a very thin oxide film having a thickness of 1 nm or less, particularly the thickness of about 0.4 nm corresponding to the thickness of 2–3 atomic layers, is formed on a surface of a silicon substrate stably and with excellent reproducibility.

FIG. 24B shows the construction of FIG. 24A in a plan view.

Referring to FIG. 24B, it can be seen that the ultraviolet source 45 is a tubular light source extending in the direction crossing the direction of the oxygen gas flow. Further, it can be seen that the turbo molecular pump 23B evacuates the process space 41B via the evacuation port 41A. Further, it should be noted that the evacuation path, designated in FIG. 24B by a dotted line and extending directly from the evacuation port 41A to the pump 44, is closed by closing the valve 44A.

As can be seen from the plan view of FIG. 24B, the turbo molecular pump 23B is provided in an arrangement so as to extend laterally from the processing vessel. Thereby, the turbo molecular pump 43B successfully avoids the substrate transfer unit 47.

As a result of the substrate processing of FIGS. 24A and 24B, a very thin silicon oxide film is formed on the surface of the silicon substrate W in correspondence to each of the terraces shown in FIG. 18. At the time of growth of such a silicon oxide film, there appears the slowdown phenomenon explained previously with reference to FIG. 13 or FIG. 16, and thus, it becomes possible to set the thickness of the oxide film to the thickness of about 0.4 nm corresponding to 2–3 atomic layers by utilizing such a slowdown phenomenon as explained before.

Remote Plasma Radical Nitridation Processing

FIG. 25 shows the construction of a remote plasma source 46 used in the substrate processing apparatus 40 of FIG. 23.

Referring to FIG. 25, the remote plasma source 46 includes a block 46A typically formed of aluminum in which a gas circulating passage 46a is formed together with a gas inlet 46b and a gas outlet 46c communicating therewith. Further, there is formed a ferrite core 46B on a part of the block 46A.

Further, there is provided a fluorocarbon resin coating 46d on the inner surfaces of the gas circulating passage 46a, gas inlet 46b and the gas outlet 46c, and plasma 46C is formed in the gas circulating passage 46a by supplying a high-frequency power of 400 kHz frequency to the coil wound around the ferrite core 46B.

With the excitation of the plasma 46C, nitrogen radicals and also nitrogen ions are formed in the gas circulating passage 46a, wherein the nitrogen ions are annihilated as they are circulated along the circulating passage 46a and the gas outlet 46c ejects nitrogen radicals $N_2^*$ primarily. In the construction of FIG. 25, charged particles such as nitrogen ions are eliminated in the construction of FIG. 25 by providing an ion filter 46e at the gas outlet 46c in the state that the ion filter 46e is connected to the ground. Thereby, only the nitrogen radicals are supplied to the process space 41B.

Figure 26:
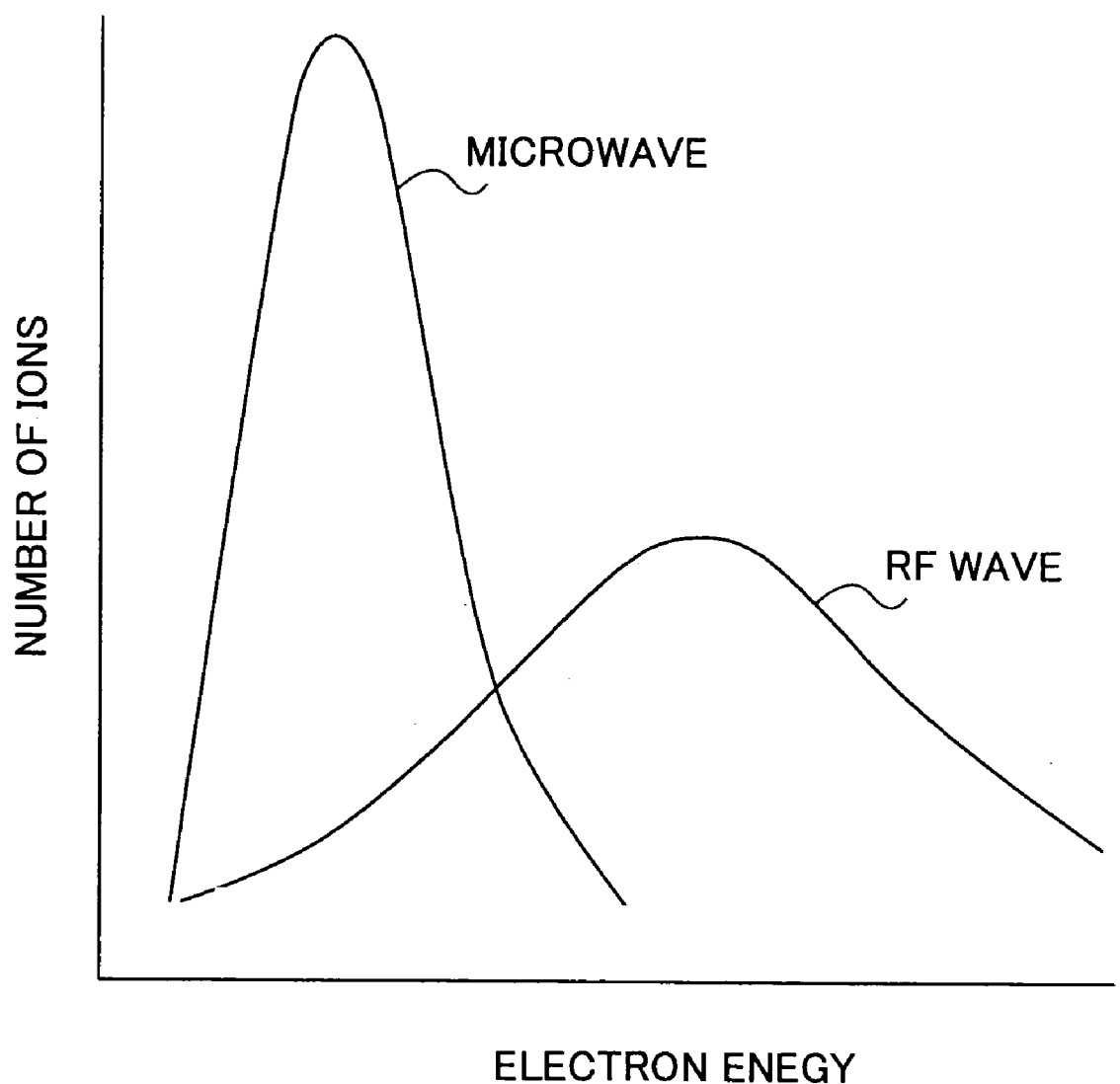
FIG. 26 is another diagram comparing RF remote plasma and microwave plasma.
Figure 27:
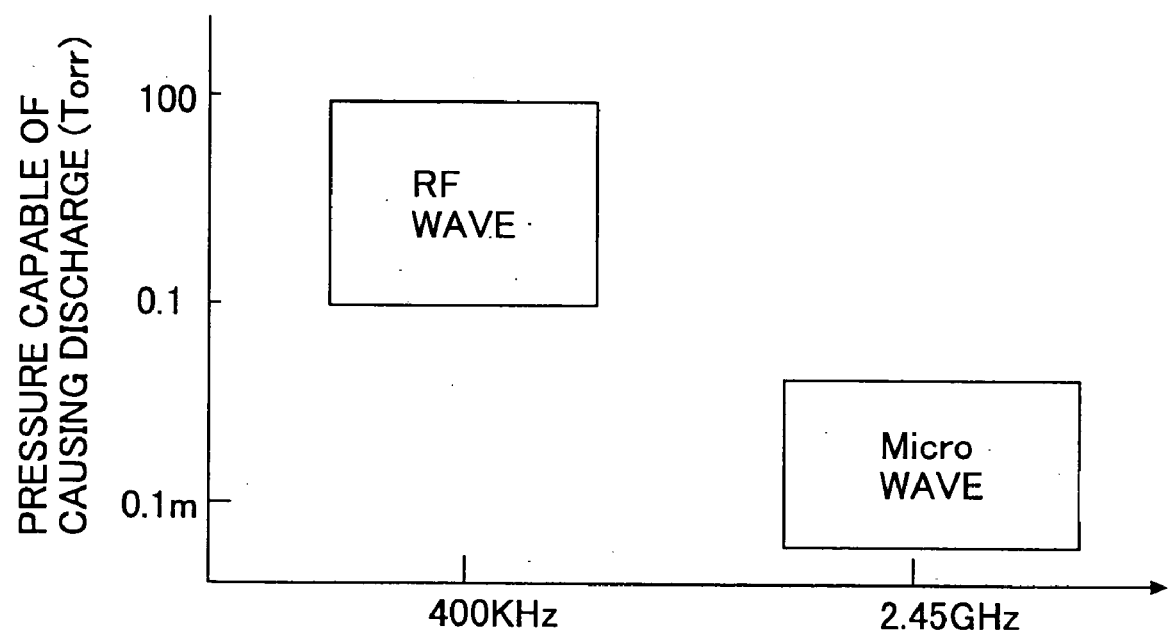
FIG. 27 is another diagram comparing RF remote plasma and microwave plasma.

FIG. 26 shows the relationship between the number of ions and the electron energy formed by the remote plasma source 46 of FIG. 25 in comparison with the case of using a microwave plasma source.

Referring to FIG. 26, ionization of nitrogen molecules is facilitated in the case the plasma is excited by a microwave power, and as a result, there are formed a very large amount of nitrogen ions. In the case the plasma is excited by a high-frequency power of 500 kHz or less in the frequency, on the other hand, the number of the nitrogen ions formed by the plasma is reduced significantly. In the case of conducting a microwave plasma processing, a high vacuum environment of $1.33 \times 10^{-3}$–$1.33 \times 10^{-6}$ Pa ($10^{-1}$–$10^{-4}$ Torr) is needed, while in the case of a high-frequency plasma process, the process can be conducted at a relatively high pressure of 13.3–13.3 kPa (0.1–100 Torr).

Table 2 below compares the ionization energy conversion efficiency, pressure range capable of causing electric discharge, plasma power consumption and process gas flow rate between the case of exciting plasma by a microwave and the case of exciting plasma by a high-frequency power.

TABLE 2

|  | ionization energy conversion efficiency | pressure range electric discharge | plasma power consumption | process gas flow rate |
|---|---|---|---|---|
| microwave | $1.00 \times 10^{-2}$ | 0.1 m–0.1 Torr | 1–500 W | 0–100 SCCM |
| RF-wave | $1.00 \times 10^{-7}$ | 0.1–100 Torr | 1–10 kW | 0.1–10 SLM |

Referring to Table 2, it can be seen that the ionization energy conversion efficiency is reduced to about $1 \times 10^{-7}$ in the case of the RF-excited plasma as compared with respect to the value of about $1 \times 10^{-2}$ for the case of the microwave-excited plasma. Further, it can be seen that the pressure range causing the electric discharge is about 0.1–100 Torr (13.3 Pa–13.3 kPa) for the case of the RF-excited plasma, while in the case of the microwave-excited plasma, the pressure range is about 0.1 mTorr–0.1 Torr (133 mPa–13.3 Pa). Associated with this, the plasma power consumption is increased in the case of the RF-excited plasma as compared with the case of the microwave-excited plasma and that the process gas flow rate for the case of the RF-plasma processing becomes much larger than the process gas flow rate for the case of the microwave plasma.

In the substrate processing apparatus of FIG. 23, it should be noted that the nitridation processing of the oxide film is conducted not by nitrogen ions but by the nitrogen radicals $N_2^*$. Thus, it is preferable that the number of the excited nitrogen ions is suppresses as small as possible. This is also preferable in the viewpoint of minimizing damages caused in the substrate. In the substrate processing apparatus of FIG. 23, the number of the excited nitrogen radicals is small and is highly suitable for nitriding the extremely thin base oxide film formed underneath the high-K dielectric gate insulation film with the thickness of only 2–3 atomic layers.

Figure 28A:
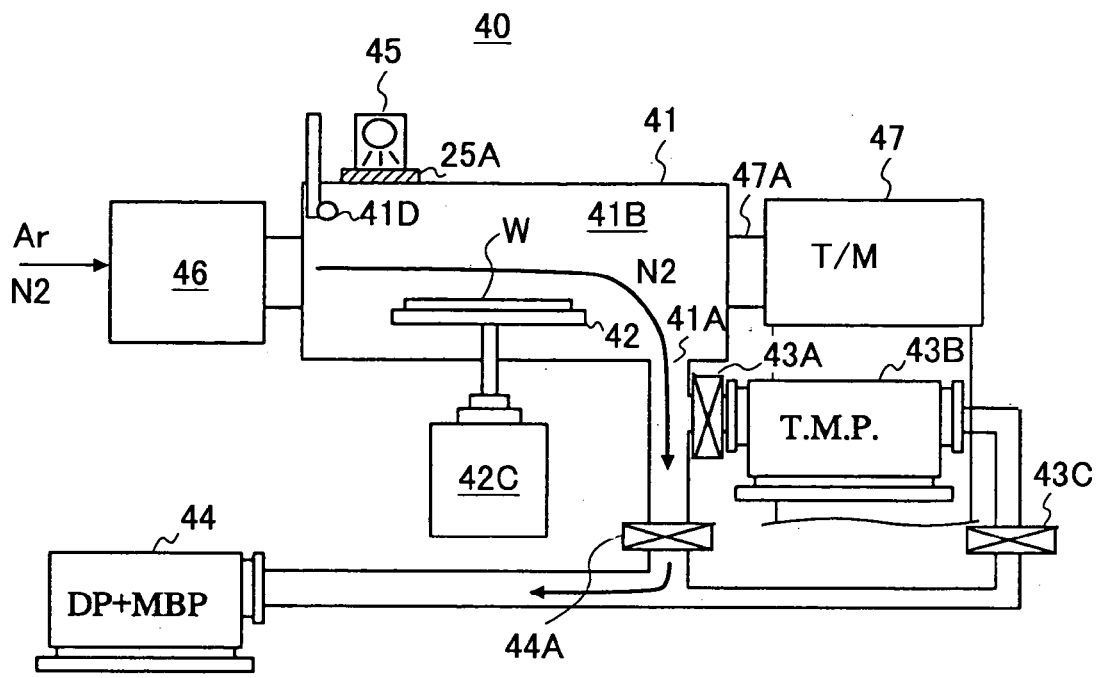
FIGS. 28A and 28B are diagrams showing the radical nitridation process conducted by the substrate processing apparatus of FIG. 23.
Figure 28B:
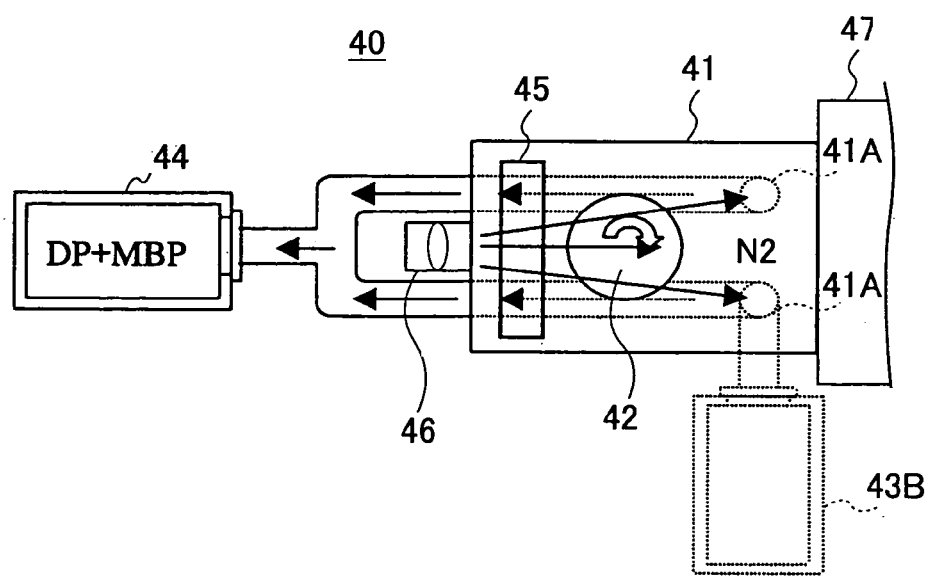

FIGS. 28A and 28B show the radical nitridation processing conducted by the substrate processing apparatus 40 of FIG. 23 respectively in a side view and a plan view.

Referring to FIGS. 28A and 28B, the remote plasma radical source 46 is supplied with an Ar gas and a nitrogen gas and nitrogen radicals are formed as a result of excitation of plasma with the high frequency power of several hundred kilohertz frequency. The nitrogen radicals thus formed are caused to flow along the surface of the substrate W and are evacuated via the evacuation port 41A and the pump 44. As a result, the process space 41B is held at a process pressure in the range of 1.33 Pa–1.33 kPa (0.01–10 Torr) suitable for the radical nitridation of the substrate W. The nitrogen radicals thus formed cause nitridation in the surface of the substrate W as they are caused to flow along the surface of the substrate W.

In the nitridation process of FIGS. 28A and 28B, it should be noted that there is conducted a purging process in advance to the nitridation process by opening the valves 43A and 43C and closing the valve 44A. Thereby, the pressure in the process space 41B is reduced to the level of $1.33 \times 10^{-1} – 1.33 \times 10^{-4}$ Pa, and any residual oxygen or water in the process space is purged in the nitridation processing that follows, on the other hand, the valves 43A and 43C are closed, and thus, the turbo molecular pump 43B is not included in the evacuation path of the process space 41B.

Thus, by using the substrate processing apparatus 40 of FIG. 23, it becomes possible to form an extremely thin oxide film on the surface of the substrate W and further nitriding the surface of the oxide film thus formed.

Figure 29A:
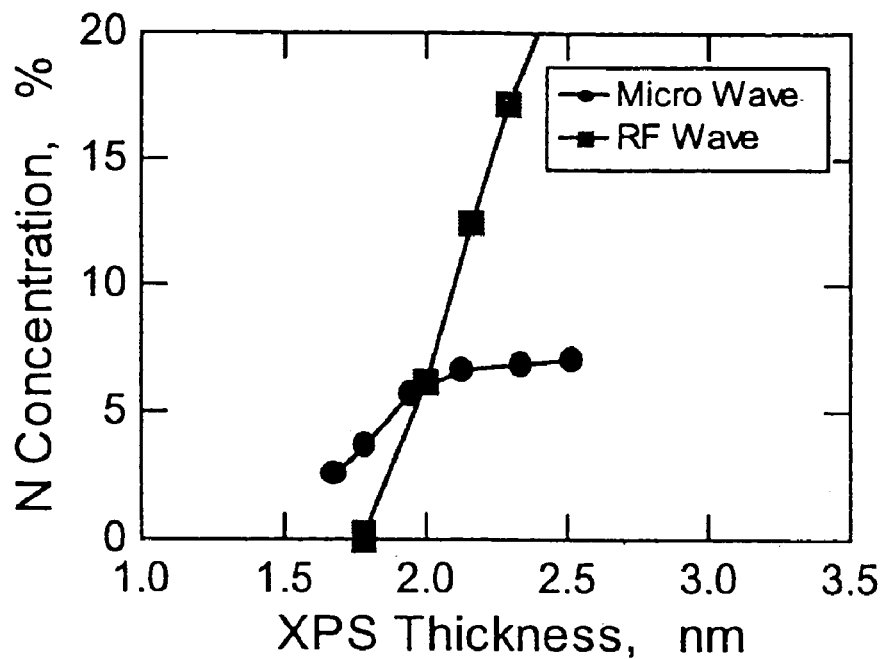
FIGS. 29A and 29B are diagrams showing the relationship between the nitrogen concentration and film thickness for an oxynitride film nitrided by using the RF remote plasma and an oxynitride film nitrided by using the microwave plasma.
Figure 29B:
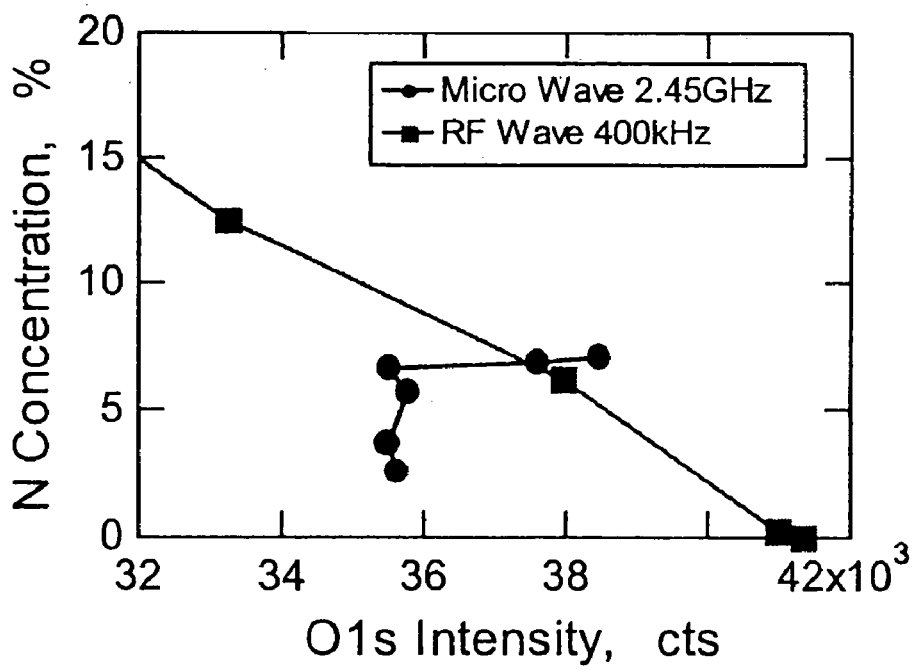

FIG. 29A shows the nitrogen concentration profile in an oxide film for the case the oxide film formed on a silicon substrate by a thermal oxidation process with a thickness of 2.5 nm is subjected to an RF-$N_2$ processing in the substrate processing apparatus 40 of FIG. 23 by using the RF remote plasma source 46 of FIG. 25 under the condition represented in Table 3. Further, FIG. 29B shows the relationship between the nitrogen concentration profile and the oxygen concentration profile in the same oxide film.

TABLE 3

|  | nitrogen flow rate | Ar flow rate | plasma power | pressure | temperature |
|---|---|---|---|---|---|
| microwave | 15 SCCM | — | 120 W | 8.6 mTorr | 500° C. |
| RF wave | 50 SCCM | 2 SLM | 2 kW | 1 Torr | 700° C. |

Referring to Table 3, the RF-$N_2$ processing is conducted in the substrate processing apparatus 40 under the pressure of 1 Torr (133 Pa) while supplying nitrogen with a flow rate of 50 SCCM and Ar with a flow rate of 2 SLM, wherein it should be noted that the internal pressure of the process space 41B is reduced once to the level of about $10^{-6}$ Torr ($1.33 \times 10^{-4}$ Pa) before the commencement of the nitridation process such that oxygen or water remaining in the process space 41B is purged sufficiently. Because of this, any residual oxygen in the process space 41B is diluted with Ar or nitrogen in the nitridation process (RF-$N_2$ process), which is conducted at the pressure of about 1 Torr. Thereby, the concentration of residual oxygen, and hence the thermodynamic activity of the residual oxygen, is very small at the time of the foregoing nitridation processing.

In the case of the nitridation processing conducted by the microwave plasma, on the other hand, the process pressure at the time of the nitridation process is generally the same as the purging pressure, and thus, residual oxygen maintains a large thermodynamic activity in the plasma ambient.

Referring to FIG. 29A, it can be seen that the concentration of nitrogen incorporated into the oxide film is limited in the case the nitridation processing is conducted by the microwave plasma and that no substantial nitridation takes place in the oxide film. In the case of the nitridation processing that uses the RF-excited plasma as in the case of the present embodiment, it can be seen that the nitrogen concentration level changes linearly with depth in the oxide film and that a concentration level of near 20% is achieved at the surface part of the oxide film.

FIG. 30 shows the principle of the measurement of FIG. 29A conducted by the XPS (X-ray photo spectrometry) analysis.

Referring to FIG. 30, an X-ray is radiated to the specimen in which the oxide film 3 is formed on the silicon substrate 2 with a predetermined angle, and detectors DET1 and DET2 are used to detect the spectrum of the excited X-rays with various angles. Thereby, it should be noted that the detector DET1 set to a deep detection angle of 90 degrees detects the excited X-ray that has traveled through the oxide film 12 with minimum path length. Thus, the X-ray spectrum detected by the detector DET1 contains information about the deep part of the oxide film 3 with relatively large proportion. On the other hand, detector DET2 set to a shallow detection angle detects the X-ray traveled over a long distance in the oxide film 3. Thus, the detector DET2 mainly detects the information about surface part of the oxide film 3.

FIG. 29B shows the relationship between the nitrogen concentration and oxygen concentration in the oxide film. In FIG. 29B, it should be noted that the oxygen concentration is represented by the X-ray intensity corresponding to the $O_{1s}$ orbital.

Referring to FIG. 29B, it can be seen that there occurs decrease of oxygen concentration with increase of nitrogen concentration in the case the nitridation processing is conducted by the RF-$N_2$ processing that uses the RF-remote plasma, indicating that there occurs substitution of oxygen atoms with the nitrogen atoms in the oxide film. In the case the nitridation is conducted by the microwave plasma processing, on the other hand, no such substituting relationship is observed and no relationship of oxygen concentration decreasing with increasing nitrogen concentration is observed. In FIG. 29B, it is also noted that there is an increase of oxygen concentration for the case in which nitrogen is incorporated with 5–6% by the microwave nitridation processing. This indicates that there occurs increase of thickness of the oxide film with nitridation. Such an increase of the oxygen concentration associated with the microwave nitridation processing is believed to be caused as a result of the high activity of oxygen or water remaining in the process space, which in turn is caused as a result of use of high vacuum environment for the nitridation processing and absence of dilution of residual oxygen or water with Ar gas or nitrogen gas, unlike the case of the high-frequency remote radical nitridation processing.

Figure 31:
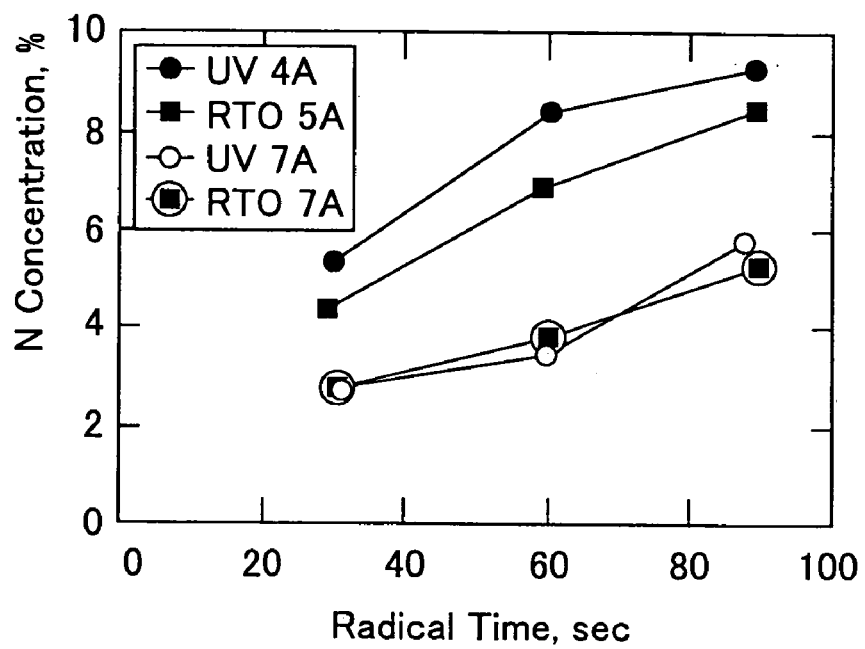
FIG. 31 is a diagram showing the relationship between the nitrogen concentration in the oxynitride film and the duration of the radical nitridation.
Figure 32:
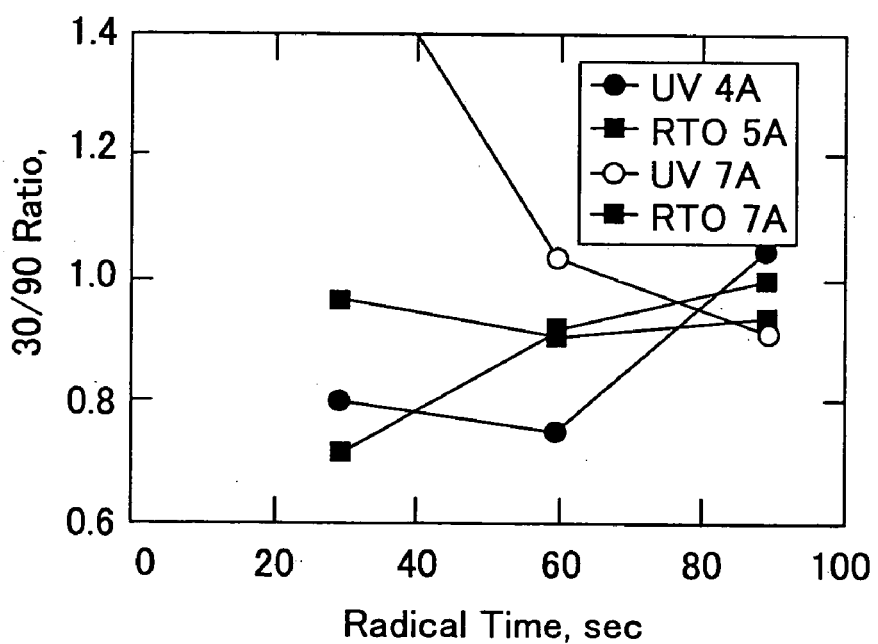
FIG. 32 is a diagram showing the relationship between the thickness distribution of nitrogen in the oxynitride film and the duration of the radical nitridation.
Figure 33:
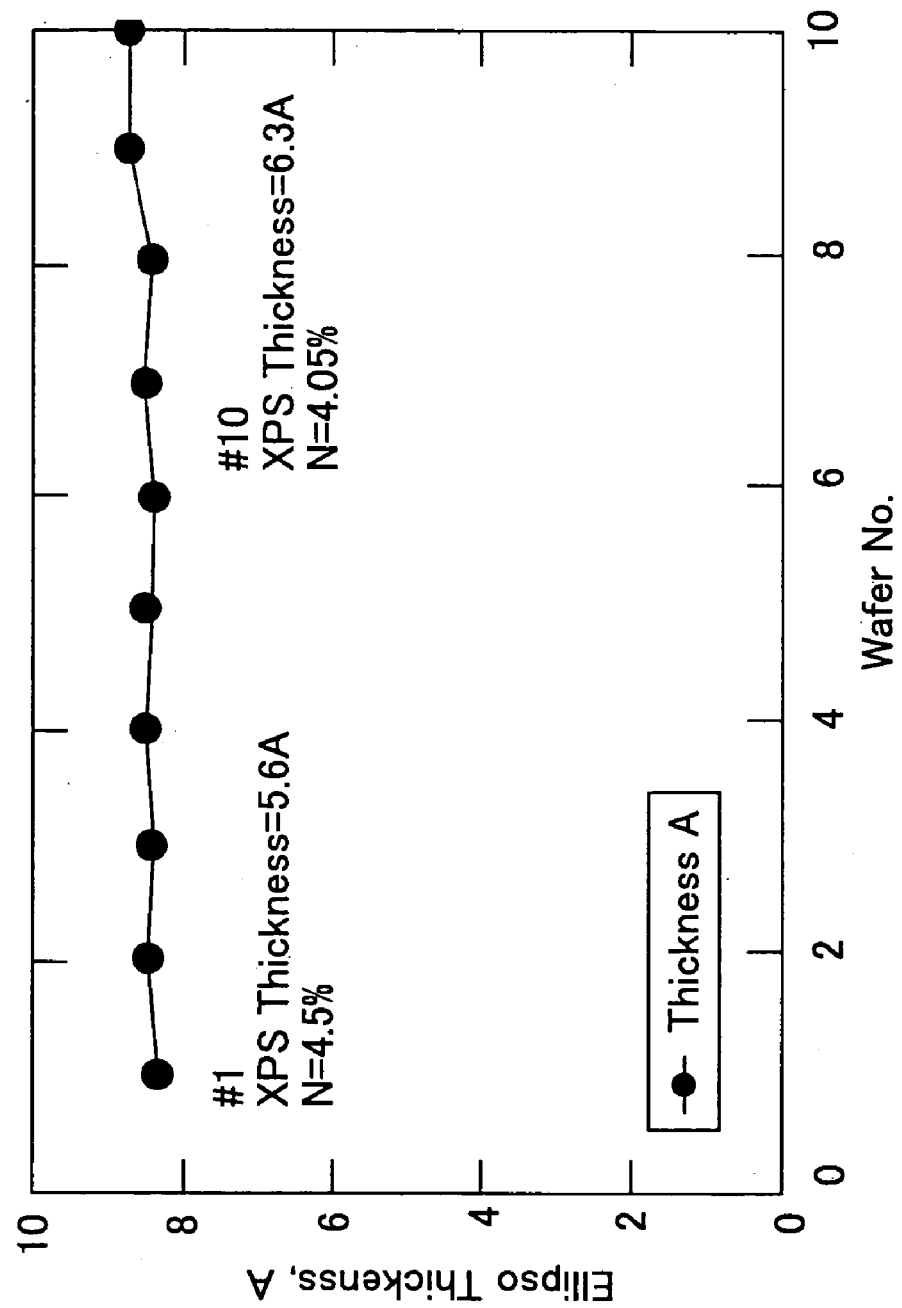
FIG. 33 is a diagram showing the wafer-by-wafer film thickness variation of the oxynitride film formed by the substrate processing apparatus of FIG. 23 and obtained by ellipsometry.

FIG. 31 shows the relationship between the nitridation time and the nitrogen concentration in the film for the case an oxide film is formed by the substrate processing apparatus 40 of FIG. 33 to the thickness of 4 Å (0.4 nm) and 7 Å (0.7 nm) and nitridation is conducted further to the oxide film by the RF-$N_2$ processing of FIGS. 28A and 28B while using the remote plasma source 26. Further, FIG. 32 shows the segregation of nitrogen to the surface of the oxide film caused as a result of the nitridation processing of FIG. 31. It should be noted that FIGS. 31 and 32 also show the case in which the oxide film is formed by a rapid thermal oxidation processing to the thickness of 5 Å (0.5 nm) and 7 Å (0.7 nm).

Referring to FIG. 31, it can be seen that the nitrogen concentration in the film increases with the nitridation time in any of the oxide films, while it is also noted that, because of the small oxide thickness such as 0.4 nm corresponding to the two atomic layer thickness for the case of the oxide film formed by the UV-$O_2$ oxidation processing, or for the case of the thermal oxide film having a thickness of 0.5 nm near the foregoing thickness of 0.4 nm, a higher nitrogen concentration is achieved as compared with oxide films formed at the same condition.

FIG. 32 shows the result of detection of nitrogen concentration for the case the detectors DET1 and DET2 of FIG. 30 are set to 30 degrees and 90 degrees respectively.

As can be seen from FIG. 32, the vertical axis represents the X-ray spectral intensity from the nitrogen atoms segregated to the film surface obtained with the detection angle of 30 degrees divided by the X-ray spectral intensity of the nitrogen atoms distributed throughout the entire film. In the case this value is 1 or more, there is caused segregation of nitrogen to the film surface.

Referring to FIG. 32, it can be seen that there occurs segregation of the nitrogen-atoms to the film surface at first but thereafter the distribution of the nitrogen atoms in the film becomes uniform in the case the oxide film is formed by the UV-$O_2$ processing to the thickness of 7 Å. In other films, too, it can be seen that the distribution of the nitrogen atoms in the film becomes more or less uniform with the nitridation processing for 90 seconds.

In the experiment of FIG. 33, the UV-$O_2$ processing and the RF-$N_2$ processing are applied in the substrate processing apparatus 40 of FIG. 23 repeatedly with respect to ten wafers (wafer #1 –wafer #10). FIG. 33 shows the wafer-to-wafer variation of the film thickness of the oxynitride film thus obtained, wherein the result of FIG. 33 is obtained for the case in which the UV-$O_2$ processing is conducted in the construction of FIG. 23 by driving the ultraviolet source 45 such that an oxide film is formed to have the thickness of 0.4 nm as measured by the XPS analysis and in which the RF-$N_2$ processing is conducted to the oxide film thus formed by driving the remote plasma source 46 such that the oxide film is converted to an oxynitride film containing nitrogen atoms with about 4%.

Referring to FIG. 33, the vertical axis represents the film thickness obtained for the oxynitride film thus obtained by ellipsometry, wherein it can be seen that the film thickness is uniform and has a value of about 8 Å (0.8 nm).

Figure 34:
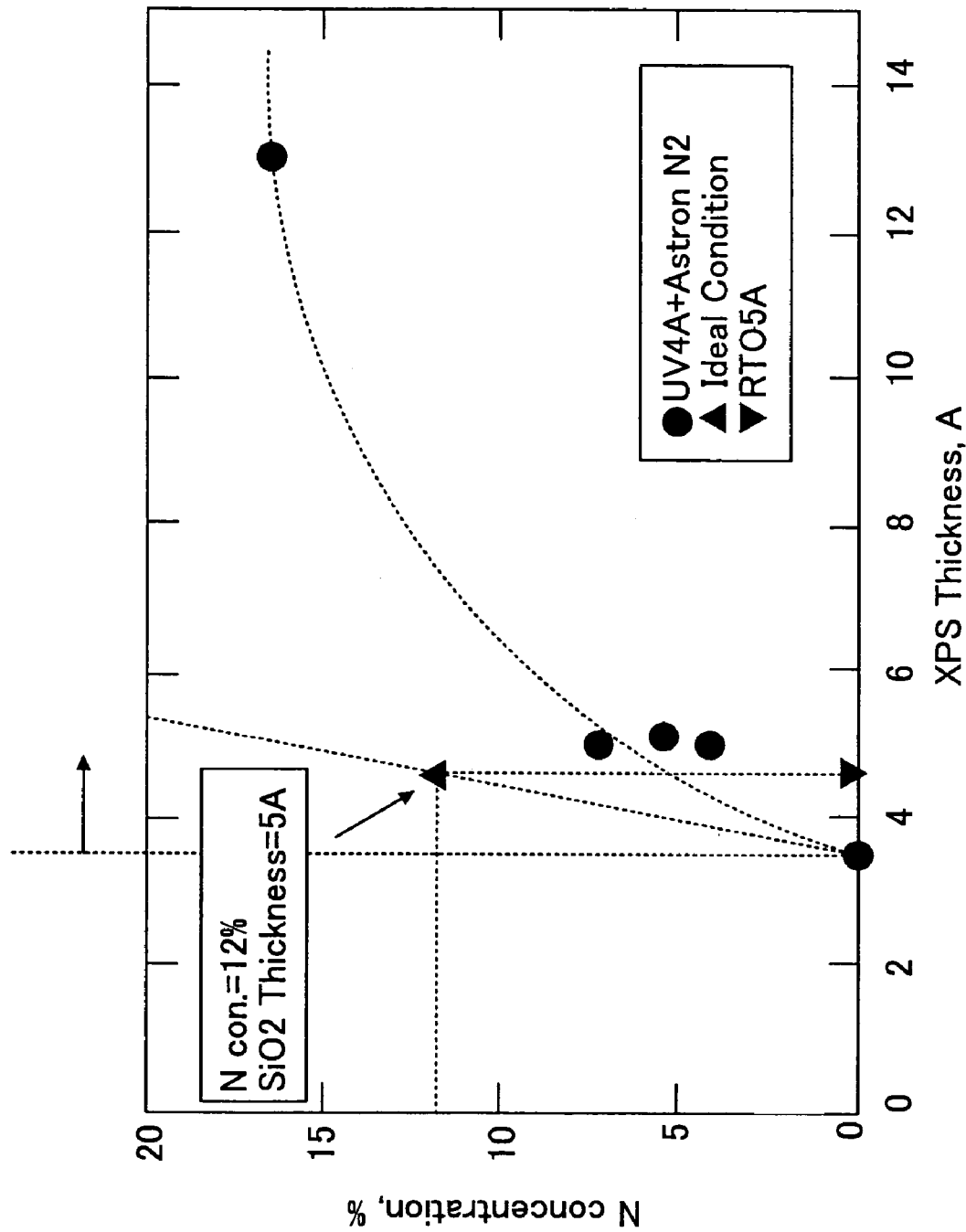
FIG. 34 is a diagram showing the relationship between nitrogen concentration in the oxynitride film and the film thickness obtained by the XPS method.

FIG. 34 shows the result of examination with regard to the increase of film thickness for the case an oxide film is formed on a silicon substrate in the substrate processing apparatus 40 of FIG. 23 with the thickness of 0.4 nm by the UV-$O_2$ processing while using the ultraviolet source 45 and further an RF-$N_2$ processing is applied to the oxide film thus formed while using the remote plasma source 46.

Referring to FIG. 34, it can be seen that the oxide film has increased the thickness thereof from the initial thickness (the thickness in the state before the RF-$N_2$ processing) of 0.38 nm to about 0.5 nm in the state nitrogen atoms are introduced by the RF-$N_2$ processing with the concentration of 4–7%. In the case the nitrogen atoms are introduced to the level of about 15% by the RF-$N_2$ processing, on the other hand, it can be seen that the film thickness increases to about 1.3 nm. In this case, it is believed that the nitrogen atoms thus introduced into the oxide film form a nitride film by causing penetration into the silicon substrate after passing through the oxide film.

In FIG. 34, the relationship between the nitrogen concentration and film thickness is represented also for an ideal model structure in which only one layer of nitrogen atoms are introduced into the oxide film of 0.4 nm thickness by ▲.

Referring to FIG. 34, it can be seen that the film thickness after introduction of the nitrogen atoms becomes about 0.5 nm in this ideal model structure. Thereby, the increase of the film thickness for this model case becomes about 0.1 nm, and the nitrogen concentration becomes about 12%. Using this model as a reference, it is concluded that the increase of film thickness is preferably suppressed to the value of 0.1–0.2 nm close to the foregoing value in the case the substrate processing apparatus 40 of FIG. 23 is used for the nitridation of the oxide film. In this state, it is evaluated that the maximum amount of the nitrogen atoms incorporated in to the film would be about 12% in the maximum.

Figure 35A:
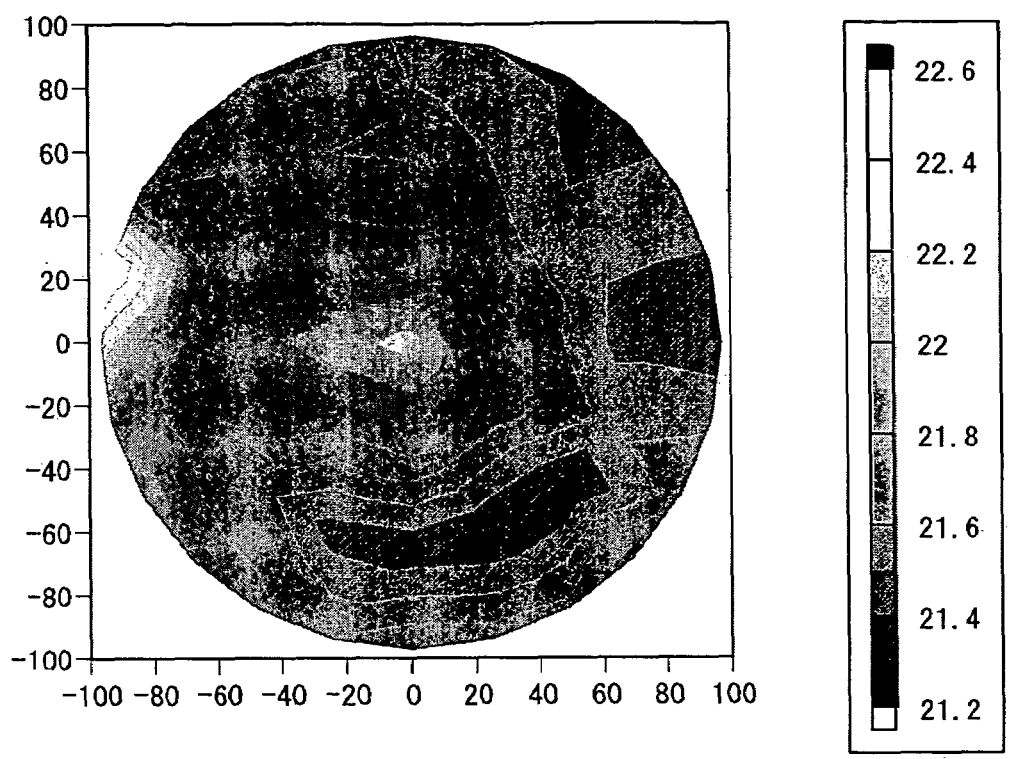
FIGS. 35A and 35B are diagrams showing the in-plane distribution of the nitride concentration realized by the nitridation processing of the oxide film conducting in the substrate processing apparatus of FIG. 23 while rotating the substrate.
Figure 35B:
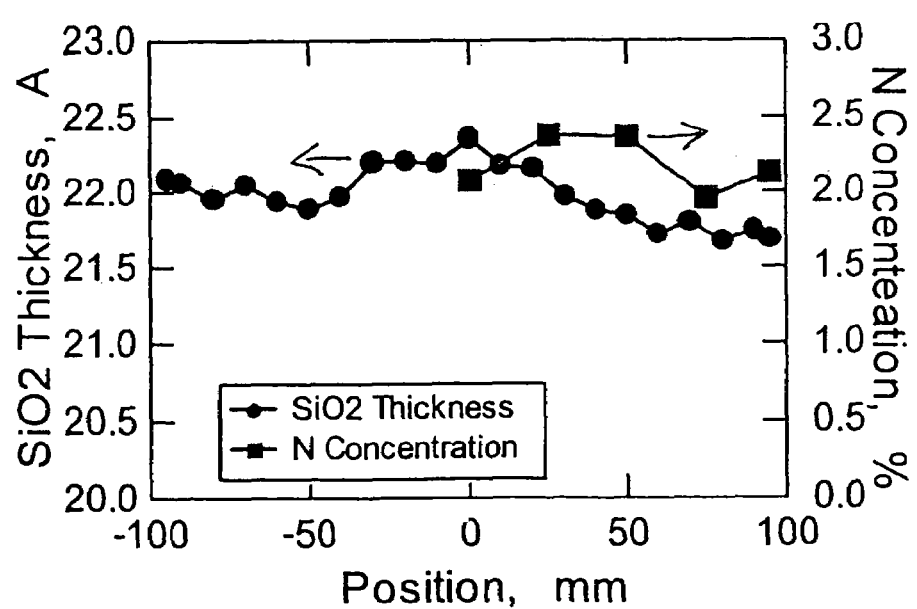

FIGS. 35A and 35B show the result of measurement of nitrogen concentration distribution and film thickness distribution of an oxynitride film for the case the oxynitride film is formed from an oxide film formed on the silicon substrate W in the substrate processing apparatus 40 of FIG. 23 to the thickness of 2 nm while rotating the silicon substrate W by the drive mechanism 42C. It should be noted that the experiment of FIGS. 35A and 35B is conducted at the substrate temperature of 450° C. under the pressure of 133 Pa while rotating the silicon substrate formed with the oxide film with the thickness of 2 nm, while supplying an Ar gas and a nitrogen gas with the respective flow rates of 2 SLM and 50 SCCM. In FIG. 35A, the bright part represents the part where there is caused nitrogen concentration. Further, FIG. 35B shows the thickness of the oxynitride film obtained by the ellipsometry and the nitrogen concentration obtained by the XPS analysis.

The result of FIGS. 35A and 35B shows that it is possible to realize a generally uniform nitrogen distribution over the entire surface of the substrate W even in the case of using the substrate processing apparatus 40, in which an asymmetric radical flow is caused, by rotating the substrate W and optimizing the flow rate of the Ar gas and the flow rate of the nitrogen gas.

[Fourth Embodiment]

In the case of fabricating a semiconductor device having a high-K dielectric gate insulation film of FIG. 1, it is necessary to form the high-K dielectric film 4 on the base oxide film 3 thus formed by the substrate processing apparatus 40.

Typically, a CVD process is used to form such a high-K dielectric film 4. In the case of forming a $ZrO_2$ film, for example, $ZrCl_4$ or other gaseous source containing Zr is used and the $ZrO_2$ film is deposited by oxidizing such a gaseous source.

It is preferable that the formation of such a high-K dielectric film 4 is conducted subsequent to the nitridation process of the radical oxide film shown in FIGS. 28A and 28B, without contacting the substrate to the external air. Thus, it is preferable that the substrate processing apparatus 40 of FIG. 23 is integrated into a cluster-type substrate processing system that includes a CVD chamber. Further, it is preferable that such a cluster-type substrate processing includes therein the organic removal process by the UV-$N_2$ processing explained before and the atomic-layer level planarization processing.

Figure 36:
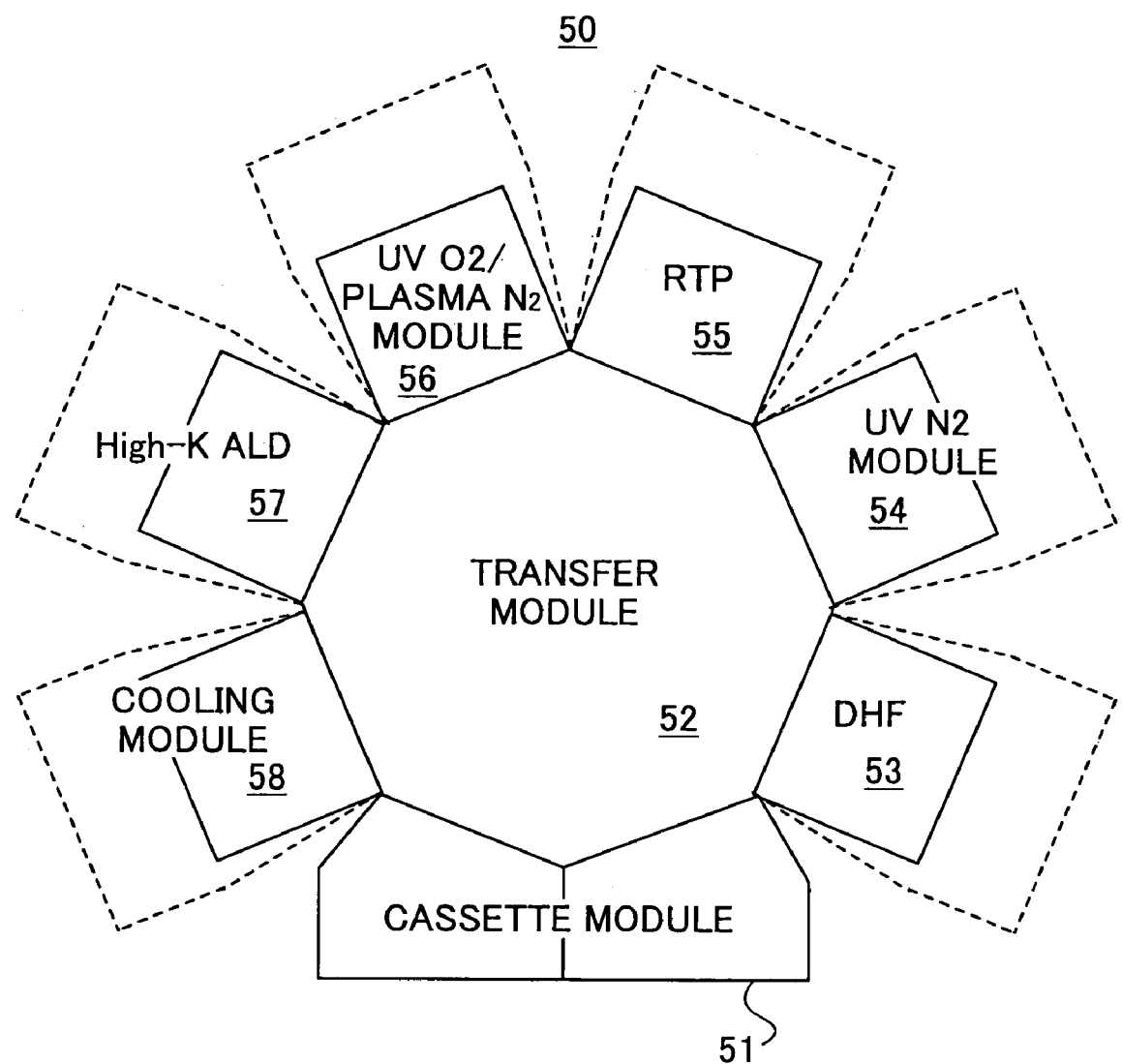
FIG. 36 is a diagram showing the construction of a single-wafer substrate processing apparatus according to a fourth embodiment of the present invention.

FIG. 36 shows the schematic construction of such a cluster-type substrate processing system 50 according to a fourth embodiment of the present invention.

Referring to FIG. 36, the cluster-type substrate processing system 50 includes cassette module 51 for loading and unloading a substrate W and a substrate transfer chamber 52 connected to the cassette module 51 via respective gate valve, wherein the substrate transfer chamber 52 is further connected to: a substrate cleaning chamber 53; a UV-$N_2$ processing chamber 54 for conducting the organic removal processing explained with reference to the previous embodiment; a rapid thermal processing (RTP) chamber 55 for conducting the planarization process; a UV-$O_2$/PLASMA-$N_2$ processing chamber 56 including therein the substrate processing apparatus 40 of FIG. 23 and conducting the formation of the base oxide film by the UV-$O_2$ radical processing and the nitridation of the base oxide film by the plasma radicals; a CVD chamber 57 for depositing a high-K dielectric film by an ALD process and the like; and a cooling chamber 58.

Thus, the substrate W introduced into the substrate transfer chamber 52 from the cassette module 51 is first forwarded to the substrate cleaning chamber 53 for removing a native oxide film or organic contamination therefrom. Next, the substrate W is transported to the UV-$N_2$ processing chamber 54 for removal of the organic substance. Further, the substrate W is transported to the RTP chamber 55 via the substrate transportation chamber 55 for atomic-layer level planarization.

The substrate W thus planarized is then transported to the UV-$O_2$/PLASMA-$N_2$ processing chamber 34 via the substrate transfer chamber 52 and the base oxide film 3 and the nitride film 3A of FIG. 1 are formed.

Thereafter, the substrate W is forwarded to the CVD chamber 57 through the substrate-transfer chamber 52 for formation of the high-K dielectric film 4. The substrate W is further forwarded t the thermal processing chamber 55 for crystallization and oxygen-defect compensation processing. After the processing in the thermal processing chamber 55, the substrate W is transported to the cassette module 51 through the substrate transfer chamber 52.

Meanwhile, each of the processing chambers 53–56 is provided, in the cluster-type substrate processing apparatus 50 of FIG. 36, with various cooperating devices, and because of this, each processing chambers requires an area represented in FIG. 36 by a broken line, in addition to the area of the chamber itself. Thereby, it should be noted that available space is substantially limited at the side of the processing chamber close to the substrate transfer chamber 52 because of the reduced separation to adjacent chambers.

Thus, when the substrate processing apparatus 40 of FIG. 23 is to be used in such a cluster-type substrate processing apparatus 50, the processing chamber 42 is connected to the substrate transfer chamber 52, wherein there arises a problem in that the turbo molecular pump 43B, extending laterally to the processing chamber 41 at the side thereof close to the substrate transfer chamber 52 as represented in FIG. 24B, may cause an interference with the adjacent processing chamber.

In order to conduct fast depressurization of the processing vessel 41, it is necessary that the turbo molecular pump 43B is provided close to the evacuation port 41A, while there exists no space available for this purpose because of the fact that various devices including the transportation robot are provided underneath the substrate transfer chamber 52. Further, there is no available space underneath the processing vessel 41 for the turbo molecular pump 43B because of the fact that various devices including the substrate rotating mechanism 42C are provided underneath the processing vessel 41.

Figure 37A:
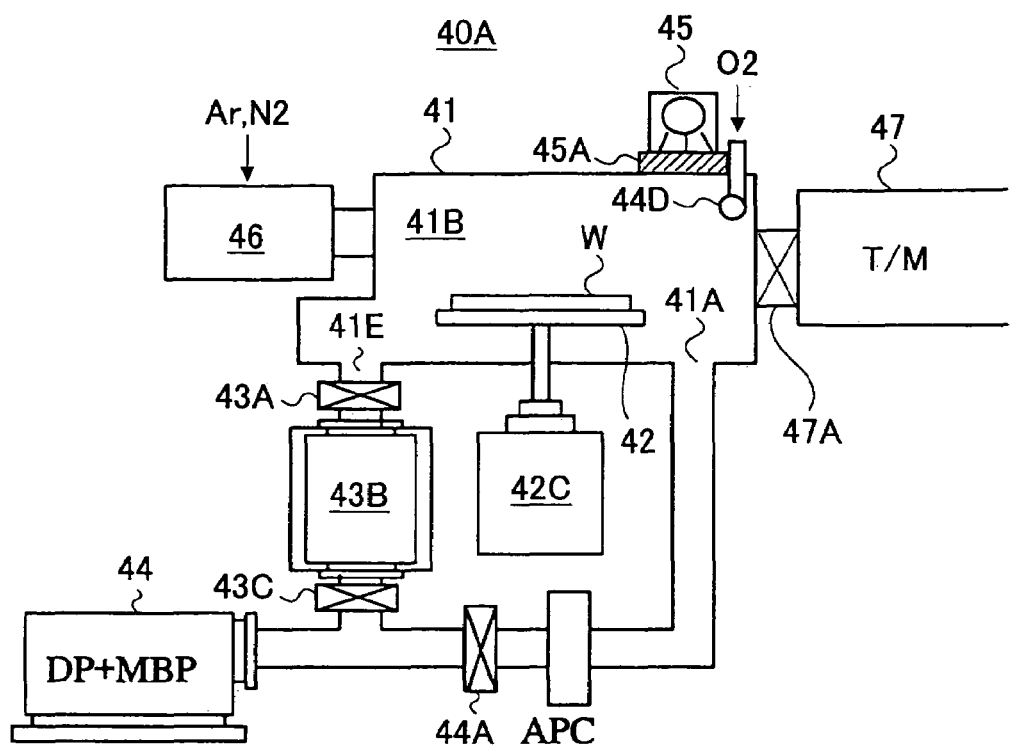
FIGS. 37A and 37B are diagrams showing the construction of a substrate processing apparatus used in the single-wafer substrate processing of FIG. 36 for conducting oxide film formation on a silicon substrate and nitridation thereof.
Figure 37B:
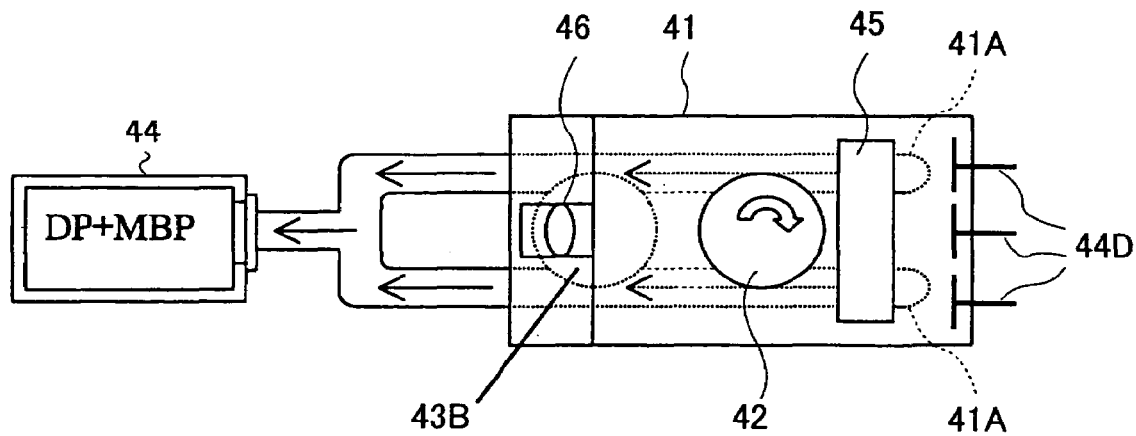

FIGS. 37A and 37B are diagrams showing the construction of a substrate processing apparatus 40A according to an embodiment of the present invention respectively in a side view and a plan view, wherein those parts of FIGS. 37A and 37B explained before are designated by the same reference numerals and the description thereof will be omitted.

Referring to FIGS. 37A and 37B, the substrate processing apparatus 40 disposes the turbo molecular pump 43B at the outer side of the substrate processing vessel 41, in other word the side opposite to the substrate transfer unit 47 where there is an available space when the substrate processing apparatus 40 is used to construct the cluster type substrate processing system such as the one shown in FIG. 36. With this, there is formed an evacuation port 41E in the processing vessel 21 at the outer side thereof, in other words at the side opposite to the substrate transfer chamber. Further, the process gas nozzle 41D and the ultraviolet optical source 45 are provided to the side close to the substrate transfer chamber 47 with respect to the substrate W such that the oxygen radicals are caused to flow along the surface of the substrate W to the evacuation port 41E.

It should be noted that the turbo molecular pump 43B is connected to the bottom part of the processing vessel 41 via the valve 43A in a vertical state, in other words the state in which the inlet and the outlet are aligned vertically. Further, it should be noted that the outlet port of the turbo molecular pump 43B is connected to the evacuation line extending from the evacuation port 41A of the processing vessel 41 to the pump 44 via the valve 44A at the part behind the valve 44A.

In such a substrate processing apparatus 40, in which the turbo molecular pump 43B is located at the side opposite to the side of the substrate transfer unit 47, there is caused no problem of the turbo molecular pump 43B causing interference with the adjacent processing chamber even when the substrate processing apparatus 40 is used to construct the cluster type substrate processing system as in the case of FIG. 36.

Figure 38A:
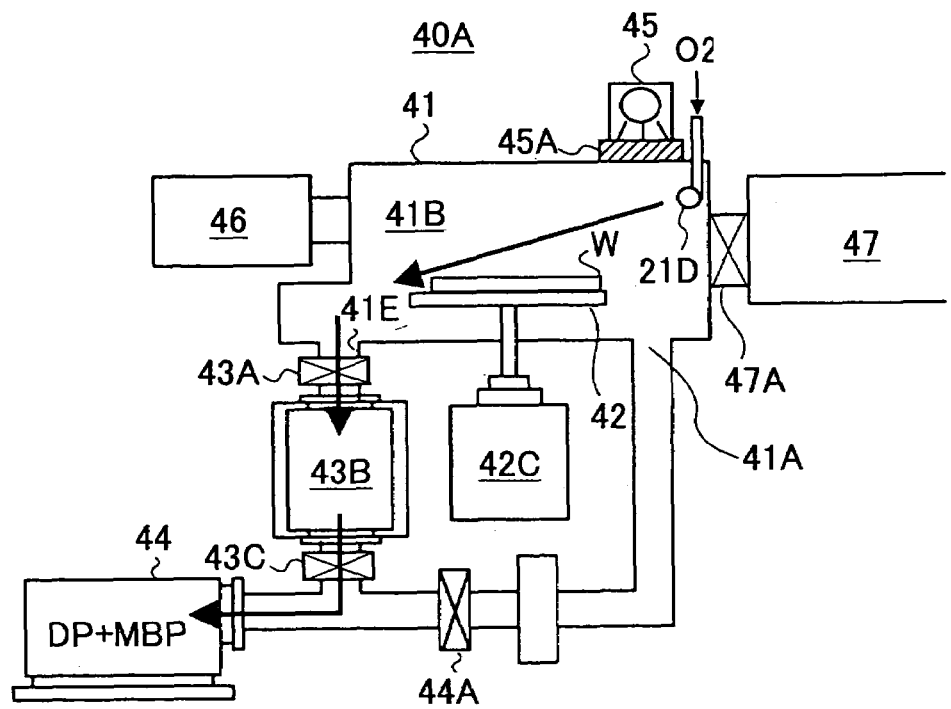
FIGS. 38A and 38B are diagrams showing the process of forming an oxide film by a $UV-O_2$ processing while using the substrate processing apparatus of FIG. 37.
Figure 38B:
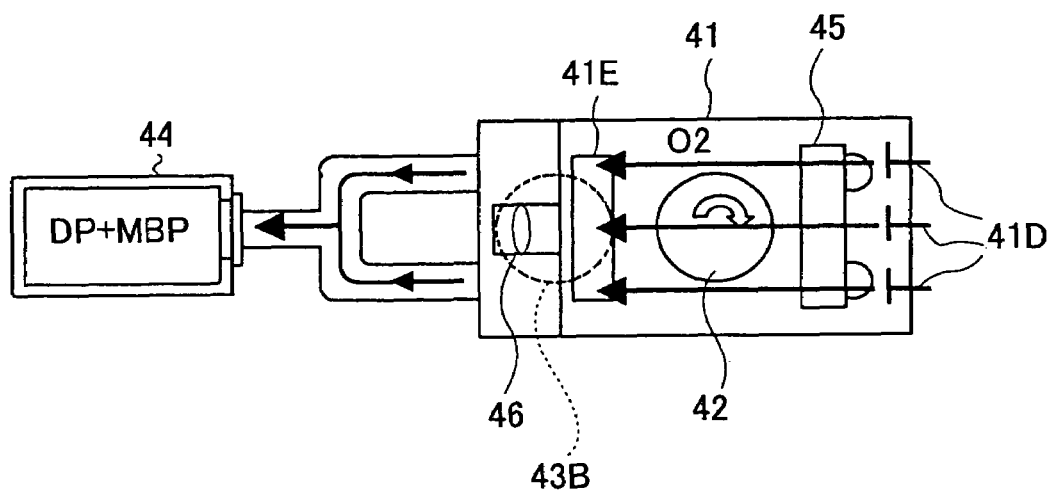

FIGS. 38A and 38B are diagrams showing the process of forming the base oxide film 3 of FIG. 1 conducted by using the substrate processing apparatus 40.

Referring to FIGS. 38A and 38B, it can be seen that the valves 43A and 43B are opened and the valve 44A is closed in the base oxide film formation process. As a result, the process space 43B is evacuated to the high-degree vacuum state of $1.33 \times 10^{-1} – 1.33 \times 10^{-4}$ Pa ($10^{-3} – 10^{-6}$ Torr) by the turbo molecular pump 43B at the foregoing evacuation port 41E, and the oxygen gas is introduced into the process space 41B from the process gas nozzle 41D in this state. Further, by driving the ultraviolet source 45 with a suitable energy while rotating the substrate W by the substrate rotating mechanism 42C, there is caused a flow of oxygen radicals to the evacuation port 42E along the substrate surface, and the substrate surface is oxidized uniformly. With this, it becomes possible to form an extremely thin silicon oxide film having a thickness of 1 nm or less, particularly the thickness of about 0.4 nm corresponding to the film thickness of 2–3 atomic layers, on the silicon substrate surface uniformly and stably and with excellent reproducibility. Of course, it is possible to form a silicon oxide film having a thickness exceeding 1 nm.

Figure 39A:
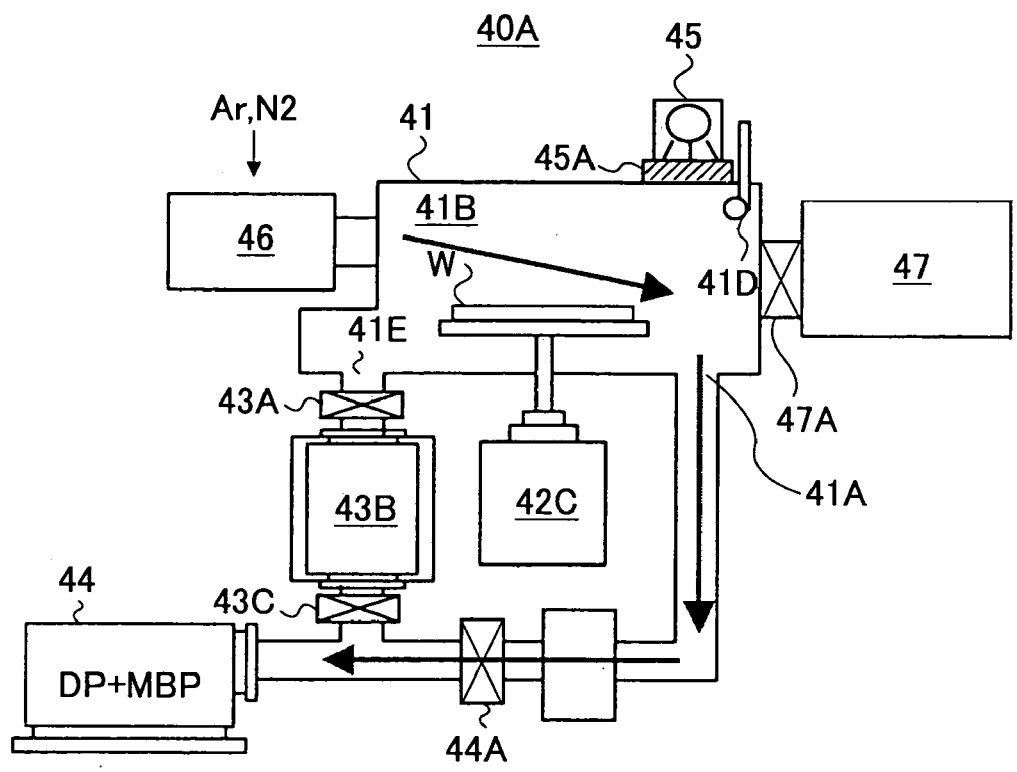
FIGS. 39A and 39B are diagrams showing the nitridation processing of an oxide film conducted by the substrate processing apparatus of FIG. 37.
Figure 39B:
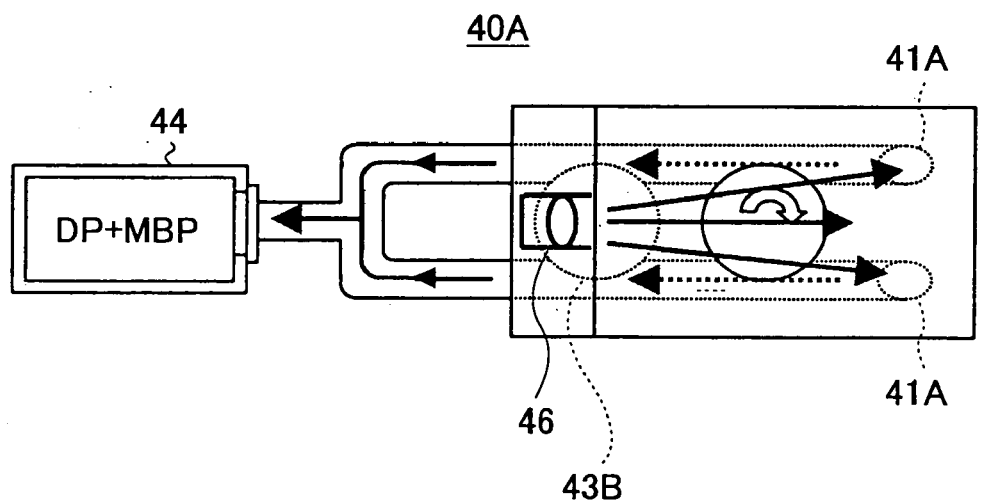

FIGS. 39A and 39B show the process of forming the oxynitride film 3A by using the substrate processing apparatus 40 of the present embodiment after the step of FIGS. 38A and 38B by nitriding the surface of the base oxide film 3 thus formed.

Referring to FIGS. 39A and 39B, the valve 43A and 43C are closed and the valve 44A is opened in the nitridation process. With this, the turbo molecular pump 43B is disconnected from the evacuation system and the process space 41B is evacuated directly by the pump 44 to the pressure of 1.33 Pa–13.3 kPa (0.01–100 Torr).

In this state, an Ar gas and a nitrogen gas are supplied to the remove plasma source 46, and nitrogen radicals are formed by applying a high-frequency excitation to the nitrogen gas. The nitrogen radicals thus formed are caused to flow along the surface of the substrate W to the evacuation port 41A, and there is caused a uniform nitridation on the surface of the rotating substrate W. As a result of such a nitridation process the surface of the base oxide film 3 of FIG. 1 is converted to the oxynitride film 3A.

By using the substrate processing apparatus 40A of the present embodiment for the processing chamber 56 in the cluster type substrate processing system 50 of FIG. 36, it becomes possible to form the high-K dielectric film 4 such as $ZrO_2$, $HfO_2$, $Ta_2O_5$, $ZrSiO_4$, $HfSiO_4$, $Al_2O_3$, and the like, on the base oxide film 3 that includes therein the oxynitride film 3A.

In the explanation above, the substrate processing apparatus 40A was explained with regard to the formation of very thin base oxide film. However, the present invention is not limited to such a specific embodiment and the present invention can be applied to the process of forming a high-quality oxide film, nitride film or oxynitride film on a silicon substrate or a silicon layer with a desired thickness.

[Fifth Embodiment]

Figure 40A:
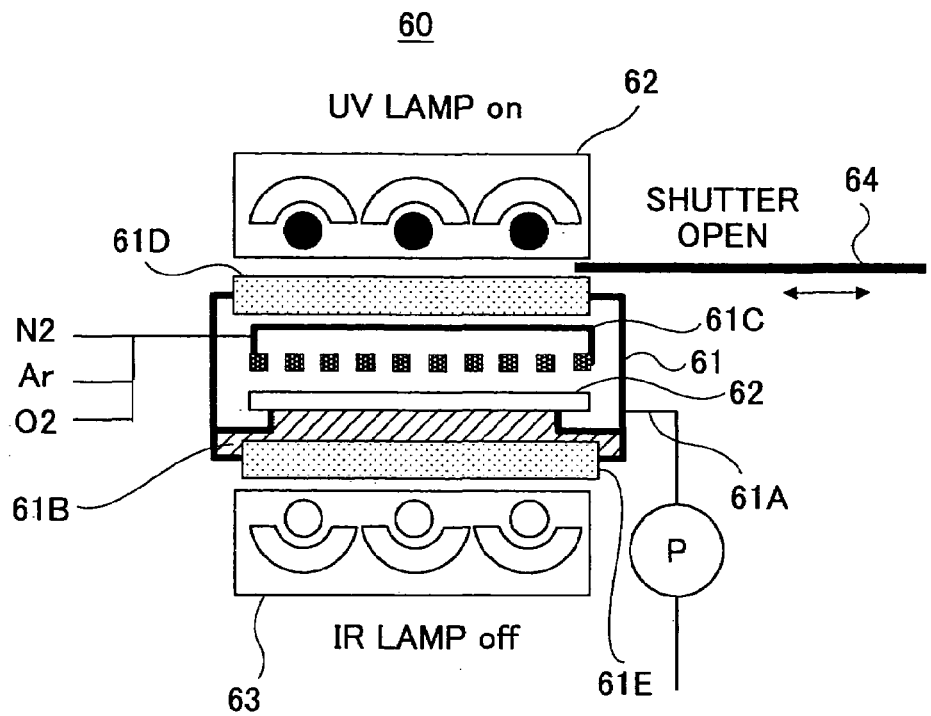
FIGS. 40A and 40B are diagrams showing the construction of a substrate processing apparatus according to a fifth embodiment of the present invention.
Figure 40B:
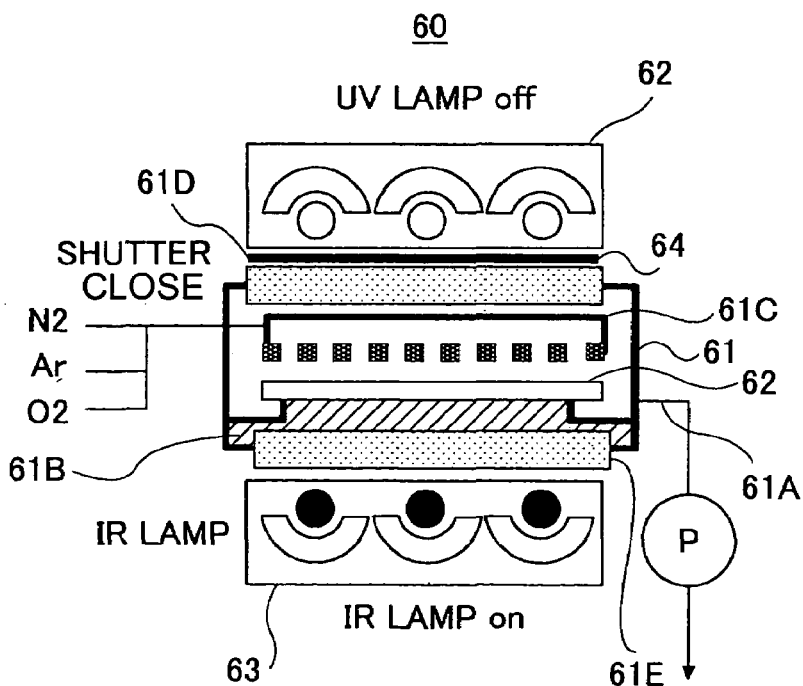

FIGS. 40A and 40B show the construction of a UV-$N_2$ substrate processing apparatus 60 according to a fifth embodiment of the present invention.

Referring to FIGS. 40A and 40B, the substrate processing apparatus 60 is a modification of the substrate processing apparatus 10 of FIG. 2 and includes a processing vessel 61 holding a substrate 62 to be processed and evacuated at an evacuation port 61A, wherein the substrate 62 is held on an optically transparent stage 61B of a quartz glass in the processing vessel 61. Further, there is provided a quartz glass showerhead 61C in the processing vessel 61 so as to face the substrate 62.

Above the processing vessel 61, there is provided a quartz glass window 61D so as to face the substrate 62 and an ultraviolet source 62, formed of an array of tubular excimer lamps, is provided outside the quartz glass window 61D. Further, there is formed another quartz glass window 61E at the bottom of the processing vessel 61 in correspondence to the bottom surface of the substrate 62, and an infrared heating lamp 63 is provided outside the quartz glass window 61E. Between the quartz glass window 61D and the ultraviolet source 62, there is provided a movable shutter mechanism 64 for protection of the ultraviolet source 62.

In the state of FIG. 40A, a nitrogen gas is introduced into the processing vessel 61 and the carbon contamination at the surface of the substrate 62 caused by organic substance is removed by opening the movable shutter mechanism 64 and driving the ultraviolet source 62.

In the sate of FIG. 40A, the infrared heating lamp 63 is not energized. As a result, the organic substance originating from hydrocarbons, and the like, contained in the atmosphere and adhered to the surface of the silicon substrate 62, is decomposed by the ultraviolet radiation form the ultraviolet source 62 and discharged to the outside of the processing vessel 61 together with the nitrogen gas.

Next, in the state of FIG. 40B, the ultraviolet source 62 is deenergized, and after closing the shutter mechanism 64, an Ar gas is introduced into the processing vessel 61. Further, the infrared heating lamp 63 is driven for heating the silicon substrate 62, and there are formed atomic layer steps on the substrate surface as a result of migration of the silicon atoms. In the state of FIG. 40B, it should be noted that the carbon atoms are already removed from the substrate surface in the step of FIG. 40A, and thus, there occurs no formation of defects such as SiC on the silicon substrate surface. Thereby, there occurs no problem of pinning of the silicon atoms by such defects, and the silicon atoms can move along the silicon substrate surface freely when the substrate is heated to a temperature of 970° C. or more.

After the step of FIG. 40B, the infrared heating lamp 63 is deenergized and the state of FIG. 40A is resumed. Thereby, the shutter mechanism 64 is opened and an oxygen gas is introduced into the processing vessel 61. Further, by driving the ultraviolet source 63, a very thin silicon oxide film is formed on the surface of the silicon substrate 62, which is planarized to the degree of atomic layer level in the step of FIG. 40B, with a thickness of 2–3 atomic layers.

In the substrate processing apparatus 60 of FIG. 40, too, both of the process temperature and process pressure have the value commonly used in the ordinary semiconductor fabrication process. Further, there is no need of conducting a hydrogen processing. Thus, the substrate processing apparatus 60 is suitable for constructing a cluster-type single-wafer processing apparatus together with other substrate processing apparatus.

Further, the present invention is not limited to those preferable embodiments described heretofore but various modifications and variations may be made without departing from the scope of the invention described in the claims.

INDUSTRIAL APPLICABILITY

According to the present invention, carbon on the substrate surface is removed preferably by a processing in an ultraviolet-excited nitrogen gas (UV-$N_2$ processing) in advance to the planarization processing conducted by a thermal annealing process. As a result, formation of impurities such as SiC, which causes pinning of silicon atoms at the time of the planarization processing conducted by way of flowing or sublimation of the silicon atoms, is suppressed, and the silicon atoms can move freely over the substrate surface even in the case the thermal annealing process is conducted at a relatively low temperature of about 940° C. Thereby, irregular projections and depressions existing on the substrate surface as in the case of the substrate having a polished surface, are successfully planarized, and as a result, an extremely flat surface showing atomic layer steps is achieved. Thereby, it should be noted that the planarization process of the present invention can be conducted in an ordinary rare gas ambient such as an Ar ambient and does not require ultrahigh vacuum environment or hydrogen furnace environment, contrary to the case of conventional planarization process. Thus, the substrate processing method of the present invention is suitable for constructing a cluster-type semiconductor production apparatus that conducts single-wafer substrate processing in combination with other substrate processes.

In the present invention, it should be noted that the organic substance remaining on the silicon substrate surface such as hydrocarbon or the like undergoes decomposition or depolymerization as a result of ultraviolet irradiation conducted in the nitrogen ambient. Thus, by heating the substrate in the vacuum environment, the organic substance is easily detached and removed from the substrate. With the wavelength of the ultraviolet radiation used in the present invention, there is caused no activation in the nitrogen gas, and thus, there occurs no formation of nitrogen film on the silicon substrate surface. In order that the foregoing UV-$N_2$ processing can successfully disconnect the carbon bond other than the C=N bond, it is preferable to use an ultraviolet radiation having a wavelength of 150 nm or more but not exceeding 270 nm, particularly the ultraviolet radiation having the wavelength of about 172 nm.

The invention claimed is:

1. A substrate processing method, comprising:
   removing carbon from a silicon substrate surface by irradiating ultraviolet radiation of a first wavelengths; and
   planarizing said silicon substrate surface by applying thereto a thermal annealing process,
   said step of removing carbon being conducted by causing an inert gas to flow to said silicon substrate and activating said silicon substrate surface with said ultraviolet radiation of said first wavelength,
   wherein said first wavelength is chosen such that said ultraviolet radiation of said first wavelength does not cause activation of said inert gas.

2. The substrate processing method as claimed in claim 1, wherein said first wavelength is chosen so as to cleave a single bond of carbon constituting an organic material on said silicon substrate surface.

3. The substrate processing method as claimed in claim 1, wherein said inert gas is a nitrogen gas.

4. The substrate processing method as claimed in claim 2, wherein said first wavelength is equal to or smaller than 270 nm but not shorter than 150 nm.

5. The substrate processing method as claimed in claim 2, wherein said first wavelength is 170 nm.

6. The substrate processing method as claimed in claim 1, wherein said step of removing carbon is conducted at a temperature of 550° C. or less.

7. The substrate processing method as claimed in claim 1, wherein said step of removing carbon is conducted at a temperature of about 450° C.

8. The substrate processing method as claimed in claim 1, wherein said step of removing carbon is conducted under a pressure of $1.33 \times 10^4$–$1.33 \times 10^{-3}$ Pa.

9. The substrate processing method as claimed in claim 1, wherein said planarizing step is conducted at a temperature of 950° C. or less.

10. The substrate processing method as claimed in claim 1, wherein said planarizing step is conducted in a rare gas ambient.

11. The substrate processing method as claimed in claim 9, wherein said planarizing step includes a lamp heating step.

12. The substrate processing method as claimed in claim 1, wherein said planarizing step is conducted after said carbon removal step continuously in an identical processing vessel.

13. The substrate processing apparatus as claimed in claim 1, wherein said carbon removal step is conducted in a first processing vessel, and said planarizing step is conducted in a second processing vessel coupled to said first processing vessel via a vacuum transportation path.

14. The substrate processing method as claimed in claim 1, further comprising, after said planarizing step, causing an oxidizing gas to flow to said silicon substrate surface; and activating said oxidizing gas by a second ultraviolet radiation.

15. The substrate processing method as claimed in claim 14, wherein said second ultraviolet radiation has a second wavelength identical to said first wavelength.

16. The substrate processing method as claimed in claim 14, wherein said oxidizing gas is an oxygen gas.

17. The substrate processing method as claimed in claim 14, wherein said stop of oxidizing said substrate surface is conducted so as to form an oxide film having a thickness of 1 nm or less.

18. The substrate processing method as claimed in claim 17, further comprising a step of nitriding said oxide ram by nitrogen radicals.

* * * * *